US012317615B2

(12) United States Patent
Wang et al.

(10) Patent No.: US 12,317,615 B2
(45) Date of Patent: May 27, 2025

(54) INTEGRATED CIRCUIT HAVING MIRRORED PIXEL CONFIGURATION

(71) Applicant: Quantum-Si Incorporated, Guilford, CT (US)

(72) Inventors: Xin Wang, San Jose, CA (US); Eric A. G. Webster, Mountain View, CA (US); Todd Rearick, Cheshire, CT (US)

(73) Assignee: Quantum-Si Incorporated, Branford, CT (US)

( * ) Notice: Subject to any disclaimer, the term of this patent is extended or adjusted under 35 U.S.C. 154(b) by 414 days.

(21) Appl. No.: 17/716,132

(22) Filed: Apr. 8, 2022

(65) Prior Publication Data

US 2022/0328542 A1    Oct. 13, 2022

Related U.S. Application Data

(60) Provisional application No. 63/172,490, filed on Apr. 8, 2021.

(51) Int. Cl.
*H10F 39/00* (2025.01)
*G01N 21/64* (2006.01)
*H04N 25/771* (2023.01)
*H04N 25/79* (2023.01)

(52) U.S. Cl.
CPC ..... *H10F 39/8023* (2025.01); *G01N 21/6428* (2013.01); *H04N 25/771* (2023.01); *H04N 25/79* (2023.01); *H10F 39/8057* (2025.01); *G01N 2021/6439* (2013.01)

(58) Field of Classification Search
CPC ........ H01L 27/14605; H01L 27/14623; H04N 25/771; H04N 25/79; G01N 21/6428; G01N 2021/6439; G09G 3/2002; H10F 39/8023; H10F 39/8057

USPC .......................................................... 257/419
See application file for complete search history.

(56) References Cited

U.S. PATENT DOCUMENTS

| 5,961,924 | A  | 10/1999 | Reichert et al. |
| 6,787,308 | B2 | 9/2004  | Balasubramanian et al. |
| 6,917,726 | B2 | 7/2005  | Levene et al. |
| 7,175,811 | B2 | 2/2007  | Bach et al. |

(Continued)

FOREIGN PATENT DOCUMENTS

WO    WO 2011/153962 A1    12/2011

OTHER PUBLICATIONS

PCT/US2022/023951, Jul. 5, 2022, Invitation to Pay Additional Fees.

(Continued)

*Primary Examiner* — Tu-Tu V Ho
(74) *Attorney, Agent, or Firm* — Wolf, Greenfield & Sacks, P.C.

(57) ABSTRACT

Aspects of the technology described herein relate to improved semiconductor-based image sensor designs. In some aspects, an integrated circuit described herein may include a first pixel and a second pixel, wherein the first pixel is proximate the second pixel in a mirrored configuration. In some aspects, an integrated circuit described herein may include a first pixel and a second pixel that is proximate to the first pixel along a row direction, and a conductive line extending along a column direction that intersects with the row direction, wherein the conductive line is in electrical communication with a first component of the first pixel and a second component of the second pixel.

17 Claims, 48 Drawing Sheets

(56) References Cited

U.S. PATENT DOCUMENTS

| | | |
|---|---|---|
| 7,426,322 B2 | 9/2008 | Hyde |
| 7,738,086 B2 | 6/2010 | Shepard et al. |
| 7,820,983 B2 | 10/2010 | Lundquist et al. |
| 7,834,329 B2 | 11/2010 | Lundquist et al. |
| 7,838,847 B2 | 11/2010 | Lundquist et al. |
| 8,053,742 B2 | 11/2011 | Lundquist et al. |
| 8,207,509 B2 | 6/2012 | Lundquist et al. |
| 8,274,040 B2 | 9/2012 | Zhong et al. |
| 8,278,728 B2 | 10/2012 | Murshid |
| 8,465,699 B2 | 6/2013 | Fehr et al. |
| 8,471,219 B2 | 6/2013 | Lundquist et al. |
| 8,471,230 B2 | 6/2013 | Zhong et al. |
| 8,502,169 B2 | 8/2013 | Rigneault et al. |
| 8,618,507 B1 | 12/2013 | Lundquist et al. |
| 9,029,802 B2 | 5/2015 | Lundquist et al. |
| 9,094,612 B2 | 7/2015 | Hynecek |
| 9,157,864 B2 | 10/2015 | Fehr et al. |
| 9,222,123 B2 | 12/2015 | Zhong et al. |
| 9,222,133 B2 | 12/2015 | Lundquist et al. |
| 9,223,084 B2 | 12/2015 | Grot et al. |
| 9,372,308 B1 | 6/2016 | Saxena et al. |
| 9,587,276 B2 | 3/2017 | Lundquist et al. |
| 9,606,060 B2 | 3/2017 | Chen et al. |
| 9,658,161 B2 | 5/2017 | Saxena et al. |
| 9,666,748 B2 | 5/2017 | Leobandung |
| 9,719,138 B2 | 8/2017 | Zhong et al. |
| 9,765,395 B2 | 9/2017 | Goldsmith |
| 9,946,017 B2 | 4/2018 | Saxena et al. |
| 10,018,764 B2 | 7/2018 | Grot et al. |
| 10,090,429 B2 | 10/2018 | Leobandung |
| 10,138,515 B2 | 11/2018 | Fehr et al. |
| 10,280,457 B2 | 5/2019 | Zhong et al. |
| 10,310,178 B2 | 6/2019 | Saxena et al. |
| 10,487,356 B2 | 11/2019 | Lundquist et al. |
| 10,578,788 B2 | 3/2020 | Grot et al. |
| 10,655,172 B2 | 5/2020 | Rank et al. |
| 10,724,090 B2 | 7/2020 | McCaffrey et al. |
| 2002/0182716 A1 | 12/2002 | Weisbuch et al. |
| 2003/0174992 A1 | 9/2003 | Levene et al. |
| 2008/0225148 A1 | 9/2008 | Parks |
| 2008/0258057 A1 | 10/2008 | Williamson et al. |
| 2010/0065726 A1 | 3/2010 | Zhong et al. |
| 2010/0321552 A1 | 12/2010 | Matsuda |
| 2012/0200749 A1 | 8/2012 | Boettiger et al. |
| 2012/0273854 A1 | 11/2012 | Velichko et al. |
| 2013/0116153 A1 | 5/2013 | Bowen et al. |
| 2015/0009443 A1* | 1/2015 | Song .................. H01L 27/1248 349/43 |
| 2016/0133668 A1 | 5/2016 | Rothberg et al. |
| 2016/0219238 A1 | 7/2016 | Tsuboi |
| 2016/0344965 A1 | 11/2016 | Grauer et al. |
| 2017/0146479 A1 | 5/2017 | Levine et al. |
| 2018/0033809 A1 | 2/2018 | Tayanaka et al. |
| 2018/0180546 A1 | 6/2018 | Rothberg et al. |
| 2018/0197910 A1 | 7/2018 | Lee et al. |
| 2019/0051681 A1 | 2/2019 | Kallioinen et al. |
| 2019/0292590 A1 | 9/2019 | Zhong et al. |
| 2019/0391010 A1 | 12/2019 | Thurston et al. |
| 2020/0408690 A1 | 12/2020 | Yang et al. |
| 2021/0215605 A1 | 7/2021 | Schmid et al. |
| 2021/0217800 A1 | 7/2021 | Webster et al. |
| 2021/0318242 A1 | 10/2021 | Webster et al. |
| 2022/0128402 A1 | 4/2022 | Webster et al. |
| 2022/0186305 A1 | 6/2022 | Webster |
| 2022/0328541 A1 | 10/2022 | Wang et al. |
| 2022/0328542 A1 | 10/2022 | Wang et al. |
| 2023/0420441 A1* | 12/2023 | Kikuchi .................. H01L 25/18 |

OTHER PUBLICATIONS

International Search Report and Written Opinion for International Application No. PCT/US2022/023951 mailed Oct. 4, 2022.

Hale, Fibre Optic Sensors using Adiabatically Tapered Single Mode Fibres. Dissertation submitted to the University of Cambridge. Feb. 1994. 209 pages.

Mogensen et al., A Microfluidic Device with an Integrated Waveguide Beam Splitter for Velocity Measurements of Flowing Particles by Fourier Transformation. Analytical Chemistry. Sep. 15, 2003;75(18):4931-4936.

Taitt et al., Evanescent wave fluorescence biosensors. Biosens Bioelectron. Jun. 2005;20(12):2470-87. Epub Dec. 8, 2004.

Invitation to Pay Additional Fees for International Application No. PCT/US2022/023951 mailed Jul. 5, 2022.

International Preliminary Report on Patentability for International Application No. PCT/US2022/023951 mailed Oct. 19, 2023.

* cited by examiner

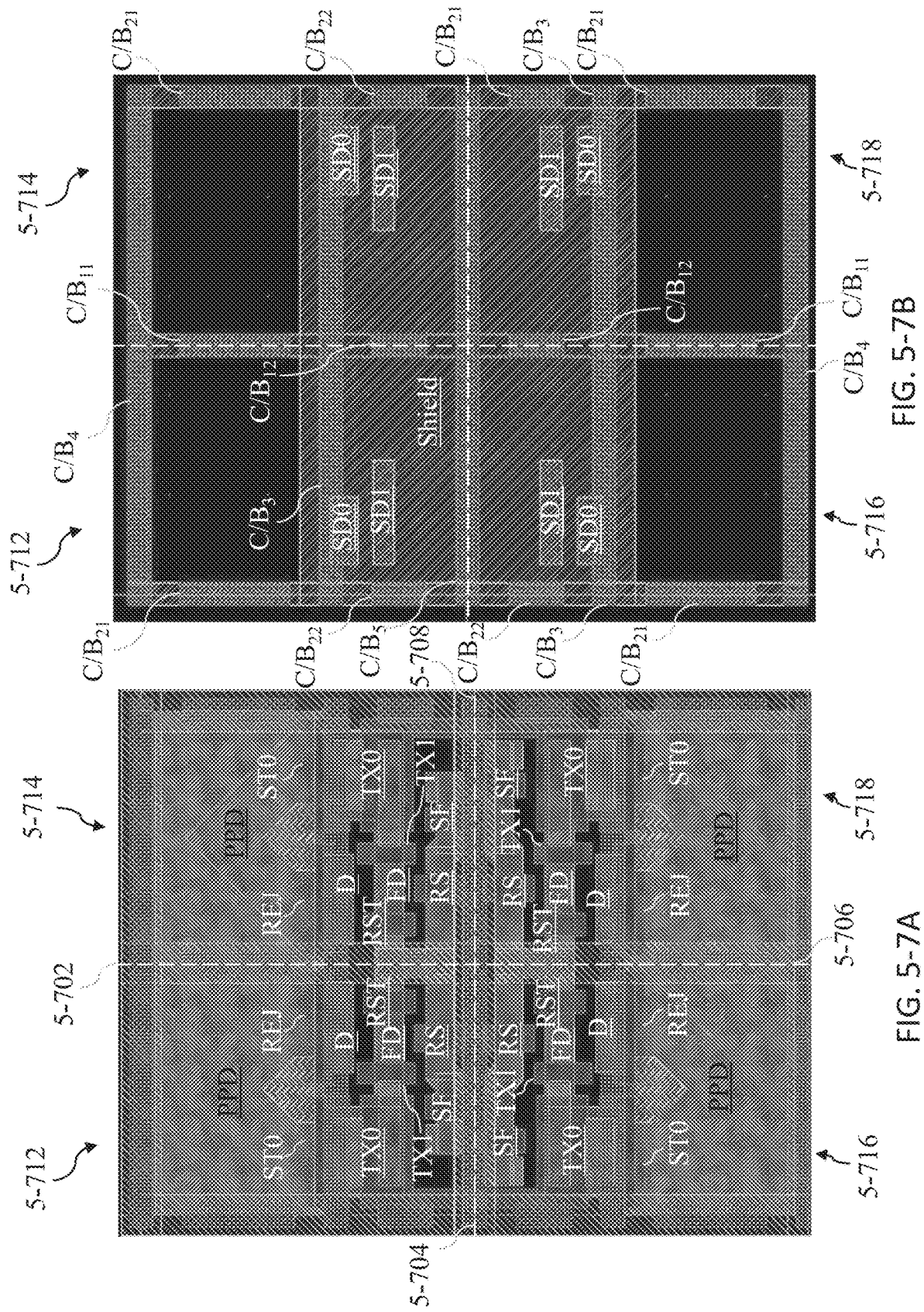

INTEGRATED CIRCUIT HAVING MIRRORED PIXEL CONFIGURATION

RELATED APPLICATIONS

This application claims priority under 35 U.S.C. § 119(e) to U.S. Provisional Application Ser. No. 63/172,490, filed Apr. 8, 2021, and entitled, "INTEGRATED SENSOR FOR LIFETIME CHARACTERIZATION," which is herein incorporated by reference in its entirety.

FIELD OF THE DISCLOSURE

The present disclosure relates to integrated devices and related instruments that can perform massively-parallel analyses of samples by providing short optical pulses to tens of thousands of sample wells or more simultaneously and receiving fluorescent signals from the sample wells for sample analyses. The instruments may be useful for point-of-care genetic sequencing and for personalized medicine.

BACKGROUND

Photodetectors are used to detect light in a variety of applications. Integrated photodetectors have been developed that produce an electrical signal indicative of the intensity of incident light. Integrated photodetectors for imaging applications include an array of pixels to detect the intensity of light received from across a scene. Examples of integrated photodetectors include charge coupled devices (CCDs) and Complementary Metal Oxide Semiconductor (CMOS) image sensors.

Instruments that are capable of massively-parallel analyses of biological or chemical samples are typically limited to laboratory settings because of several factors that can include their large size, lack of portability, requirement of a skilled technician to operate the instrument, power need, need for a controlled operating environment, and cost. When a sample is to be analyzed using such equipment, a common paradigm is to extract a sample at a point of care or in the field, send the sample to the lab and wait for results of the analysis. The wait time for results can range from hours to days.

SUMMARY OF THE DISCLOSURE

Some aspects of the present disclosure relate to an integrated circuit, comprising a first pixel and a second pixel, wherein the first pixel is proximate to the second pixel in a mirrored configuration.

Some aspects of the present disclosure relate to an integrated circuit, comprising a first pixel comprising a first reaction chamber for receiving a first sample, and a first photodetector for receiving a first emission from the first sample after excitation with a laser light source; and a second pixel comprising a second reaction chamber for receiving a second sample, and a second photodetector for receiving a second emission from the second sample after excitation with the laser light source, wherein the first pixel is proximate to the second pixel in a mirrored configuration.

Some aspects of the present disclosure relate to a method of manufacturing an integrated circuit, the method comprising forming a first pixel, and forming a second pixel, wherein the first pixel is proximate to the second pixel in a mirrored configuration.

Some aspects of the present disclosure relate to an integrated circuit, comprising a first pixel comprising a first drain gate, and a second pixel comprising a second drain gate, wherein the first pixel is proximate to the second pixel such that the first drain gate is proximate the second drain gate.

Some aspects of the present disclosure relate to an integrated circuit, comprising a first pixel comprising a first charge storage region, a second pixel comprising a second charge storage region, wherein the first pixel is proximate to the second pixel such that the first charge storage region is proximate the second charge storage region, and a conductive structure in electrical communication with the first and second charge storage regions.

Some aspects of the present disclosure relate to an integrated circuit, comprising a first pixel comprising a first transfer gate, a second pixel comprising a second transfer gate, wherein the first pixel is proximate to the second pixel such that the first transfer gate is proximate the second transfer gate, and a conductive structure in electrical communication with the first and second transfer gates.

Some aspects of the present disclosure relate to a method, comprising analyzing a sample using an integrated circuit comprising a first pixel, and a second pixel, wherein the first pixel is proximate to the second pixel in a mirrored configuration.

Some aspects of the present disclosure relate to a method, comprising applying a first sample to a first reaction chamber of a first pixel, the first pixel further comprising a first photodetector for receiving a first emission from the first sample after excitation with a laser light source, and applying a second sample to a second reaction chamber of a second pixel, the second pixel further comprising a second photodetector for receiving a second emission from the second sample after excitation with the laser light source, wherein the first pixel is proximate to the second pixel in a mirrored configuration.

Some aspects of the present disclosure relate to an integrated circuit, comprising a first pixel, a second pixel, wherein the first pixel is proximate to the second pixel along a row direction, and a conductive line extending along a column direction that intersects with the row direction, wherein the conductive line is in electrical communication with a first component of the first pixel and a second component of the second pixel.

Some aspects of the present disclosure relate to a method of manufacturing an integrated circuit, the method comprising forming a first pixel and a second pixel, wherein the first pixel is proximate to the second pixel along a row direction, and forming a conductive line extending along a column direction that intersects with the row direction, wherein the conductive line is in electrical communication with a first component of the first pixel and a second component of the second pixel.

Some aspects of the present disclosure relate to an integrated circuit, comprising a first pixel and a second pixel in a first row along a row direction, a third pixel and a fourth pixel in a second row along the row direction, and a conductive line extending along a column direction that intersects with the row direction, wherein the conductive line is in electrical communication with a first component of the first pixel and a second component of the second pixel and a third component of the third pixel and a fourth component of the fourth pixel.

Some aspects of the present disclosure relate to an integrated circuit, comprising a first pixel and a second pixel in a first row along a row direction, a third pixel and a fourth pixel in a second row along the row direction, and a conductive line extending along a column direction that intersects with the row direction, wherein the conductive line is in electrical communication with a first component of the first pixel and a second component of the second pixel and a third component of the third pixel and a fourth component of the fourth pixel.

Some aspects of the present disclosure relate to a method of manufacturing an integrated circuit, the method comprising forming a first pixel, a second pixel, a third pixel, and a fourth pixel, wherein the first pixel and the second pixel are formed in a first row along a row direction and the third pixel and the fourth pixel are formed in a second row along the row direction, and forming a conductive line extending along a column direction that intersects with the row direction, such that the conductive line is in electrical communication with a first component of the first pixel and a second component of the second pixel, and a third component of the third pixel and a fourth component of the fourth pixel.

Some aspects of the present disclosure relate to a method, comprising applying an electrical signal to a conductive line, the conductive line extending along a column direction that intersects with a row direction, and applying, via the conductive line, at least a portion of the electrical signal to a first component of a first pixel, and a second component of a second pixel, wherein the first pixel is proximate to the second pixel along the row direction.

Some aspects of the present disclosure relate to a method, comprising applying an electrical signal to a conductive line, and applying, via the conductive line, at least a portion of the electrical signal to a first component of a first pixel and a second component of a second pixel, wherein the first pixel and the second pixel are in a first row along a row direction and a third component of a third pixel and a fourth component of a fourth pixel, wherein the third pixel and the fourth pixel are in a second row along the row direction.

Some aspects of the present disclosure relate to an integrated circuit, comprising a plurality of pixels proximate to one another in a first direction and a plurality of wafer bond pads, at least some of which are in electrical communication with the plurality of pixels, wherein a center-to-center spacing, in the first direction, between adjacent ones of the plurality of wafer bond pads is different from a center-to-center spacing, in the first direction, between adjacent ones of the plurality of pixels.

Some aspects of the present disclosure relate to a method, comprising electrically communicating at least a portion of a signal, via at least some of a plurality of wafer bond pads of an integrated circuit, with a plurality of pixels of the integrated circuit that are proximate to one another in a first direction, wherein a center-to-center spacing, in the first direction, between adjacent ones of the plurality of wafer bond pads is different from a center-to-center spacing, in the first direction, between adjacent ones of the plurality of pixels.

Some aspects of the present disclosure relate to a method of manufacturing an integrated circuit, the method comprising forming a plurality of pixels proximate to one another in a first direction and forming a plurality of wafer bond pads, at least some of which are formed in electrical communication with the plurality of pixels, such that a center-to-center spacing, in the first direction, between adjacent ones of the plurality of wafer bond pads is different from a center-to-center spacing, in the first direction, between adjacent ones of the plurality of pixels.

The foregoing summary is not intended to be limiting. In addition, various embodiments may include any aspects of the disclosure either alone or in combination.

BRIEF DESCRIPTION OF DRAWINGS

FIG. 1-2 is a schematic of a pixel of an integrated device, according to some embodiments.

FIG. 1-3 is a circuit diagram of an example pixel that may be included in the integrated device of FIG. 1-1, according to some embodiments.

FIG. 1-4 is a diagram illustrating charge transfer in the pixel of FIG. 1-3, according to some embodiments.

FIG. 1-5A is a plan view of an example pixel having multiple charge storage regions that may be included in the integrated device of FIG. 1-1, according to some embodiments.

FIG. 1-5B is a circuit diagram of the pixel of FIG. 1-5A, according to some embodiments.

FIG. 1-6 is a diagram illustrating charge transfer in the pixel of FIGS. 1-5A and 1-5B, according to some embodiments.

FIG. 2-1 is a top view of an example pixel comprising a potential gradient-inducing mask, according to some embodiments.

FIG. 2-2 is a top view of a portion of an example array of pixels having opposite orientations in alternating rows, according to some embodiments.

FIG. 3-1 is a side view of an example pixel comprising a collection region having one or more drain layers, according to some embodiments.

FIG. 4-1 is a top view of a portion of an example row of pixels in a mirrored configuration, according to some embodiments.

FIG. 4-2 is a CAD drawing of a portion of an example row of pixels in a mirrored configuration, each comprising a potential-gradient inducing mask, according to some embodiments.

FIG. 4-3 is a plan view of a portion of an example row of pixels of FIGS. 1-5A and 1-5B in a mirrored configuration, according to some embodiments.

FIG. 4-4 is a circuit diagram of a first pair of pixels of FIG. 4-3, according to some embodiments.

FIG. 4-5 is a circuit diagram of a second pair of pixels of FIG. 4-3, according to some embodiments.

FIG. 4-6 is a top view of a portion of an example row of pixels with multiple storage regions in a mirrored configuration, according to some embodiments.

FIG. 4-7 is a top schematic view of a portion of an example row of pixels in a mirrored configuration, according to some embodiments.

FIG. 5-1 is a cross-sectional schematic of an alternative example integrated device illustrating a row of pixels, according to some embodiments.

FIG. 5-2 is a cross-sectional view of an example pixel of the integrated device of FIG. 5-1, according to some embodiments.

FIG. 5-3 is a cross-sectional view of an alternative example pixel that may be included in the integrated device of FIG. 5-1, according to some embodiments.

FIG. 5-4 is a layout sketch of an example pixel including discontinuous charged and/or biased (C/B) regions that may be included in the integrated device of FIG. 5-1, according to some embodiments.

FIG. 5-5 is a layout sketch of a plurality of pixels of FIG. 5-4 in a mirrored configuration, according to some embodiments.

FIG. 5-6 is a layout sketch of an example pixel having multiple charge storage regions that may be included in the integrated device of FIG. 5-1, according to some embodiments.

FIG. 5-7A is a layout sketch of a plurality of pixels having multiple charge storage regions in a mirrored configuration that may be included in the integrated device of FIG. 5-1, according to some embodiments.

FIG. 5-7B is a layout sketch illustrating the positioning of a metal shield over portions of the plurality of pixels of FIG. 5-7A, according to some embodiments.

FIG. 5-8 is a top view of a portion of an example integrated device having a metal shield positioned over portions of pixels of the integrated device, according to some embodiments.

FIG. 6-1 is a top view of an example pixel array (shown in phantom) overlaid with conductive lines, according to some embodiments.

FIG. 6-2 is a top view of an example pixel array (shown in phantom) overlaid with conductive lines in electrical communication with proximate pixels along the row direction, according to some embodiments.

FIG. 6-3 is a three-dimensional (3D) diagram showing the conductive lines of FIG. 6-2 and other conductive lines overlying or underlying the example pixel array, according to some embodiments.

FIG. 6-4 is a top view of a first layer of the conductive lines shown in FIG. 6-3, according to some embodiments.

FIG. 6-5 is a top view of a second layer of the conductive lines shown in FIG. 6-3, according to some embodiments.

FIG. 6-6 is a plan view of the conductive lines of FIG. 6-5, according to some embodiments.

FIG. 6-7 is a top schematic view of the conductive lines of FIG. 6-2 positioned above or below a portion of an example pixel array, according to some embodiments.

FIG. 6-8 is a top schematic view of a portion of an example array of pixels in a mirrored configuration and in electrical communication with conductive lines, according to some embodiments.

FIG. 7-1 is a side view of a cross-section of an example integrated device having conductive lines in electrical communication with proximate pixels along the row direction, according to some embodiments.

FIG. 7-2 is a top view of a first routing layer of the integrated device of FIG. 7-1, according to some embodiments.

FIG. 7-3 is a 3D view of the first routing layer and the bonding layers of the integrated device of FIG. 7-1, according to some embodiments.

FIG. 7-4 is a top view of a second routing layer of the integrated device of FIG. 7-1, according to some embodiments.

FIG. 7-5 is a 3D view of the integrated device of FIG. 7-1 further illustrating the second routing layer, according to some embodiments.

FIG. 7-6 is a top view of routing and pixel layers of an alternative example integrated device having conductive lines in electrical communication with proximate pixels along the row direction, according to some embodiments.

FIG. 7-7 is a top view of the photodetection wafer of the integrated device of FIG. 7-6, according to some embodiments.

FIG. 7-8 is a top view of the logic wafer of the integrated device of FIG. 7-6, according to some embodiments.

FIG. 7-9 is a top view of routing and bonding layers of a further alternative integrated device having conductive lines in electrical communication with proximate pixels along the row direction, according to some embodiments.

FIG. 7-10 is a top view of the logic wafer of the integrated device of FIG. 7-9, according to some embodiments.

FIG. 7-11 is a partial bottom view of the logic wafer shown in FIG. 7-10, according to some embodiments.

FIG. 7-12 is a magnified view of a portion of the logic wafer shown in FIG. 7-11, according to some embodiments.

FIG. 8-1 is a block diagram of an integrated device and an instrument, according to some embodiments.

FIG. 8-2 is a flow diagram illustrating a method of sequencing a labeled polypeptide by Edman degradation according to some embodiments.

FIG. 8-3 includes a flow diagram illustrating a method of sequencing in which discrete binding events give rise to signal pulses of a signal output, and a graph illustrating the signal output according to some embodiments.

Figure 1:
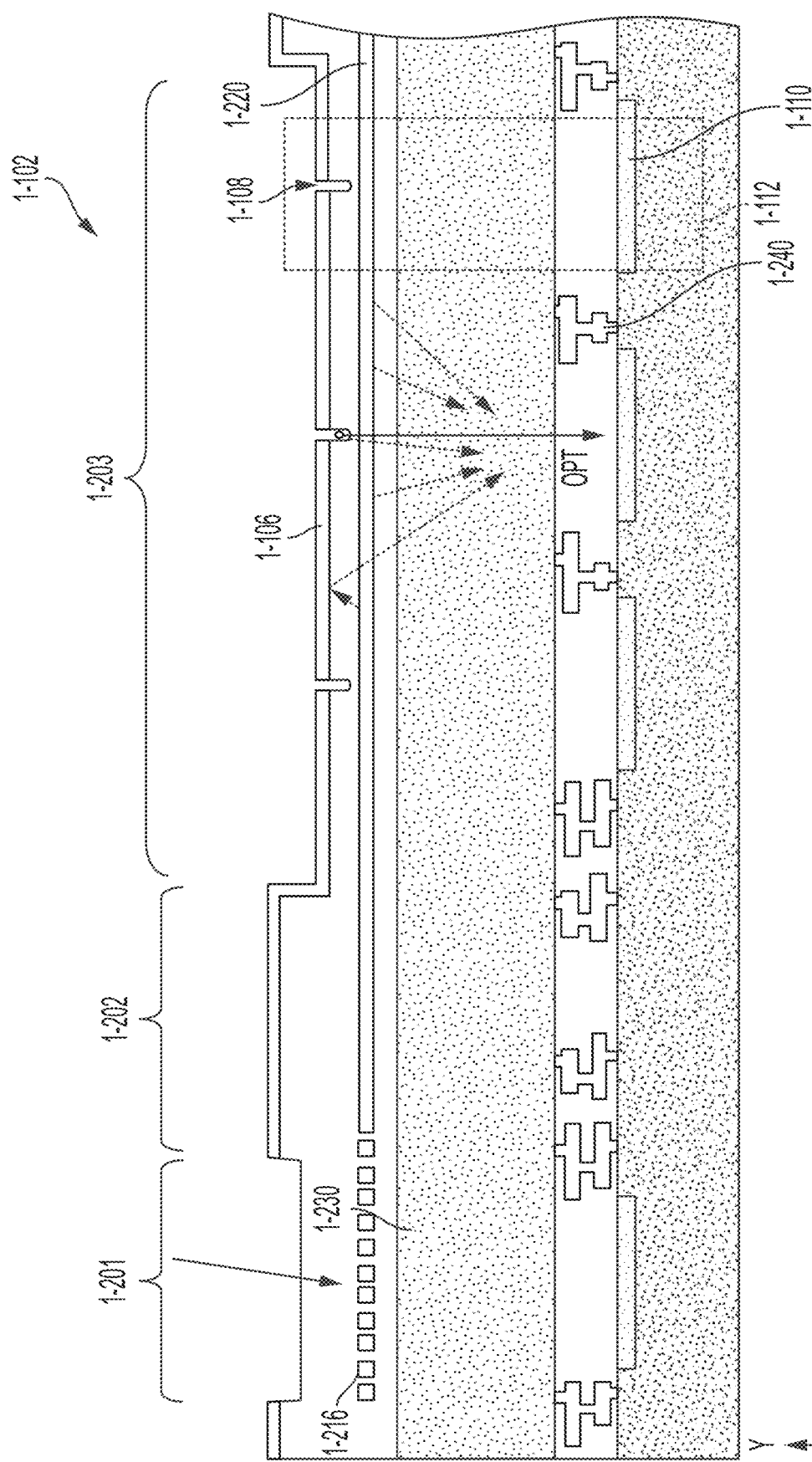
FIG. 1-1 is a schematic of an integrated device, according to some embodiments.

When describing embodiments in reference to the drawings, directional references ("above," "below," "top," "bottom," "left," "right," "horizontal," "vertical," etc.) may be used. Such references are intended merely as an aid to the reader viewing the drawings in a normal orientation. These directional references are not intended to describe a preferred or only orientation of features of an embodied device. A device may be embodied using other orientations.

DETAILED DESCRIPTION

I. Introduction

Aspects of the present disclosure relate to integrated devices, instruments and related systems capable of analyzing samples in parallel, including identification of single molecules, nucleic acid sequencing, and protein sequencing. Such an instrument may be compact, easy to carry, and easy to operate, allowing a physician or other provider to readily use the instrument and transport the instrument to a desired location where care may be needed. Analysis of a sample may include labeling the sample with one or more fluorescent markers, which may be used to detect the sample and/or identify single molecules of the sample (e.g., individual nucleotide identification as part of nucleic acid sequencing). A fluorescent marker may become excited in response to illuminating the fluorescent marker with excitation light (e.g., light having a characteristic wavelength that may excite the fluorescent marker to an excited state) and, if the fluorescent marker becomes excited, emit emission light (e.g., light having a characteristic wavelength emitted by the fluorescent marker by returning to a ground state from an excited state). Detection of the emission light may allow for identification of the fluorescent marker, and thus, the sample or a molecule of the sample labeled by the fluorescent marker. According to some embodiments, the instrument may be capable of massively-parallel sample analyses and may be configured to handle tens of thousands of samples or more simultaneously.

In some embodiments, an integrated device, having sample wells configured to receive the sample and integrated optics formed on the integrated device, and an instrument configured to interface with the integrated device may be used to achieve analysis of this number of samples. The instrument may include one or more excitation light sources, and the integrated device may interface with the instrument such that the excitation light is delivered to the sample wells using integrated optical components (e.g., waveguides, optical couplers, optical splitters) formed on the integrated device.

The integrated device can include pixels with photodetection regions (e.g., photodiodes) to detect fluorescent emissions from the sample wells. In some embodiments, the integrated device may receive fluorescence emission photons and transmit charge carriers to one or more charge storage regions of the pixels. For example, a photodetection region of a pixel may be positioned on the integrated device to receive the fluorescent emissions along an optical axis, and the photodetection region also may be coupled to one or more charge storage regions (e.g., storage diodes) along an electrical axis, such that the charge storage region(s) may collect charge carriers generated in the photodetection region based on the fluorescent emissions. In some embodiments, during a collection period, the charge storage region(s) may receive the charge carriers from the photodetection region, and during a separate readout period, the charge storage region(s) may provide the stored charge carriers to a readout circuit for processing. In some embodiments, during a drain period, a drain region of the integrated device may receive noise charge carriers (e.g., excitation charge carriers generated responsive to incident excitation photons) from the photodetection region for discarding.

In some embodiments, an integrated circuit may include row(s) of pixels and/or a two-dimensional array of pixels. When using multiple pixels, the pixels typically have similar or identical arrangements of the pixels (and associated pixel components) across the rows and/or columns of the pixel array. As a result, pixel components are generally disposed a same distance from the pixel components of neighboring pixels (e.g., a same distance along the row and/or column direction to components of neighboring pixels). For such arrangements, separate conductive control lines are often used to control component(s) of each pixel along a row. The inventors have discovered and appreciated that using separate conductive control lines often requires using thin control lines to provide sufficient space for control lines to connect to each individual pixel. The inventors have appreciated that using such thin control lines can increase the resistance of the control lines. The inventors have further appreciated that using separate control lines for each pixel only allows for a small amount of space between each control line, which can create a large capacitance between neighboring control lines (e.g., since the control lines cannot be spaced farther apart than at the individual pixel level).

To solve the above problems, the inventors have developed techniques to mirror pixels in pixel row(s) and/or in a pixel array. In particular, instead of having similar or identical copies of pixels that are formed side-by-side along a row or column of a pixel array, the inventors have appreciated that it can be desirable for some or all of the structure of neighboring pixels to be in mirrored configurations. For example, neighboring pixels can be flipped 180 degrees about a boundary between the neighboring pixels (e.g., based on the neighboring sides of the pixels along the row direction). As a result, for a pair of mirrored pixels, at least one component of the first pixel is proximate at least one component of the second pixel. The proximate components can be any pixel component described herein, such as a charge storage region, a rejection region, a transfer gate, a transfer region, a drain gate, a drain region, optically-directive structures or barriers, and/or the like. Using mirrored pixel configurations can improve physical characteristics, electrical characteristics, and/or other aspects of the integrated circuit. For example, since components of neighboring mirrored pixels that are configured to share a same signal between the neighboring pixels can be disposed closer than in non-mirrored configurations, conductive lines can be shared across the neighboring mirrored pixels rather than needing a respective conductive line to be dedicated to each pixel. Such configurations can therefore improve resistance of the conductive lines and/or reduce capacitance between adjacent lines. Improving such electrical aspects of the control lines can improve operation of the integrated circuit generally, such as improving the speed and accuracy of pixel operation (e.g., shutter efficiency) compared to non-mirrored pixel arrangements.

The inventors have also developed improvements to conductive line structures (e.g., used to carry electrical signals, such as voltage and/or current signals), which can be used with mirrored and/or non-mirrored pixel configurations. In some embodiments, a first pixel may be disposed proximate to a second pixel along a row direction, and a conductive line extending along a column direction that intersects with the row direction may be in electrical communication with a first component of a first pixel and a second component of the second pixel. The inventors recognized that a conductive line being in electrical communication with components of proximate (e.g., adjacent) pixels can allow large spacing between adjacent conductive lines carrying different signals, such that conductive lines can be made with low capacitance between the adjacent conductive lines and such that the conductive lines can be made wide for low resistance.

In some embodiments, a first conductive line that extends in the column direction can be in electrical communication with components of a first pair of adjacent pixels and a second conductive line that extends in the column direction can be electrically separate from the first conductive line and in electrical communication with components of a second pair of adjacent pixels. For example, the first and second conductive lines can carry different signals to the pixels. In some embodiments, a plurality of the first conductive lines can be in electrical communication with first pairs of pixels and a plurality of the second conductive lines can be electrically separate from the first conductive lines and in electrical communication with second pairs of pixels, with ones of the first conductive lines positioned between adjacent ones of the second conductive lines. For example, since the first conductive lines and second conductive lines can be in electrical communication with pairs of pixels, the first and second conductive lines can be spaced far apart from one another, allowing the lines to be made wide and with low capacitance between the adjacent lines.

In some embodiments, one or more third conductive lines can be in electrical communication with the first conductive line(s), with the first conductive line(s) positioned between the third conductive line(s) and the pixels. Likewise, in some embodiments, one or more fourth conductive lines can be electrically separate from the third conductive line(s) and in electrical communication with the second conductive line(s), with the second conductive line(s) positioned between the fourth conductive line(s) and the pixels. For example, the third and fourth conductive line(s) can be formed on one or more different layers from the first and/or second conductive line(s). In some embodiments, the third and fourth conductive line(s) can be spaced from one another in the column and/or row directions, thereby providing low capacitance between the third and fourth conductive lines.

In some embodiments, the third and fourth conductive line(s) can underlie or overlie different rows of pixels. For example, the third conductive lines(s) can underlie or overlie a first row and the fourth conductive line(s) can underlie or overlie a second row. In this example, the first conductive line(s) can be configured to distribute signals from the third conductive line(s) to the second row and the second conductive line(s) can be configured to distribute signals from the fourth conductive line(s) to the first row, such that the third and fourth conductive lines can be spaced from one another in the column directions, providing low capacitance between the third and fourth conductive lines. In some embodiments, the third conductive line(s) can extend in the row direction overlying or underlying a first row of pixels and the fourth conductive line(s) can extend in the row direction overlying or underlying a second row of pixels.

In some embodiments, the third and fourth conductive line(s) can be spaced from one another in the row direction, providing low capacitance between the third and fourth conductive lines. For example, the third conductive line(s) can extend in the column direction at least partially overlying or underlying the first conductive line(s) and the fourth conductive line(s) can extend in the column direction at least partially overlying or underlying the second conductive line(s). In some embodiments, one or more fifth conductive lines can be positioned above or below the third conductive line(s), with the third conductive line(s) positioned between the fifth conductive line(s) and the pixels, and the fifth conductive line(s) can extend in the row direction overlying or underlying a first row of pixels. Likewise, in some embodiments, one or more sixth conductive lines can be positioned above or below the fourth conductive line(s), with the fourth conductive line(s) positioned between the sixth conductive line(s) and the pixels, and the sixth conductive line(s) can be spaced from the fifth conductive line(s) in the column direction and extend in the row direction overlying or underlying a second row of pixels.

It should be appreciated that integrated devices described herein may incorporate any or all techniques described herein alone or in combination.

II. Integrated Device Overview

A cross-sectional schematic of integrated device 1-102 illustrating a row of pixels 1-112 is shown in FIG. 1-1, according to some embodiments. Integrated device 1-102 may include coupling region 1-201, routing region 1-202, and pixel region 1-203. Coupling region 1-201 may be configured to receive incident excitation light from an excitation light source. Routing region 1-202 may be configured to deliver the excitation light from coupling region 1-201 to pixel region 1-203. Pixel region 1-203 may include a plurality of sample wells 1-108 positioned on a surface at a location separate from coupling region 1-201. For example, coupling region 1-201 may include one or more grating couplers 1-216 and routing region 1-202 may include one or more waveguides 1-220 configured to propagate light from grating coupler(s) 1-216 under sample well(s) 1-108. For instance, evanescent coupling of excitation light from waveguide(s) 1-220 may excite samples in sample well(s) 1-108 to emit fluorescent light.

As shown in FIG. 1-1, one or more at least partially opaque (e.g., metal) layers 1-106 can be disposed over the surface to reflect incident excitation light coupled from waveguide(s) 1-220. Sample wells 1-108 may be free of layer(s) 1-106 to allow samples to be placed in sample well(s) 1-108. In some embodiments, the directionality of the emission light from a sample well 1-108 may depend on the positioning of the sample in the sample well 1-108 relative to metal layer(s) 1-106 because metal layer(s) 1-106 may act to reflect emission light. In this manner, a distance between metal layer(s) 1-106 and a fluorescent marker on a sample positioned in a sample well 1-108 may impact the efficiency of photodetector(s) 1-110, that are in the same pixel as the sample well, to detect the light emitted by the fluorescent marker. The distance between metal layer(s) 1-106 and the bottom surface of a sample well 1-108, which is proximate to where a sample may be positioned during operation, may be in the range of 100 nm to 500 nm, or any value or range of values in that range. In some embodiments the distance between metal layer(s) 1-106 and the bottom surface of a sample well 1-108 is approximately 300 nm.

As shown in FIG. 1-1, pixel region 1-203 can include one or more rows of pixels 1-112. One pixel 1-112, illustrated by the dotted rectangle, is a region of integrated device 1-102 that includes a sample well 1-108 and one or more photodetectors 1-110 (e.g., including a photodetection region) associated with the sample well 1-108. In some embodiments, each photodetector 1-110 can include a photodetection region and one or more charge storage regions configured to receive charge carriers generated in the photodetection region in response to incident light from the sample well 1-108. When excitation light coupled from waveguide(s) 1-220 illuminates a sample located within the sample well 1-108, the sample may reach an excited state and emit emission light. The emission light may be detected by one or more photodetectors 1-110 associated with the sample well 1-108. FIG. 1-1 schematically illustrates an optical axis of emission light (shown as the solid line) from a sample well 1-108 to photodetector(s) 1-110 of pixel 1-112. The photodetector(s) 1-110 of pixel 1-112 may be configured and positioned to detect emission light from sample well 1-108. For an individual pixel 1-112, a sample well 1-108 and its respective photodetector(s) 1-110 may be aligned along a common optical axis. In this manner, the photodetector(s) 1-110 may overlap with the sample well 1-108 within a pixel 1-112.

Also shown in FIG. 1-1, integrated device 1-102 can include one or more photonic structures 1-230 and/or metal layers 1-240 positioned between sample wells 1-108 and photodetectors 1-110. For example, photonic structures 1-230 may be configured to increase the amount of emission light that reaches photodetectors 1-110 from sample wells 1-108. Alternatively or additionally, photonic structures 1-230 may be configured to reduce or prevent excitation light from reaching photodetectors 1-110, which may otherwise contribute to signal noise in detecting the emission light. As shown in FIG. 1-1, photonic structures 1-230 may be positioned between waveguide(s) 1-220 and photodetectors 1-110. According to various embodiments, photonic structures 1-230 may include one or more optical rejection photonic structures including a spectral filter, a polarization filter, and a spatial filter. In some embodiments, photonic structures 1-230 may be positioned to align with individual sample wells 1-108 and their respective photodetector(s) 1-110 along a common axis.

In some embodiments, metal layers 1-240 may be configured to route control signals to and/or from portions of integrated device 1-102. For example, the control signals may be received from a control circuit within and/or coupled to one or more conductive pads (not shown) of integrated device 1-102 and routed to pixels 1-112 via metal layers 1-240. In some embodiments, metal layers 1-240 may also act as a spatial and/or polarization filter. In such embodiments, one or more metal layers 1-240 may be positioned to block some or all excitation light from reaching photodetector(s) 1-110.

In some embodiments, the distance between the sample and the photodetector(s) may also impact efficiency in detecting emission light. By decreasing the distance light has to travel between the sample and the photodetector(s) 1-110, detection efficiency of emission light may be improved. In addition, smaller distances between the sample and the photodetector(s) 1-110 may allow for pixels that occupy a smaller area footprint of the integrated device, which can allow for a higher number of pixels to be included in the integrated device. The distance d between the bottom surface of a sample well 1-108 and the photodetector(s) 1-110 may be in the range of 5 µm to 15 µm, or any value or range of values in that range, in some embodiments, but the invention is not so limited. It should be appreciated that, in some embodiments, emission light may be provided through other means than an excitation light source and a sample well. Accordingly, some embodiments may not include sample well 1-108.

A sample to be analyzed may be introduced into sample well 1-108 of pixel 1-112. The sample may be a biological sample or any other suitable sample, such as a chemical sample. The sample may include multiple molecules and the sample well may be configured to isolate a single molecule. In some instances, the dimensions of the sample well 1-108 may act to confine a single molecule within the sample well 1-108, allowing measurements to be performed on the single molecule. Excitation light may be delivered into the sample well 1-108, so as to excite the sample or at least one fluorescent marker attached to the sample or otherwise associated with the sample while it is within an illumination area within the sample well 1-108.

In operation, parallel analyses of samples within the sample wells 1-108 are carried out by exciting some or all of the samples within the wells using excitation light and detecting signals from sample emission with the photodetectors 1-110. Emission light from a sample may be detected by a corresponding photodetector 1-110 and converted to at least one electrical signal. The electrical signals may be transmitted along conducting lines (e.g., metal layers 1-240) of integrated device 1-102, which may be connected to an instrument and/or control circuit interfaced with the integrated device 1-102. The electrical signals may be subsequently processed and/or analyzed by the instrument and/or control circuit.

Figures 1, 2:
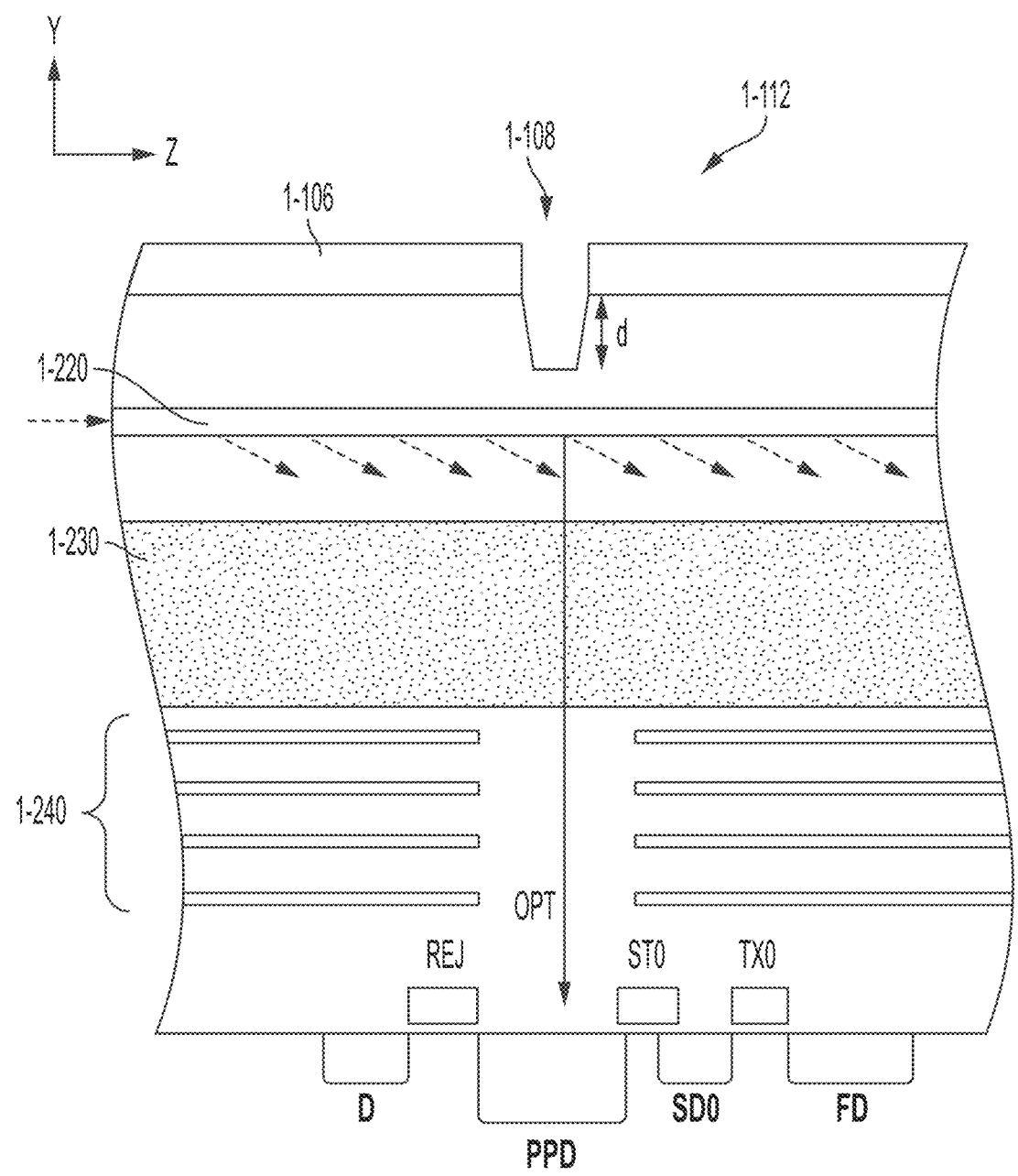

FIG. 1-2 illustrates a cross-sectional view of a pixel 1-112 of integrated device 1-102. Pixel 1-112 includes a photodetection region, which may be a pinned photodiode (PPD), a charge storage region, which may be a storage diode (SD0), a readout region, which may be a floating diffusion (FD) region, a drain region D, and transfer gates REJ, ST0, and TX0. In some embodiments, photodetection region PPD, charge storage region SD0, readout region FD, and/or drain region D may be formed in the integrated device 1-102 by doping portions of one or more substrate layers of the integrated device 1-102. For example, the integrated device 1-102 may have a lightly p-doped substrate, and photodetection region PPD, charge storage region SD0, readout region FD, and/or drain region D may be n-doped regions of the substrate. In this example, p-doped regions may be doped using boron and n-doped regions may be doped using phosphorus, although other dopants and configurations are possible. In some embodiments, pixel 1-112 may have an area smaller than or equal to 10 microns by 10 microns, such as smaller than or equal to 7.5 microns×5 microns. It should be appreciated that, in some embodiments, the substrate may be lightly n-doped and photodetection region PPD, charge storage region SD0, readout region FD, and/or drain region D may be p-doped, as embodiments described herein are not so limited.

In some embodiments, photodetection region PPD may be configured to generate charge carriers in response to incident light. For instance, during operation of pixel 1-112, excitation light may illuminate sample well 1-108 causing incident photons, including fluorescent emissions from a sample, to flow along the optical axis OPT to photodetection region PPD, which may be configured to generate fluorescent emission charge carriers in response to the incident photons from sample well 1-108. In some embodiments, the integrated device 1-102 may be configured to transfer the charge carriers to drain region D or to charge storage region SD0. For example, during a drain period following a pulse of excitation light, the incident photons reaching photodetection region PPD may be predominantly excitation photons to be transferred to drain region D to be discarded. In this example, during a collection period following the drain period, fluorescent emission photons may reach photodetection region PPD to be transferred to charge storage region SD0 for collection. In some embodiments, a drain period and collection period may follow each excitation pulse.

In some embodiments, charge storage region SD0 may be configured to receive charge carriers generated in photodetection region PPD in response to the incident light. For example, charge storage region SD0 may be configured to receive and store charge carriers generated in photodetection region PPD in response to fluorescent emission photons from the sample well 1-108. In some embodiments, charge storage region SD0 may be configured to accumulate charge carriers received from photodetection region PPD over the course of multiple collection periods, each preceded by an excitation pulse. In some embodiments, charge storage region SD0 may be electrically coupled to photodetection region PPD by a charge transfer channel. In some embodiments, the charge transfer channel may be formed by doping a region of pixel 1-112 between photodetection region PPD and charge storage region SD0 with a same conductivity type as photodetection region PPD and charge storage region SD0 such that the charge transfer channel is configured to be conductive when at least a threshold voltage is applied to the charge transfer channel and nonconductive when a voltage less than (or greater than, for some embodiments) the threshold voltage is applied to the charge transfer channel. In some embodiments, the threshold voltage may be a voltage above (or below) which the charge transfer channel is depleted of charge carriers, such that charge carriers from photodetection region PPD may travel through the charge transfer channel to charge storage region SD0. For example, the threshold voltage may be determined based on the materials, dimensions, and/or doping configuration of the charge transfer channel.

In some embodiments, transfer gate ST0 may be configured to control a transfer of charge carriers from photodetection region PPD to charge storage region SD0. For instance, transfer gate ST0 may be configured to receive a control signal and responsively determine a conductivity of a charge transfer channel electrically coupling photodetection region PPD to charge storage region SD0. For example, when a first portion of a control signal is received at transfer gate ST0, transfer gate ST0 may be configured to bias the charge transfer channel to cause the charge transfer channel to be nonconductive, such that charge carriers are blocked from reaching charge storage region SD0. Alternatively, when a second portion of the control signal is received at transfer gate ST0, transfer gate ST0 may be configured to bias to the charge transfer channel to cause the charge transfer channel to be conductive, such that charge carriers may flow from photodetection region PPD to charge storage region SD0 via the charge transfer channel. In some embodiments, transfer gate ST0 may be formed of an electrically conductive and at least partially opaque material such as polysilicon.

In some embodiments, transfer gate TX0 may be configured to control a transfer of charge carriers from charge storage region SD0 to readout region FD in the manner described for transfer gate ST0 in connection with photodetection region PPD and charge storage region SD0. For example, following a plurality of collection periods during which charge carriers are transferred from photodetection region PPD to charge storage region SD0, charge carriers stored in charge storage region SD0 may be transferred to readout region FD to be read out to other portions of the integrated device 1-102 for processing.

In some embodiments, transfer gate REJ may be a reject gate configured to control a transfer of charge carriers from photodetection region PPD to drain region D in the manner described for transfer gate ST0 in connection with photodetection region PPD and charge storage region SD0. For example, excitation photons from the excitation light source may reach photodetection region PPD before fluorescent emission photons from the sample well 1-108 reach photodetection region PPD. In some embodiments, the integrated device 1-102 may be configured to control transfer gate REJ to transfer charge carriers generated in photodetection region PPD in response to the excitation photons to drain region D during a drain period following an excitation light pulse and preceding reception of fluorescent emission charge carriers In some embodiments, pixel 1-112 may be electrically coupled to a control circuit of integrated device 1-102, and/or of a system that includes integrated device 1-102, and configured to receive control signals from the control circuit at transfer gates REJ, ST0, and TX0. For example, metal lines of metal layers 1-240 may be configured to carry the control signals to pixels 1-112 of the integrated device 1-102. In some embodiments, a single metal line carrying a control signal may be electrically coupled to a plurality of pixels 1-112, such as an array, subarray, row, and/or column of pixels 1-112. For example, each pixel 1-112 in an array may be configured to receive a control signal from a same metal line and/or net such that the row of pixels 1-112 is configured to drain and/or collect charge carriers from photodetection region PPD at the same time. Alternatively or additionally, each row of pixels 1-112 in the array may be configured to receive different control signals (e.g., row-select signals) during a readout period such that the rows read out charge carriers one row at a time.

Figures 1, 2, 3:
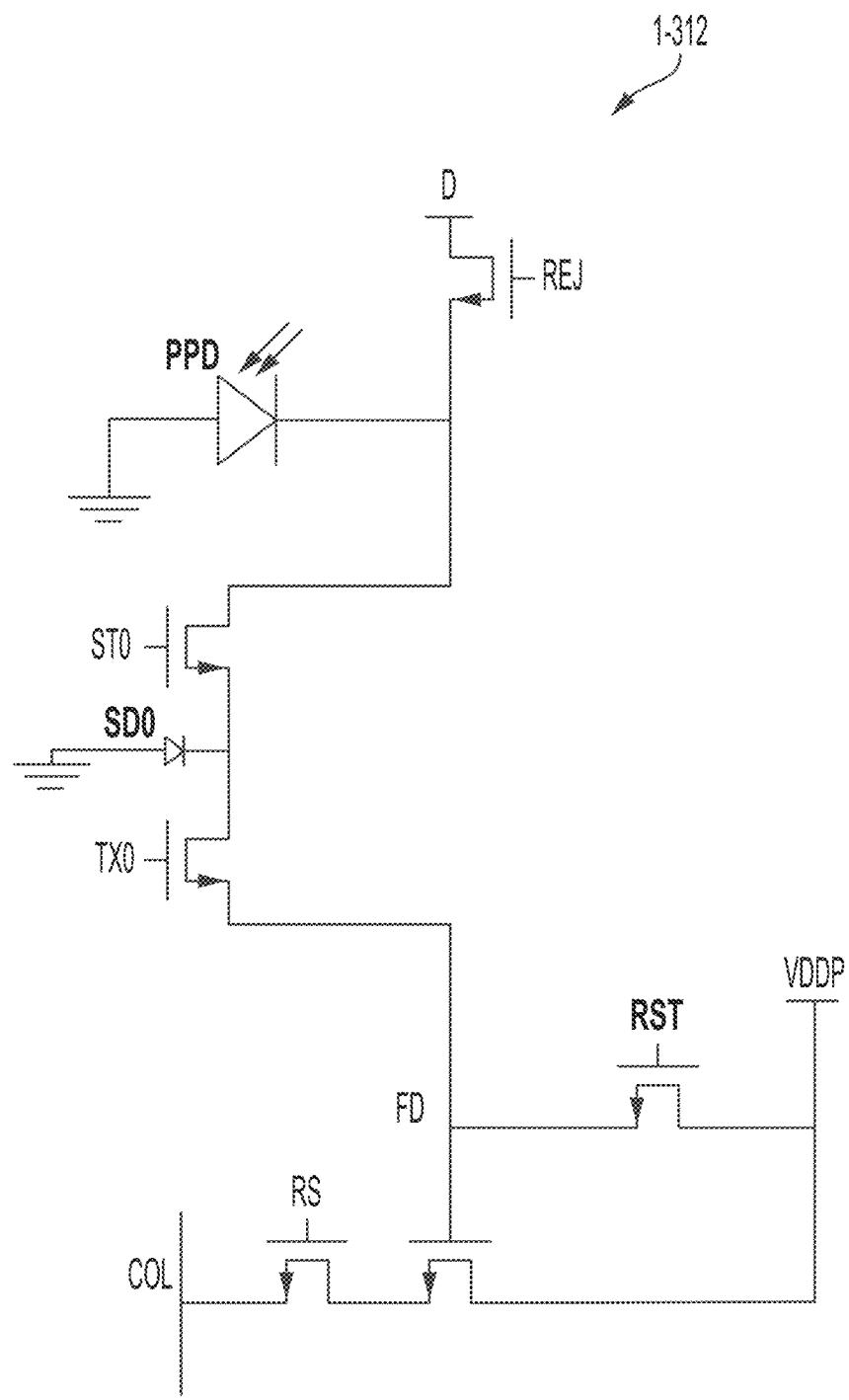

FIG. 1-3 is a circuit diagram of an exemplary pixel 1-312 that may be included in integrated device 1-102, according to some embodiments. In some embodiments, pixel 1-312 may be configured in the manner described for pixel 1-112. For example, as shown in FIG. 1-3, pixel 1-312 includes photodetection region PPD, charge storage region SD0, readout region FD, drain region D, and transfer gates REJ, ST0, and TX0. In FIG. 1-3, transfer gate REJ is the gate of a transistor coupling photodetection region PPD to drain region D, transfer gate ST0 is the gate of a transistor coupling photodetection region PPD to charge storage region SD0, and transfer gate TX0 is the gate of a transistor coupling charge storage region SD0 to readout region FD. Pixel 1-312 also includes a reset (RST) transfer gate and a row-select (RS) transfer gate. In some embodiments, transfer gate RST may be configured to, in response to a reset control signal, clear charge carriers in readout region FD and/or charge storage region SD0. For example, transfer gate RST may be configured to cause charge carriers to flow from readout region FD and/or from charge storage region SD0 via transfer gate TX0 and readout region FD, to a direct current (DC) supply voltage VDDP. In some embodiments, transfer gate RS may be configured to, in response to a row select control signal, transfer charge carriers from readout region FD to a bitline COL for processing.

While the transistors shown in FIG. 1-3 are field effect transistors (FETs), it should be appreciated that other types of transistors such as bipolar junction transistors (BJTs) may be used.

FIG. 1-4 is a diagram showing exemplary charge transfer in pixel 1-312, according to some embodiments. In some embodiments, operation of pixel 1-312 may include one or more collection sequences. An exemplary collection sequence is shown in FIG. 1-3 including a first collection period 1-1, a first readout period 1-2, a second collection period 1-3, and a second readout period 1-4. In some embodiments, each collection period of the collection sequence may be preceded by a drain period, as described further herein. In some embodiments, operation of pixel 1-312 may include one or multiple iterations of the collection sequence shown in FIG. 1-3. In some embodiments, the collection sequence may be coordinated with the excitation of samples in the sample wells 1-108. For example, a single control circuit may be configured to control the excitation light source and operation of pixels 1-312.

In some embodiments, the first collection period 1-1 may include receiving a first plurality of fluorescent emission photons at photodetection region PPD. For example, first collection period 1-1 may occur in response to a pulse of excitation light that illuminates a sample well 1-108 configured to emit fluorescent emission photons toward photodetection region PPD. As shown in FIG. 1-4, photodetection region PPD may be configured to generate charge carriers Q1 in response to the incident fluorescent emission photons and transfer charge carriers Q1 to charge storage region SD0 during the first collection period 1-1. In some embodiments, excitation photons may reach photodetection region PPD during a drain period immediately following the excitation pulse but before first collection period 1-1, during which charge carriers generated in photodetection region PPD in response to the excitation photons may be transferred to drain region D. In some embodiments, collection period 1-1 may be repeated multiple times in response to multiple respective excitation pulses, and charge carriers Q1 may be accumulated in charge storage region SD0 over the course of the collection periods 1-1. In some such embodiments, each collection period 1-1 may be preceded by a drain period. In some embodiments, the collection periods 1-1 and/or drain periods preceding each collection period 1-1 may occur at the same time for each pixel of an array, subarray, row, and/or column of the integrated device 1-102.

In some embodiments, the first readout period 1-2 may occur following one or more collection periods 1-1 during which charge carriers Q1 are accumulated in charge storage region SD0. As shown in FIG. 1-4, during the first readout period 1-2, charge carriers Q1 stored in charge storage region SD0 may be transferred to readout region FD to be read out for processing. In some embodiments, the readout period 1-2 may be performed using correlated double sampling (CDS) techniques. For example, a first voltage of readout region FD may be read out at a first time, followed by a reset of the readout region FD (e.g., by applying a reset signal to transfer gate RST) and the transfer of charge carriers Q1 from charge storage region SD0 to readout region FD, and a second voltage of readout region FD may be read out at a second time following the transfer of charge carriers Q1. In this example, the difference between the first and second voltages may indicate a quantity of charge carriers Q1 transferred from charge storage region SD0 to readout region FD. In some embodiments, the first readout period 1-2 may occur at a different time for each row, column, and/or pixel of an array. For example, by reading out pixels one row or column at a time, a single processing line may be configured to process readout of each row or column in sequence rather than dedicating a processing line to each pixel to read out simultaneously. In other embodiments, each pixel of an array may be configured to read out at the same time, as a processing line may be provided for each pixel of the array. According to various embodiments, charge carriers read out from the pixels may indicate fluorescence intensity, lifetime, spectral, and/or other such fluorescence information of the samples in the sample wells 1-108.

In some embodiments, the second collection period 1-3 may occur in the manner described for collection period 1-1. For example, following the first readout period 1-2, one or more second collection periods 1-3 may follow one or more respective excitation pulses, such as with a drain period preceding each collection period 1-3. As shown in FIG. 1-4, during the second collection period(s) 1-3, charge carriers Q2 generated in photodetection region PPD may be transferred to charge storage region SD0. In some embodiments, a delay between each excitation pulse and corresponding collection period 1-3 may be different from a delay between each excitation pulse and corresponding collection period 1-1. For example, by collecting charge carriers during a different time period following the excitation pulse during different collection periods, charge carriers read out from the collection periods 1-1 and 1-3 may indicate fluorescence lifetime information of the samples in the sample wells 1-108. In some embodiments, the second collection period(s) 1-3 may be followed by a second readout period 1-4 during which charge carriers accumulated in charge storage region SD0 over the course of the second collection period(s) may be read out in the manner described herein for the first readout period 1-2.

FIG. 1-5A is a plan view of pixel 1-512, which may be included in integrated device 1-102, according to some embodiments. In some embodiments, pixel 1-512 may be configured in the manner described herein for pixels 1-112 and 1-312. For example, in FIG. 1-5A, pixel 1-512 includes photodetection region PPD, charge storage region SD0, readout region FD, and transfer gates ST0, TX0, RST, and RS. In addition, in FIG. 1-5A, pixel 1-512 includes a second charge storage region SD1 and transfer gates ST1 and TX1, which may be configured in the manner described herein for charge storage region SD0 and transfer gates ST0 and TX0, respectively. For example, charge storage regions SD0 and SD1 may be configured to receive charge carriers generated in photodetection region PPD, which may be transferred to readout region FD. In some embodiments, charge storage regions SD0 and SD1 may be configured to receive charge carriers from photodetection region PPD at different times relative to an excitation pulse. In some embodiments, a separate readout region FD may be coupled to each charge storage region. FIG. 1-5B is a circuit diagram of pixel 1-512, according to some embodiments.

FIG. 1-6 is a diagram illustrating exemplary charge transfer in pixel 1-512, according to some embodiments. In some embodiments, operation of pixel 1-512 may include one or multiple iterations of the collection sequence shown in FIG. 1-6, including first collection period 1-1', second collection period 1-2', first readout period 1-3', and second readout period 1-4'.

In some embodiments, one or more first collection periods 1-1' may be performed in the manner described herein including in connection with first collection period 1-1, such as in response to one or more respective excitation pulses and/or having a drain period preceding each collection period 1-1'. As shown in FIG. 1-6, charge carriers Q1' may be generated in photodetection region PPD and transferred to charge storage region SD0. In some embodiments, one or more second collection periods 1-2' may occur following the first collection period(s) 1-1', during which charge carriers Q2' may be generated in photodetection region PPD and transferred to charge storage region SD1. For example, charge carriers Q2' may be transferred to charge storage region SD1 at a different time relative to the respective excitation pulse than charge carriers Q1' during first collection periods 1-1'. It should be appreciated that, in some embodiments, the first and second collection periods 1-1' and 1-2' may occur in response to the same one or more excitation pulses. For example, a common excitation pulse may cause fluorescent emission photons to reach photodetection region PPD over a period of time following the excitation pulse, and the period of time may be divided between a first collection period 1-1' during which charge carriers Q1' are transferred to charge storage region SD0 and a second collection period 1-2' during which charge carriers Q2' are transferred to charge storage region SD1. It should be appreciated that charge carriers Q1' and Q2' may be transferred to either charge storage region SD0 or SD1 and in either order, according to various embodiments.

In some embodiments, first readout period 1-3' may be performed in the manner described herein for first readout period 1-2 including in connection with FIG. 1-4. For example, as shown in FIG. 1-6, during the first readout period 1-3', charge carriers Q1' may be transferred from charge storage region SD0 to readout region FD. In some embodiments, second readout period 1-4' may occur following first readout period 1-3', and charge carriers Q2' may be transferred from charge storage region SD1 to readout region FD. It should be appreciated that charge carriers Q1' and Q2' may be read out in any order, according to various embodiments.

It should be appreciated that pixel 1-512 may be alternatively configured to operate in the manner described herein including in connection with FIG. 1-4, such as accumulating charge carriers in one charge storage region, reading out the charge carriers from the charge storage region, and then repeating this process with the other charge storage region. It should also be appreciated that, according to various embodiments, pixels described herein may include any number of charge storage regions.

In some embodiments, some components of pixels described herein may be disposed and/or formed on one or more substrate layers of an integrated circuit. In some embodiments, the substrate layer(s) may alternatively or additionally include one or more auxiliary layers (e.g., epitaxial layers) disposed above and/or below the other substrate layer(s). In some embodiments, some components of pixels described herein may be formed by etching away at least a portion of the substrate and/or auxiliary layer(s). In some embodiments, transfer and/or drain gates described herein may be formed using a semiconductor material such as polysilicon, which may be at least partially opaque.

A. Techniques Incorporating a Potential Gradient-Inducing Mask

FIG. 2-1 is a schematic view of an example pixel 2-112 comprising a potential gradient-inducing mask, according to some embodiments. Pixel 2-112 may be configured in the manner described for pixel 1-112 in connection with FIGS. 1-1 to 1-5A. As shown in FIG. 2-1, pixel 2-112 includes a photodetection region PD and at least one charge storage region SD0. A mask is shown disposed above or below at least a portion of the photodetection region PD, and the mask has an opening configured to generate a potential gradient from the photodetection region PD to a charge transfer region (e.g., above or below the transfer gate ST0) electrically coupling the photodetection region PD to the charge storage region SD0. In addition, pixel 2-112 is shown with a drain region D, with the drain region D and the charge storage region SD0 spaced from the photodetection region PD in a same direction. It should be appreciated that embodiments of pixel 2-112 may include more than one charge storage region, such as two charge storage regions, and some embodiments may not include drain region D.

In some embodiments, pixel 2-112 may be included as a portion of an integrated circuit. For instance, in accordance with various embodiments, an integrated circuit may include one of pixel 2-112, a row of pixels 2-112, and/or a two-dimensional array of pixels 2-112. In some embodiments, pixel 2-112 may have an area smaller than or equal to 10 microns by 10 microns, such as smaller than or equal to 7.5 microns×5 microns. In some embodiments, the charge storage region SD0 may be disposed and/or formed on one or more substrate and/or auxiliary layers of pixel 2-112. For instance, the substrate layer(s) may be lightly p-type doped and the charge storage region SD0 may be formed by n-type doping the substrate layer(s). In one example, the charge storage region SD0 may be formed using phosphorous.

In some embodiments, pixel 2-112 may be positioned to receive incident photons from a light source. In some embodiments, the photodetection region PD of pixel 2-112 may be configured to receive the incident photons along an optical axis. For instance, as shown in FIG. 2-1, the first optical axis may extend perpendicular to the surface of photodetection region PD on which the mask is disposed. Photodetection region PD may be configured to generate charge carriers (e.g., photoelectrons) responsive to the incident photons. Photodetection region PD may be further configured to transfer the charge carriers to charge storage region SD0 along an electrical axis. For instance, the electrical axis may be perpendicular to the optical axis, such as extending in the direction in which charge storage region SD0 is spaced from photodetection region PD. The photodetection region PD may be further configured to transfer the charge carriers to the drain region D. In one example, the photodetection region PD may transfer the charge carriers to drain region D or charge storage region SD0 in accordance with controlled bias voltages at the drain gate REJ and the transfer gate ST0 that determine conductivity states for the charge transfer channel and drain channel (e.g., electrically coupling the photodetection region PD to the drain region D, positioned above or below the drain gate REJ). For instance, when a voltage at drain gate REJ biases the drain channel, reducing the electrostatic barrier of the drain channel, charge carriers may propagate through the drain channel to the drain region D. At the same time, a voltage at the transfer gate ST0 may bias the charge transfer channel to increase the electrostatic barrier of the charge transfer channel, inhibiting charge carriers from propagating to the charge storage region SD0 from the photodetection region PD. For instance, draining charge carriers from the photodetection region PD to the drain region D may be configured (e.g., timed) to discard charge carriers generated from excitation photons, thus reducing interference from the excitation charge carriers on the fluorescent emission charge carriers.

Likewise, in the above example, when the voltage at the transfer gate ST0 biases the charge transfer channel to reduce the electrostatic barrier of the charge transfer channel, charge carriers may propagate from the photodetection region PD to the charge storage region SD0. At the same time, the voltage at the drain gate may bias the drain channel to increase the electrostatic barrier of the drain channel, inhibiting charge carriers from propagating to the drain region D from the photodetection region PD. For instance, transferring charge carriers to charge storage region SD0 may be configured (e.g., timed) to facilitate accumulation of fluorescent emission charge carriers in the charge storage region SD0. In some embodiments, the configuration (e.g., timing) of draining and/or collecting charge carriers in pixel 2-112 may occur as described in connection with FIGS. 1-1 to 1-5A.

In some embodiments, the pixel may be configured such that a high control voltage increases conductivity of a charge transfer and/or drain channel of the pixel. For example, the channel(s) may be n-type doped in and/or on a lightly p-doped substrate. In some embodiments, the pixel may be configured such that a low control voltage increases conductivity of the charge transfer and/or drain channel. For example, the channel(s) may be p-type doped in and/or on a lightly n-doped substrate. Some embodiments may include both p-type and n-type channels.

The mask may include a thin, at least partially opaque and at least partially insulative material. For example, in some embodiments, the mask have a thickness of less than 1 micron, such as 0.6 microns, along the optical axis. The mask opening may be configured to induce a potential gradient in the photodetection region PD, which may increase the rate of charge carrier transport from the photodetection region PD to the drain region D and/or the charge storage region SD0 along the electrical axis. For instance, the mask opening may be shaped and/or otherwise configured to generate an electric field in the photodetection region PD such that charge carriers generated in the photodetection region PD responsive to incident photons are biased towards the charge storage region SD0 and/or drain region D by the electric field. In some embodiments, the mask opening may have a first end and a second end, with the first end being wider than the second end. For instance, the first end is shown spaced from the second end in a direction parallel to the electrical axis (e.g., from the photodetection region PD to the charge storage region SD0). The opening is shown wider, in a direction perpendicular to both the electrical axis and the optical axis, at the first end than at the second end. In one example, the opening may be at least 75% wider at the first end than at the second end. In another example, the opening may be at least 90% wider at the first end than at the second end. For instance, in the illustrative example of FIG. 2-1, the mask opening has a substantially triangular shape, with a base positioned at the first end and an apex corresponding to the base positioned at the second end. In some embodiments, at least a portion of pixel 2-112 may be manufactured by depositing the mask above and/or below a portion of the photodetection region and removing at least a portion of the mask to create the mask opening, such that the opening is wider at the first end of the photodetection region than at the second end.

FIG. 2-2 is a top view of example pixels 2-212a and 2-212b that may be positioned within an array of pixels of an integrated circuit, according to some embodiments. In some embodiments, pixels 2-212a and 2-212b may be configured in the manner described for pixel 1-112. As shown in FIG. 2-2, the charge storage and/or drain region(s) of pixel 2-212a are spaced from the photodetection region PD of pixel 2-212a in one direction, and the charge storage and/or drain region(s) of pixel 2-212b are spaced from the photodetection region PD of pixel 2-212b in an opposite direction. Also, the first (e.g., wider) end of the mask opening of each pixel faces the charge storage and/or drain region of the respective pixel, resulting in the first ends of the mask openings facing opposite directions. As a result, the potential gradients generated in the pixels may be oriented in opposite directions.

In some embodiments, pixel 2-212a may be positioned within a first row of the array, and pixel 2-212b may be positioned within a second row adjacent to the first row. In one example, the pixels of the first row may all have the charge storage and/or drain region orientation of pixel 2-212a, and the pixels of the second row may all have the charge storage and/or drain region orientation of pixel 2-212b. Likewise, in the above example, the pixels of the first row may all have the mask opening orientation of pixel 2-212a, and the pixels of the second row may all have the mask opening orientation of pixel 2-212b. The inventors recognized that having opposite pixel orientations in alternate rows of the pixels may reduce the effect of parasitic transfer/drain gate capacitances, thus facilitating faster operation (e.g., reduced propagation delay) during operation of the pixels.

FIG. 3-1 is a side view of an example pixel 3-112 having a collection region with one or more drain layers, according to some embodiments. In some embodiments, pixel 3-112 may be configured in the manner described for pixel 1-112 in connection with FIGS. 1-1 to 1-5A. As shown in FIG. 3-1, pixel 3-112 includes a photodetection region PD and drain layers configured to collect charge carriers generated in the photodetection region PD. For example, the drain layers illustrated in FIG. 2-1A include a collection layer and a protection layer. In some embodiments, the collection layer may have the same semiconductor doping type as the photodetection region PD. For instance, the photodetection region PD and collection layer may include n-type doped regions formed of and/or disposed on one or more lightly p-doped substrate layers of the pixel 3-112. The protection layer, shown disposed between the collection layer and the photodetection region PD, may have an opposite semiconductor doping type. For instance, the protection layer may be n-type doped. In one example, the photodetection region PD and collection layer may be formed by doping regions of the substrate layer(s) using phosphorous, and the protection layer may be formed by doping one or more regions of the substrate layer(s) using boron.

B. Techniques Incorporating One or More Drain Layers

FIG. 3-1 is a side view of an example pixel 3-112 having one or more drain layers, according to some embodiments. In some embodiments, pixel 3-112 may be configured in the manner described herein for pixel 1-112 and/or any other pixel described herein. As shown in FIG. 3-1, pixel 3-112 includes a photodetection region PPD and drain layers 3-120 configured to receive incident photons and/or charge carriers via the photodetection region PPD. As shown in FIG. 3-1, drain layers 3-120 are positioned after photodetection region PPD in the direction OPT in which photodetection region PPD is configured to receive incident photons. For example, incident photons and/or charge carriers generated therefrom may flow to drain layers 3-120 via photodetection region PPD (and/or along paths other than through photodetection region PPD).

In some embodiments, drain layers 3-120 may be configured to discard the received charge carriers and/or charge carriers generated in drain layers 3-120 in response to received incident photons. For example, drain layers 3-120 are shown in FIG. 3-1 including a protection layer 3-122 and a collection layer 3-124. In some embodiments, collection layer 3-124 may be configured to discard the received charge carriers and/or charge carriers generated in response to the incident photons. For example, collection layer 3-124 may be configured for coupling to a DC power supply voltage (e.g., a high voltage for discarding electrons or a low voltage for discarding holes). In some embodiments, collection layer 3-124 may be a doped semiconductor region having the same semiconductor doping type as photodetection region PPD. For instance, photodetection region PPD and collection layer 3-124 may include n-type doped regions formed of and/or disposed on one or more lightly p-doped substrate layers of pixel 3-112.

In some embodiments, drain layers 3-120 may be configured to block at least some charge carriers from leaving photodetection region PPD. For example, protection layer 3-122 may be configured to block at least some charge carriers from reaching collection layer 3-124 via photodetection region PPD. As shown in FIG. 3-1, protection layer 3-122 may be disposed between photodetection region PPD and collection layer 3-124 in the direction OPT. In some embodiments, protection layer 3-122 may be configured to form a potential barrier between photodetection region PPD and collection layer 3-124. For example, protection layer 3-122 may have an opposite semiconductor doping type from photodetection region PPD and/or collection layer 3-124. For instance, in the above example, the protection layer may be p-type doped. By blocking charge carriers from leaving photodetection region PPD, the charge carriers may be routed to drain region D or a charge storage region.

In some embodiments, drain layers 3-120 may be configured to block fluorescent emission photons from leaving photodetection region PPD and allow excitation photons to leave photodetection region PPD and reach collection layer 3-124. For example, fluorescent emission photons typically have lower energy than excitation photons and are more likely to remain in photodetection region PPD rather than pass through protection layer 3-122 and reach collection layer 3-124. In this example, excitation photons are more likely than fluorescent emission photons to pass through protection layer 3-122 and reach collection layer 3-124. Moreover, fluorescent charge carriers that reach collection layer 3-124 may, if not discarded, reach the charge storage regions via undesired paths and add noise to the collected charge. For example, the fluorescent charge carriers may have high enough energy that they would otherwise reach the charge storage regions too late to be accurately measured Thus, drain layers 3-124 may be configured to reduce the number of noise charge carriers that reach the charge storage regions, thereby increasing the rejection ratio of the pixel.

It should be appreciated that, in some embodiments, protection layer 3-122 may have a higher electrostatic potential than photodetection region PPD and/or collection layer 3-124, such as in p-channel embodiments of pixel 3-112.

In addition, pixel 3-112 is illustrated in FIG. 3-1 having a barrier BPW positioned between protection layer 3-122 and charge storage region SD0. For instance, in some embodiments, barrier BPW may be configured to block at least some noise charge carriers (e.g., traveling in the bulk substrate layer(s)) that reach charge storage region SD0. For example, following an excitation pulse, the bulk semiconductor region of pixel 3-112 between charge storage region SD0 and protection layer 3-122 may receive a large number of noise charge carriers that would otherwise reach charge storage region SD0 and add noise to the collected charge carriers therein. In some embodiments, barrier BPW may be formed using p-type doping, such as by boron implant. As also shown in FIG. 3-1, pixel 3-112 may include one or more additional barriers, such as Deep P-implant Isolation (DPI) barriers shown on each horizontal end of pixel 3-212, which may be configured to block charge carriers from traveling between adjacent pixels. As a result, photons incident on the pixel 3-112 at oblique angles may be similarly drained and prevented from reaching the charge storage region SD0.

III. Techniques for Mirroring Pixel Layouts

In some embodiments, pixel arrays can include similar or identical arrangements of the pixels across the rows and/or columns of the pixel array. For example, each pixel can be oriented the same as neighboring pixels, and each pixel can have individual pixel components disposed in similar positions as neighboring pixels. The inventors have discovered and appreciated that, in some embodiments, such arrangements can cause inefficiencies in the integrated circuit. For example, for such an arrangement, common components across the pixels are generally disposed a same distance from the components of neighboring pixels (e.g., a same distance along the row and/or column direction to components of neighboring pixels). As a result, separate conductive control lines may be needed to control component(s) of each pixel. This can, for example, require thin control lines in order to connect control lines to each individual pixel, which impact the resistance of the control lines. This can, additionally or alternatively, create capacitance between neighboring control lines since the control lines cannot be spaced further apart than at the individual pixel level.

The inventors have developed technical advances to pixel array arrangements. In some embodiments, integrated circuits can include pixels that are disposed in mirrored configurations. The mirrored configurations can be in the row and/or column direction. For example, instead of having similar or identical copies of pixels that are formed side-by-side along a pixel row of a pixel array, the inventors have appreciated that it can be desirable for some or all of the structure of neighboring pixels to be in mirrored configurations. For example, neighboring pixels can be flipped 180 degrees about a boundary between the neighboring pixels (e.g., based on the neighboring sides of the pixels along the row direction). As another example, instead of having similar or identical copies of pixels that are formed above-and-below each other along a column of a pixel array, the inventors have appreciated that it can be desirable for some or all of the structure of neighboring pixels in a column of a pixel array to be in mirrored configurations. As a further example, a pixel can be mirrored to neighboring pixels in both the row and column direction (e.g., to create a quad-share pixel).

In some embodiments, a first pixel is proximate a second pixel (e.g., along a row and/or column direction) in a mirrored configuration, such that (a) at least one component of the first pixel is proximate at least one component of the second pixel, (b) at least one component of the first pixel is opposite at least one component of the second pixel, or both.

In some embodiments, the proximate and/or opposite components of the first and second pixels are the same type of component. For example, the components can be any pixel component described herein, such as a charge storage region, a rejection region, a transfer gate, a transfer region, a drain gate, a drain region, optically-directive structures and/or barriers, and/or the like.

The inventors have discovered and appreciated that by using mirrored pixel configurations, in some embodiments the physical characteristics, electrical characteristics, and/or other aspects of the integrated circuit can be improved compared to non-mirrored configurations. For example, since components of neighboring mirrored pixels can be disposed closer than in non-mirrored configurations, conductive lines can be shared across a plurality of pixels (e.g., across multiple pixels in a pixel row) rather than needing to be dedicated to each pixel. Such configurations can provide conductive lines having low resistance and/or with low capacitance between adjacent lines. As another example, mirrored pixel arrangements can allow for different physical configurations of the conductive lines (e.g., such as conductive line structures with multiple layers, as described herein), which can provide low resistance in the conductive lines and/or low capacitance between adjacent lines. Low resistance and/or capacitance results in little to no skew during operation of the pixels, thereby providing high shutter efficiency.

In an illustrative example, a first pixel adjacent a second pixel (e.g., neighboring pixels in a pixel row or column) can be in a mirrored configuration. The first pixel and the second pixel each comprise a first side and a second side. For example, the first pixel and the second pixel can each have a left and right side (e.g., where left and right are specified based on a row direction of the pixels). Therefore, each pixel has a side proximate to the other pixel and a side opposite the other pixel. For example, the first pixel may be disposed to the left of the second pixel, such that the right side of the first pixel is proximate the left side of the second pixel. In some embodiments, proximate sides of the first and second pixels can include first and second components, respectively. For example, the first component of the first pixel can be disposed on the right side of the first pixel, and the second component of the second pixel can be disposed on the left side of the second pixel. In some embodiments, the first and second components can be on opposing sides of the first and second pixels. Continuing with the previous example, the first component of the first pixel can be disposed on the left side of the first pixel, and the second component of the second pixel can be disposed on the right side of the second pixel.

As another example, the first pixel and the second pixel can each have a top and bottom side (e.g., where top and bottom are specified based on a column direction of the pixels). Therefore, each pixel has a side proximate to the other pixel and a side opposite the other pixel. For example, the first pixel may be disposed above the second pixel, such that the bottom side of the first pixel is proximate the top side of the second pixel. In some embodiments, proximate sides of the first and second pixels can include first and second components, respectively. For example, the first component of the first pixel can be disposed on the bottom side of the first pixel, and the second component of the second pixel can be disposed on the top side of the second pixel. In some embodiments, the first and second components can be on opposing sides of the first and second pixels. Continuing with the previous example, the first component of the first pixel can be disposed on the top side of the first pixel, and the second component of the second pixel can be disposed on the bottom side of the second pixel.

Figures 1, 2, 3, 4:
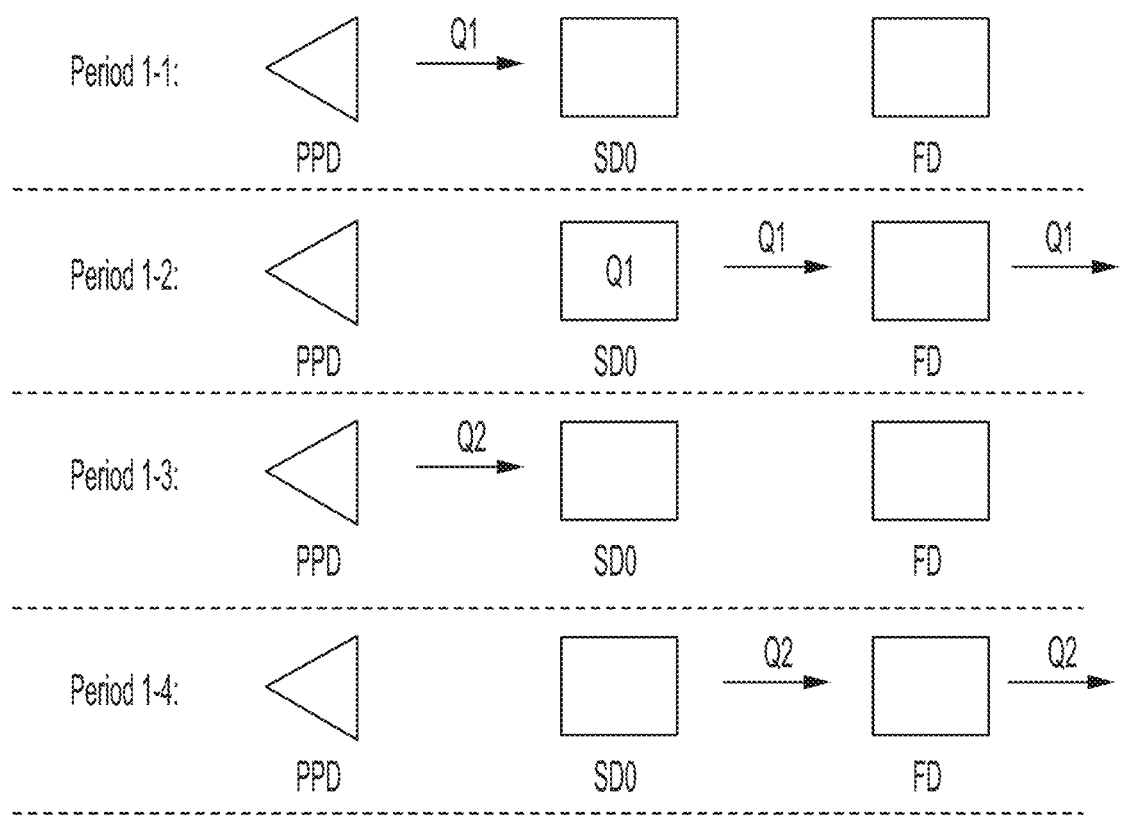

FIG. 4-1 is a top view of a portion of an example row of pixels 4-112, 4-114 and 4-116 in mirrored configurations 4-102 and 4-104, according to some embodiments. In the example of FIG. 4-1, pixels 4-112 to 4-116 each include similar components as those described in connection with pixel 2-112 in FIG. 2-1, including a photodetection region PD, a mask, at least one charge storage region SD0, and readout region FD. The mask has an opening configured to generate a potential gradient from the photodetection region PD to a charge transfer region (e.g., above or below the transfer gate ST0) electrically coupling the photodetection region PD to the charge storage region SD0. In addition, the pixels 4-112 to —116 are shown with a drain region D that is electrically coupled to PD by a drain channel region (e.g., above or below the drain gate REJ). The pixels 4-112 to 4-116 also include a source follower (SF) transfer gate that couples readout region FD to the transfer channel controlled by transfer gate RS.

As shown in FIG. 4-1, neighboring pixels are proximate each other in a mirrored configuration. For example, neighboring pixels 4-112 and 4-114 are proximate each other in a mirrored configuration 4-102, neighboring pixels 4-114 and 4-116 are proximate each other in a mirrored configuration 4-104, and so on. Each pixel 4-112 to 4-116 has a first side and a second side: pixel 4-112 has first side 4-112A and second side 4-112B, pixel 4-114 has first side 4-114A and second side 4-114B, and pixel 4-116 has first side 4-116A and second side 4-116B. For mirrored pixel configuration 4-102, the second side 4-112B of pixel 4-112 is proximate the first side 4-114A of pixel 4-114. For mirrored pixel configuration 4-104, the second side 4-114B of pixel 4-114 is proximate the first side 4-116A of pixel 4-116.

For each mirrored pixel configuration 4-102 and 4-104, some pixel components are on proximate sides and some pixel components are on opposite sides. For mirrored pixel configuration 4-102, the components of side 4-112B are proximate to the components of side 4-114A, while the components of side 4-112A are opposite to the components of side 4-114B. For mirrored pixel configuration 4-104, the components of side 4-114B are proximate to the components of side 4-116A, while the components of side 4-114A are opposite to the components of side 4-116B. In particular, for mirrored pixel configuration 4-102 the drain gates REJ (and the drain channel regions above or below the drain gates), the drain regions D, and the RS and SF transfer gates of pixels 4-112 and 4-114 are proximate each other, while the transfer gates ST0 (and the charge transfer region above or below the transfer gates), the charge storage regions SD0, and the readout regions FD are opposite each other. For mirrored pixel configuration 4-104, the drain gates REJ, the drain channel regions, the drain regions D, and the RS and SF transfer gates of pixels 4-114 and 4-116 are opposite each other, while the transfer gates "collect," the charge transfer regions, the charge storage regions SD0, and the readout regions FD are proximate each other.

In some embodiments, a single gate can span across multiple pixels. For example, drain gates of neighboring pixels can be connected to a shared physical piece of material (e.g., polysilicon material), so that a single drain gate spans two neighboring pixels. As another example, the reject gates of neighboring pixels can be connected to a shared physical piece of material, so that a single reject gate spans across two neighboring pixels. As a further example, the charge storage transfer gates (e.g., ST0) of neighboring pixels can be connected to a shared physical piece of material, so that a single charge storage transfer gate spans across two neighboring pixels. In some embodiments, the charge storage regions for the two adjacent pixels can be electrically isolated (e.g., by doping profile and/or STI design) but share the same gate polysilicon region. In some embodiments, multiple gates of neighboring pixels can span across the same pair of neighboring pixels (e.g., both the reject and charge storage transfer gates can span across two neighboring pixels). Advantageously, by using one or more gates that span across neighboring pixels, a single electrical contact can be used to connect gates of two pixels, which can reduce the capacitance compared to using separate gates to provide the same signal to each pixel.

Some components of the pixels 4-112 to 4-116 have portions across both sides of the pixel. For example, the photodetection region PD, mask, and mask opening of pixel 4-112 each have portions that are disposed on both sides 4-112A and 4-112B. Such components are mirrored in pixel pairs about the center of the pixels between the sides. For example, the portions of the photodetection region PD, mask, and mask opening on side 4-112B are proximate to the portions of the photodetection region PD, mask, and mask opening on side 4-114A. Similarly, the portions of the photodetection region PD, mask, and mask opening on side 4-112A are opposite to the portions of the photodetection region PD, mask, and mask opening on side 4-114B.

In some embodiments, pixels 4-112 to 4-116 may be included as a portion of an integrated circuit. For instance, in accordance with various embodiments, an integrated circuit may include a row of pixels (including pixels 4-112 to 4-116 among other pixels), and/or a two-dimensional array of pixels that extend across a number of rows and columns.

FIG. 4-2 is a CAD drawing of a portion of an example row of pixels 4-212, 4-214, 4-216 and 4-218 in mirrored configurations 4-202, 4-204, and 4-206, each comprising a potential-gradient inducing mask, according to some embodiments. In some embodiments, pixels 4-212 to 4-218 may be configured in the manner described for pixels 2-212a and/or 2-212b in connection with FIG. 2-2. As shown in FIG. 4-2, the pixels 4-212 to 4-218 are oriented in a same direction vertically such that the mask is at the top portion of each pixel. Also illustrated are barriers DPI, which may be configured to block charge carriers from flowing between adjacent pixels of a same row.

As shown in FIG. 4-2, neighboring pixels are proximate each other in a mirrored configuration. For example, neighboring pixels 4-212 and 4-214 are proximate each other in a mirrored configuration 4-202, neighboring pixels 4-214 and 4-216 are proximate each other in a mirrored configuration 4-204, neighboring pixels 4-216 and 4-218 are proximate each other in a mirrored configuration 4-206 and so on for other pixels in the row that are not shown in FIG. 4-2. In some embodiments, components of the pixels 4-212 to 218 can be opposite/adjacent each other in mirrored configurations as described in connection with FIG. 4-1.

FIG. 4-3 is a plan view of a portion of an example row of pixels 2-512 of FIGS. 1-5A and 1-5B in mirrored configurations 4-302, 4-304, and 4-306, according to some embodiments. FIG. 4-3 illustrates the positioning of storage regions SD0 and SD1 relative to photodetection region PPD for each pixel 4-312, 4-314, 4-316 and 4-318. Neighboring pixels 4-312 and 4-314 are proximate each other in a mirrored configuration 4-302, neighboring pixels 4-314 and 4-316 are proximate each other in a mirrored configuration 4-304, neighboring pixels 4-316 and 4-318 are proximate each other in a mirrored configuration 4-306, and so on for other pixels in the row not shown in FIG. 4-3.

Each pixel 4-312 to 4-318 has a first side and a second side: pixel 4-312 has first side 4-312A and second side 4-312B, pixel 4-314 has first side 4-314A and second side 4-314B, pixel 4-316 has first side 4-316A and second side 4-316C, and pixel 4-318 has first side 4-318A and second side 4-318B. For mirrored pixel configuration 4-302, the second side 4-312B of pixel 4-312 is proximate the first side 4-314A of pixel 4-314. For mirrored pixel configuration 4-304, the second side 4-314B of pixel 4-314 is proximate the first side 4-316A of pixel 4-316. For mirrored pixel configuration 4-306, the second side 4-316B of pixel 4-316 is proximate the first side 4-318A of pixel 4-318.

For each mirrored pixel configuration 4-302, 4-304, and 4-306, some pixel components are on proximate sides and some pixel components are on opposite sides. In particular, as shown by FIG. 4-3, for mirrored pixel configuration 4-302 the storage region SD1 of side 4-312B is proximate to storage region SD1 of side 4-314A, while the storage region SD0 of side 4-312A is opposite to the storage region SD0 of side 4-314B. For mirrored pixel configuration 4-304 the storage region SD0 of side 4-314B is proximate to storage region SD0 of side 316A, while the storage region SD1 of side 4-314A is opposite to the storage region SD1 of side 4-316B. For mirrored pixel configuration 4-306 the storage region SD1 of side 4-316B is proximate to storage region SD1 of side 4-318A, while the storage region SD0 of side 4-316A is opposite to the storage region SD0 of side 4-318B.

Figures 1, 2, 3, 4, 5, 5A:
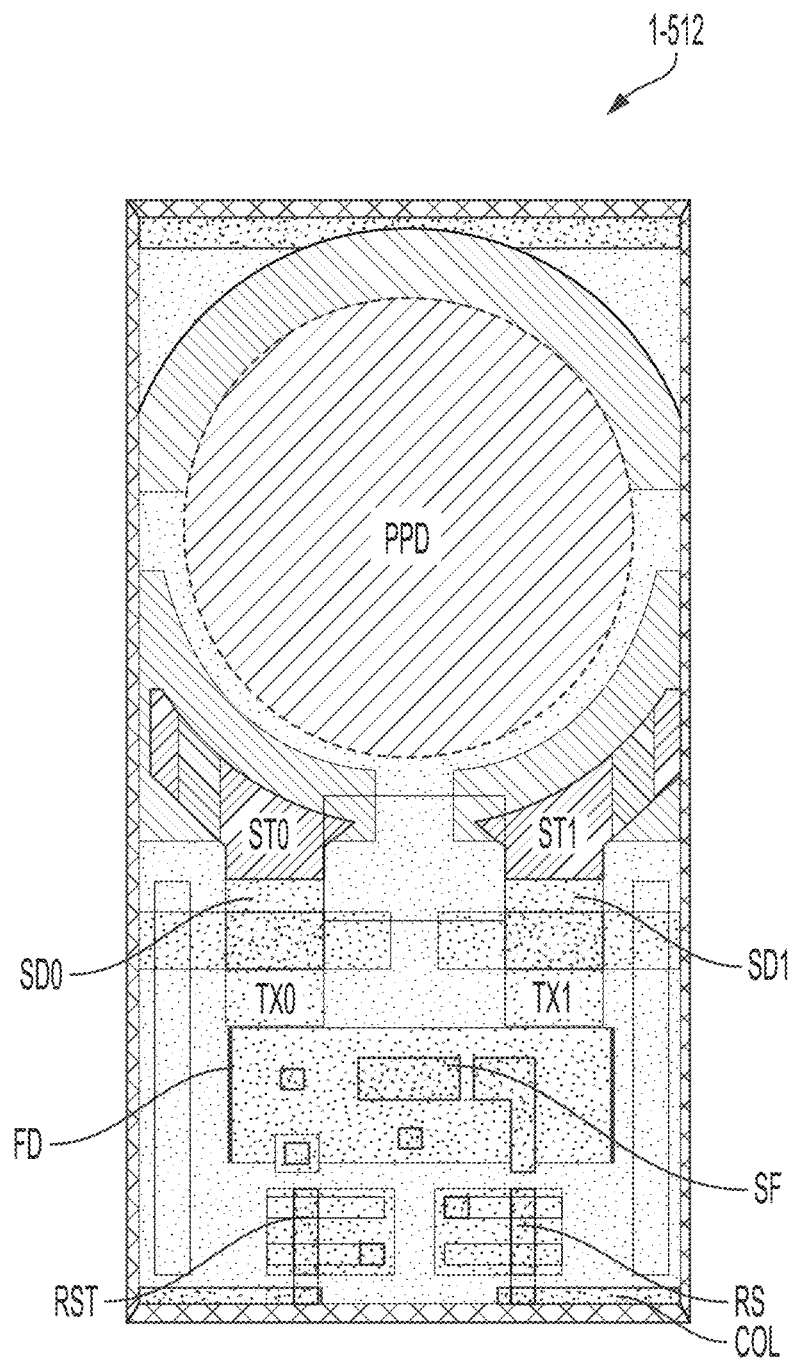
Figures 1, 2, 3, 4, 5, 5B:
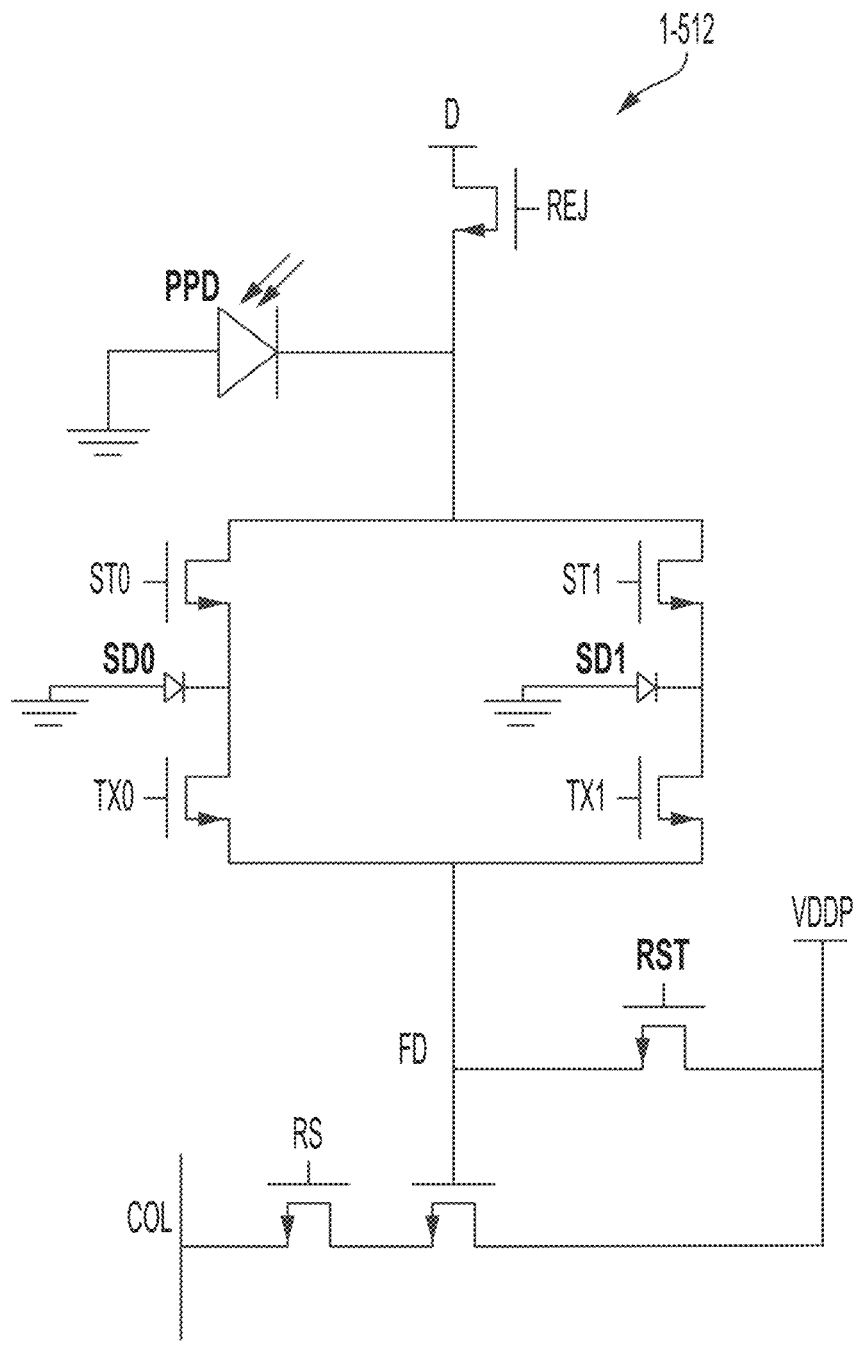

FIG. 4-4 is a circuit diagram of a first pair of the mirrored pixels 4-312 and 4-314 of FIG. 4-3, according to some embodiments. FIG. 4-5 is a circuit diagram of a second pair of the mirrored pixels 4-316 and 4-318 of FIG. 4-3, according to some embodiments.

As shown in FIG. 4-4, for mirrored pixels 4-312 and 4-314, components of side 4-312B are proximate to the components of side 4-314A, and components of side 4-312A are opposite to the components of side 4-314B. In particular, the drain gate REJ, storage region SD0, transfer gate ST1, transfer gate TX1, and other components (e.g., RT, RS, VDDP) of side 4-312B are proximate to the drain gate REJ, storage region SD0, transfer gate ST1, transfer gate TX1, and other components (e.g., RT, RS, VDDP) of side 4-314A. Likewise, the photodetection region PPD, storage region SD1, transfer gate ST0, transfer gate TX0, and other components (e.g., COL) of side 4-312A are opposite to the photodetection region PPD, storage region SD1, transfer gate ST0, transfer gate TX0, and other components (e.g., COL) of side 4-132D. Some components have portions on both sides of the pixels 4-312 and 4-314, such as the drain D and the readout region FD. Such aspects are mirrored between pixels 4-312 and 4-314 at the junction between the sides 4-312A and 4-312B of pixel 4-312 and sides 4-314A and 4-314B of pixel 4-314.

Similarly, as shown by FIG. 4-5, for mirrored pixels 4-316 and 4-318, components of side 4-316B are proximate to the components of side 4-318A, and components of side 4-316A are opposite to the components of side 4-318B. In particular, the photodetection region PPD, storage region SD1, transfer gate ST0, transfer gate TX0, and other components (e.g., COL) of side 4-316B are proximate to the photodetection region PPD, storage region SD1, transfer gate ST0, transfer gate TX0, and other components (e.g., COL) of side 4-318A. Likewise, the drain gate REJ, storage region SD0, transfer gate ST1, transfer gate TX1, and other components (e.g., RT, RS, VDDP) of side 4-316A are opposite to the drain gate REJ, storage region SD0, transfer gate ST1, transfer gate TX1, and other components (e.g., RT, RS, VDDP) of side 4-318B. As described in connection with FIG. 4-4, the drain D and the readout region FD have portions on both sides of the pixels 4-316 and 4-318, which are mirrored between pixels 4-316 and 4-318 at the junction between the sides 4-316A and 4-316B of pixel 4-316 and sides 4-318A and 4-318B of pixel 4-318.

Figures 1, 2, 3, 4, 5, 6:
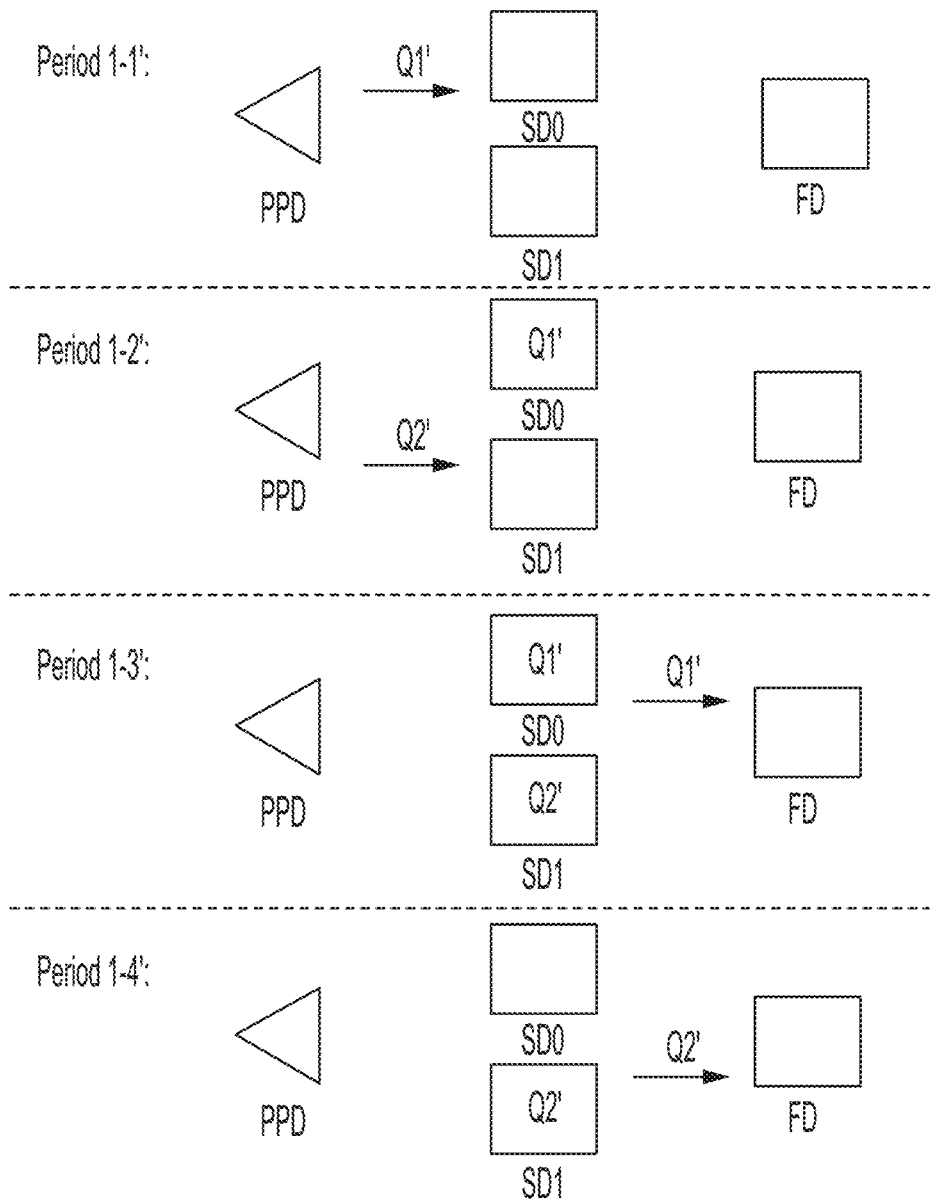
Figures 1, 2:
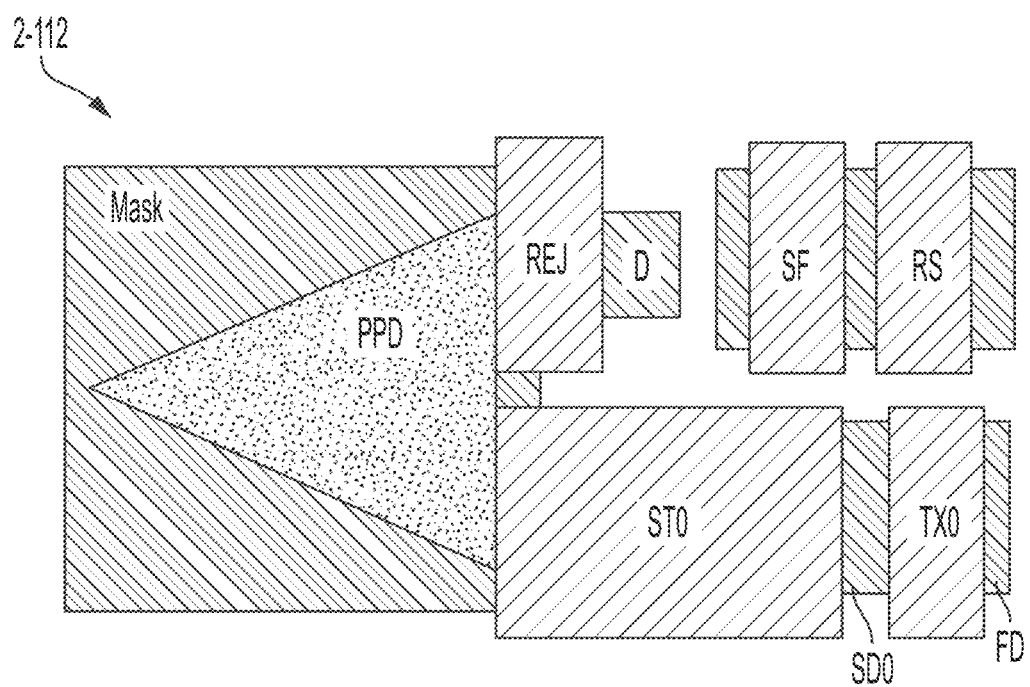
Figure 2:
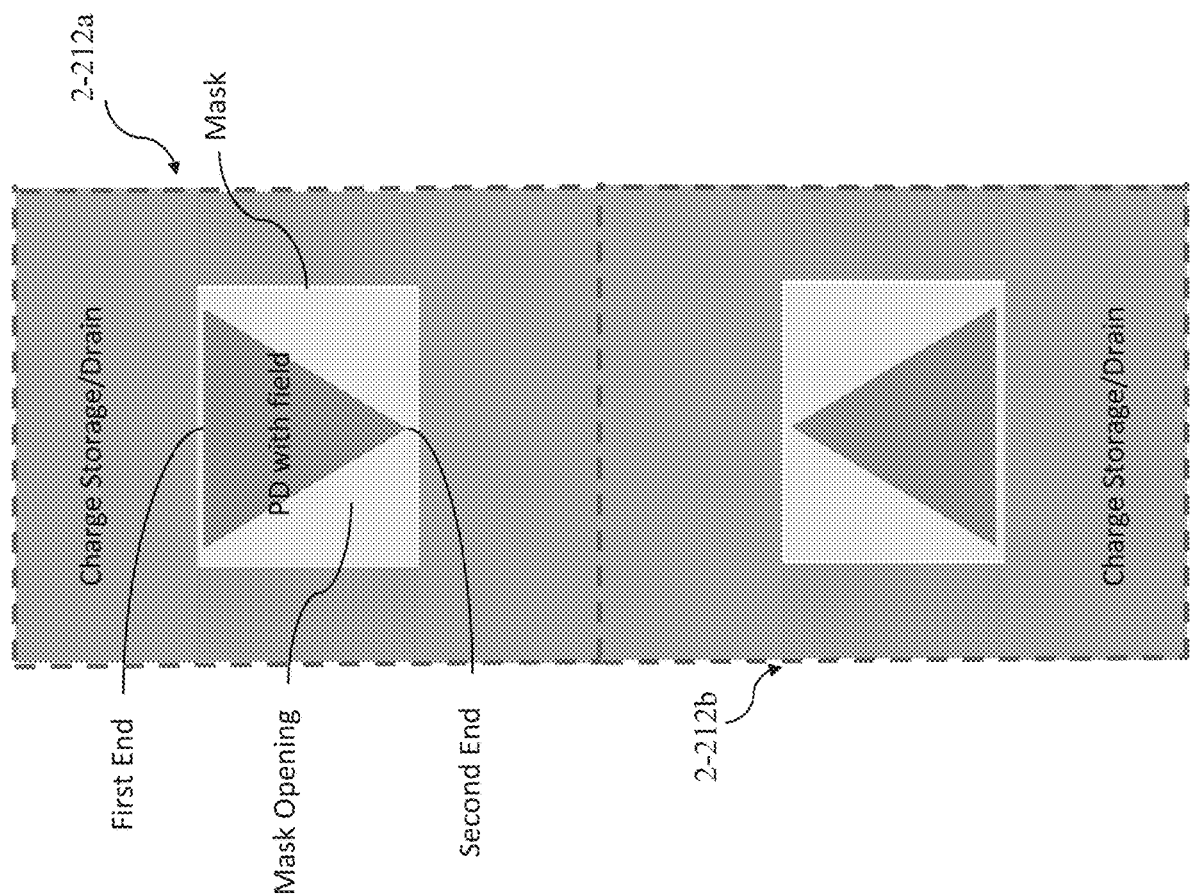
Figures 1, 3:
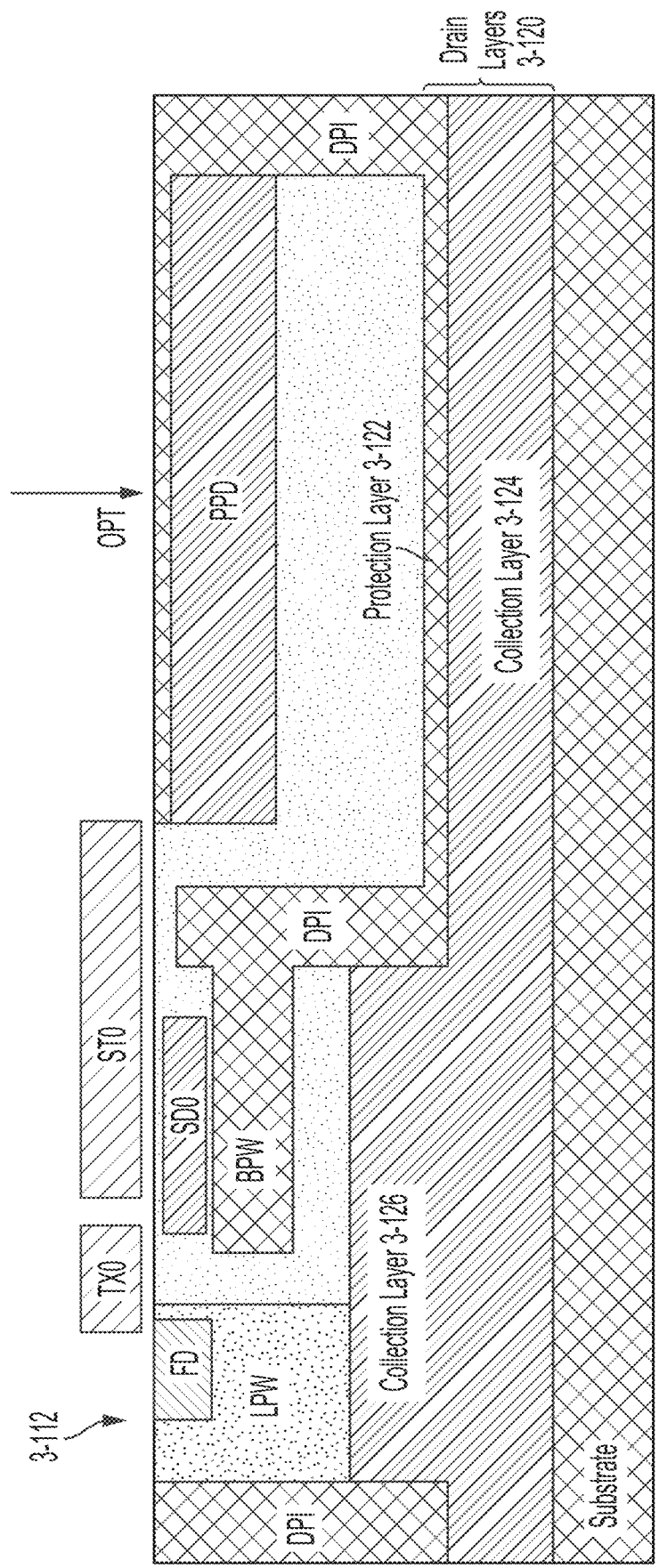

In some embodiments, mirrored pixels described herein may include more than one charge storage region. FIG. 4-6 is a top view of a portion of an example row of pixels 4-612, 4-614 and 4-616 that have multiple storage regions and are in mirrored configurations, according to some embodiments. Similar to pixels 4-112 to 4-116 of FIG. 4-1, pixels 4-140 include a photodetection region PD, a mask, storage region SD0. The pixels 4-612 to 4-618 also include a second storage region SD1. Storage regions SD0 and SD1 and readout region FD receive charge carriers along transfer channels controlled by transfer gates ST0, TX0, and TX1. The pixels 4-612 to 4-616 further include a drain region D such that transfer gate REJ can cause charge carriers to flow to drain region D, and also transfer gates RS and SF.

As shown in FIG. 4-6, neighboring pixels with multiple charge storage regions are proximate each other in a mirrored configuration. Neighboring pixels 4-612 and 4-614 are proximate each other in a mirrored configuration 4-602, neighboring pixels 4-614 and 4-616 are proximate each other in a mirrored configuration 4-604, and so on for other pixels in the row that are not shown in FIG. 4-6. Each pixel 4-612 to 616 has a first side and a second side: pixel 4-612 has first side 4-612A and second side 4-612B, pixel 4-614 has first side 4-614A and second side 4-614B, and pixel 4-616 has first side 4-616A and second side 4-616B. For mirrored pixel configuration 4-602, the second side 4-612B of pixel 4-612 is proximate the first side 4-614A of pixel 4-614. For mirrored pixel configuration 4-604, the second side 4-614B of pixel 4-140B is proximate the first side 4-616A of pixel 4-616.

For each mirrored pixel configuration 4-602 and 4-604, some pixel components are on proximate sides and some pixel components are on opposite sides. For mirrored pixel configuration 4-602, the components of side 4-612B are proximate to the components of side 4-614A, while the components of side 4-612A are opposite to the components of side 4-614B. For mirrored pixel configuration 4-604, the components of side 4-614B are proximate to the components of side 4-616A, while the components of side 4-614A are opposite to the components of side 4-616B. For mirrored pixel configuration 4-602, for example, the drain gates REJ (and the drain channel regions above or below the drain gates), the drain regions D, and the RS and SF transfer gates of pixels 4-612 and 4-614 are proximate each other, while the transfer gates ST0, TX0 and TX1 (and the charge transfer regions above or below the transfer gates), the charge storage regions SD0 and DS1, and the readout regions FD are opposite each other. For mirrored pixels 4-604, the drain gates REJ the drain channel regions, the drain regions D, and the RS and SF transfer gates of pixels 4-614 and 4-616 are opposite each other, while the transfer gates ST0, TX0 and TX1 (and the charge transfer regions above or below the transfer gates), the charge storage regions SD0 and DS1, and the readout regions FD are proximate each other.

Like the pixels 4-112 to 4-116 of FIG. 4-1, some components of the pixels 4-612 to 4-616 have portions that are disposed on both sides of the pixel. For example, the photodetection region PD, mask, and mask opening of pixel 4-612 have portions on both sides 4-612A and 4-612B. Such components are mirrored in pixel pairs about the center of the pixels between the sides. For example, the portions of the photodetection region PD, mask, and mask opening on side 4-612B are proximate to the portions of the photodetection region PD, mask, and mask opening on side 4-614A. Similarly, the portions of the photodetection region PD, mask, and mask opening on side 4-612A are opposite to the portions of the photodetection region PD, mask, and mask opening on side 4-614B.

FIG. 4-7 is a top schematic view of a portion of an example row of pixels 4-712, 4-714, 4-716, and 4-718 in mirrored configurations 4-702, 4-704, and 4-706, according to some embodiments. The row of pixels 4-712 to 4-718 may be configured in the same manner as described in connection with FIG. 4-6. For example, pixels 4-712 and 4-714 are proximate each other in mirrored configuration 4-702, pixels 4-714 and 4-716 are proximate each other in mirrored configuration 4-704, and pixels 4-716 and 4-718 are proximate each other in mirrored configuration 4-706. As shown in FIG. 4-7, contacts may be disposed over portions of pixels 4-712 to 4-718. In some embodiments, the contacts may be configured to block incident photons from reaching portions of pixels 4-712 to 4-718 other than photodetection region PPD and/or from reaching photodetection regions of neighboring pixels at oblique angles of incidence. For example, the contacts may be elongated in a direction parallel to the optical axis along which photodetection PPD is configured to receive incident photons. In some embodiments, the contacts may be formed using an opaque material such as tungsten. Such contacts can prevent many or all incident photons from reaching charge storage regions SD0 and SD1 along optical paths other than the optical axis, thereby preventing the incident photons from generating noise charge carriers in charge storage regions SD0 and SD1.

In FIG. 4-7, a pair of contacts is disposed on opposite sides of photodetection region PPD, with a first contact of the pair disposed closer to the apex of the triangular opening of the mask and a second contact of the pair disposed closer to the base of the triangular opening of the mask. The second contact may be configured to block incident photons from reaching charge storage regions SD0 and SD1. A third contact is disposed at an end of pixels 4-712 to 718 opposite the end at which photodetection region PPD is disposed. The first and third contacts are disposed between the pixels 4-140 and respective neighboring pixels, and the second contact is positioned between photodetection region PPD and transfer gates ST0 and REJ. It should be appreciated that, in some embodiments, the pair of contacts on opposite sides of photodetection region PPD may be replaced with at least one contact wall that at least partially surrounds photodetection region PPD, such as a single cylindrical contact wall. Alternatively or additionally, in some embodiments, a single contact may span multiple pixels disposed in the same row to provide optical rejection for the multiple pixels.

It should be appreciated that various embodiments of pixels described herein may include various combinations of charge storage region(s), drain regions, control signal configurations, optically-directive structures, barriers, and/or other components. Therefore, the pixel mirroring techniques described herein are not limited to any particular pixel structure, which are provided herein for example purposes only. Further, not all pixels in a pixel array need to be in mirrored configurations, and therefore only a subset of pixels in a pixel array may be in mirrored configurations. Pixels can be mirrored along any direction with respect to the pixel array, including vertically, horizontally, diagonally, and/or the like.

IV. Additional Example Mirrored Pixel Structures

In the foregoing examples, integrated device 1-102 is shown in a configuration that receives incident photons in a direction in which photodetection region PPD, charge storage region(s), and readout region FD are spaced from transfer gates REJ, ST0, and TX0. In some embodiments, integrated device 1-102 can have a front-side illuminated (FSI) configuration.

Some aspects of the present disclosure relate to structures configured to receive incident photons in other directions and/or including multiple sequentially-coupled charge storage regions, as described herein for integrated device 1-102. For instance, the inventors recognized that an integrated device having transfer gates and/or conductive lines spaced from the photodetection region, charge storage regions, and/or readout region may have improved optical and electrical characteristics. As one example, the optical characteristics of the conductive lines may have little to no impact on the incident photons when the conductive lines are not positioned in or proximate the path of incident photons. In this example, the conductive lines may be adapted for desirable electrical characteristics (e.g., low resistance and/or capacitance) without undesirably impacting the optical characteristics of the integrated device.

FIG. 5-1 is a cross-sectional schematic of an alternative example integrated device 5-102 illustrating a row of pixels 5-112, according to some embodiments.

In some embodiments, integrated device 5-102 can be configured in the manner described herein for integrated device 1-102. For example, as shown in FIG. 5-1, integrated device 5-102 can include a coupling region 5-201 including one or more grating couplers 5-216, a routing region 5-202 including one or more waveguides 5-220, and a pixel region 5-203 including one or more pixels 5-112. An exemplary pixel 5-112 is indicated by a dotted box in FIG. 5-1 including a sample well 5-108 and a photodetector 5-110. Also shown in FIG. 5-1, integrated device 5-102 can include one or more photonic structures 5-230 positioned between sample wells 5-108 and photodetectors 5-110.

As shown in FIG. 5-1, integrated device 5-102 is shown configured to receive incident photons at a first side, and metal layers 5-240 are positioned on a second side of integrated device 5-102 that is opposite the first side in the direction in which integrated device 5-102 is configured to receive incident photons. In some embodiments, integrated device 5-102 can have a backside-illuminated (BSI) configuration. In some embodiments, integrated device 5-102 may have a plurality of layers spanning one or more wafers (e.g., a wafer stack) configured in the manner described further herein for integrated device 7-100 including in connection with FIG. 7-1. For example, FIG. 5-1 may show a portion of a photodetection wafer that may be bonded (e.g., hybrid-bonded) to a logic wafer.

FIG. 5-2 is a cross-sectional view of an example pixel 5-112 of integrated device 5-102, according to some embodiments. In some embodiments, pixel 5-112 may be configured in the manner described herein for pixel 1-112 and/or any other pixel described herein. For example, as shown in FIG. 5-2, pixel 5-112 can include photodetection region PPD, charge storage region SD, readout region FD, drain region D, and transfer gates ST0, TX0, and REJ. It should be appreciated that pixel 5-112 can include any number of charge storage regions.

As shown in FIG. 5-2, transfer gates ST0, TX0, and REJ can be spaced from photodetection region PPD, charge storage region SD0, readout region FD, and drain region D in the direction Dir1 in which photodetection region PPD is configured to receive incident photons. Also shown in FIG. 5-2, metal layers 5-240 can be spaced from photodetection region PPD, charge storage region SD0, readout region FD, and drain region D, as well as transfer gates ST0, TX0, and REJ in the direction Dir1.

In FIG. 5-2, charge storage region SD0 is spaced from photodetection region PPD in a second direction perpendicular to the direction Dir1. Also shown in FIG. 5-2, transfer gate ST0 is spaced from photodetection region PPD in the second direction and transfer gate TX0 is spaced from transfer gate ST0 in the second direction. In some embodiments, readout region FD can be spaced from charge storage region SD0 in the second direction. Alternatively or additionally, in some embodiments, readout region FD can be spaced from charge storage region SD0 in a third direction different from the second direction and/or transfer gate TX0 can be spaced from transfer gate ST0 in the third direction.

In some embodiments, pixel 5-112 can include one or more charged and/or biased (C/B) regions positioned alongside photodetection region PPD. For example, the C/B regions can include one or more charge layers (e.g., metal-oxide compounds such as aluminum-oxide) within an oxide layer (e.g., silicon dioxide) that intrinsically deplete photodetection region PPD of charge carriers. Alternatively or additionally, the C/B regions can include a conductive material (e.g., metal) configured for coupling to a bias voltage (e.g., supplied by a power supply) to deplete photodetection region PPD of charge carriers when the bias voltage is applied to the C/B regions. The inventors have recognized that C/B regions can increase the rate at which charge carriers generated in photodetection region PPD flow to drain region D and/or charge storage regions SD0 and SD1. In some embodiments, C/B regions can be positioned on each side of photodetection region PPD except the side at which photodetection region PPD is configured to receive incident photons.

FIG. 5-3 is a cross-sectional view of an alternative example pixel 5-312 that may be included in integrated device 5-102, according to some embodiments. In some embodiments, pixel 5-312 may be configured in the manner described herein for pixel 5-112 and/or any other pixel described herein. For example, as shown in FIG. 5-3, pixel 5-312 can include barriers BPW and LPW positioned to block charge carriers from reaching charge storage region SD0 and readout region FD.

As shown in FIG. 5-3, photodetection region PPD can include first and second sub-regions PPD-0 and PPD-1 separated in the direction Dir1 in which photodetection region PPD is configured to receive incident photons. In some embodiments, the C/B regions of pixel 5-312 can be configured to deplete first sub-region PPD-0 of charge carriers. In some embodiments, charge carriers in second sub-region PPD-1 can be depleted when transfer gate REJ is biased to cause the charge carriers to flow to drain region D and/or when transfer gate ST0 is biased to cause the charge carriers to flow to charge storage region SD0. In some embodiments, first sub-region PPD-0 can have a higher dopant concentration than second sub-region PPD-1 to further increase the rate at which charge carriers flow in the direction Dir1.

Also shown in FIG. 5-3, pixel 5-312 can include barriers DPI disposed around the C/B regions and/or between the C/B regions and photodetection region PPD. For example, barriers DPI can be configured to block charge carriers from flowing between adjacent pixels 5-312 and/or to provide charge isolation around the C/B regions. Also shown in FIG. 5-3, a metal shield can be disposed over at least a portion of pixel 5-312 to block at least some photons from reaching charge storage regions SD0 and readout region FD of pixel 5-312. Also shown in FIG. 5-3, the metal shield can include an opening for incident photons to reach photodetection region PPD. As shown in FIG. 5-3, the metal shield can be offset from a surface of pixel 5-512 (e.g., of photodetection region PPD) in the direction Dir1 by a gap, such as 100 nanometers (nm) or less.

FIG. 5-4 is a layout sketch of an example pixel 5-412 having discontinuous C/B regions that may be included in integrated device 5-102, according to some embodiments. Pixel 5-412 may be configured in the manner described herein for pixel 5-312 and/or any other pixel described herein. As shown in FIG. 5-4, pixel 5-412 further includes an auxiliary gate REJ' coupled to drain region D. In some embodiments, auxiliary gate REJ' may be part of a diode-connected transistor connected between drain region D and a metal line configured to electrically couple drain region D to a power supply voltage. It should be appreciated that other pixels described herein may additionally include auxiliary gate REJ'.

As shown in FIG. 5-4, some C/B regions of pixel 5-412 are discontinuous. For example, shown in FIG. 5-4, regions $C/B_1$ and $C/B_2$ of pixel 5-412 running parallel to the direction from photodetection region PPD to charge storage region SD0 are discontinuous and the regions $C/B_4$ and $C/B_5$ running perpendicular to the direction of regions $C/B_1$ and $C/B_1$ are continuous, with gaps separating regions $C/B_1$ and $C/B_2$ from regions $C/B_4$ and $C/B_5$. It should be appreciated that other pixels described herein may have discontinuous C/B regions as described herein for pixel 5-412.

Also shown in FIG. 5-4, pixel 5-412 region $C/B_3$ is positioned between photodetection region and charge storage region SD0 and terminates before drain region D. In some embodiments, region $C/B_3$ of other pixels described herein may be configured as shown in FIG. 5-4 for pixel 5-4. In some embodiments, region $C/B_3$ may be omitted, such as shown in FIG. 5-6.

FIG. 5-5 is a layout sketch of a plurality of pixels 5-412, 5-414, 5-416, and 5-418 in a mirrored configuration, according to some embodiments. In some embodiments, pixels 5-414, 5-416, and 5-418 may be configured in the manner described herein for pixel 5-412.

As shown in FIG. 5-5, neighboring pixels are proximate each other in a mirrored configuration in two directions. For example, neighboring pixels 5-412 and 5-414 are proximate each other in a mirrored configuration 5-402 in a first direction, and neighboring pixels 5-412 and 5-416 are proximate each other in a mirrored configuration 5-404 in a second direction. Similarly, neighboring pixels 5-416 and 5-418 are proximate each other in a mirrored configuration 5-406 in the first direction, and neighboring pixels 5-414 and 5-418 are proximate each other in a mirrored configuration 5-408 in the second direction. In the example of FIG. 5-5, each of pixels 5-412 to 5-418 can be split in the first direction between first and second sides, and can be similarly split in the second direction between third and fourth sides (each overlapping in part with the first and second sides). For instance, the second side of pixel 5-412 is proximate the first side of pixel 5-414 in the first direction, and the fourth side of pixel 5-412 is proximate the third side of pixel 5-416 in the second direction. Similarly, the second side of pixel 5-416 is proximate the first side of pixel 5-418 in the first direction, and the fourth side of pixel 5-414 is proximate the third side of pixel 5-418 in the second direction.

For each mirrored pixel configuration 5-402 to 5-408, some pixel components are on proximate sides and some pixel components are on opposite sides. For mirrored pixel configuration 5-402, the components of the second side of pixel 5-412 (e.g., gates ST0 and RST) are proximate to like components of the first side of pixel 5-414, while the components of the first side of pixel 5-412 (e.g., gates REJ and RS) are opposite to like components of the second side of pixel 5-414. For mirrored pixel configuration 5-404, the components of the fourth side of pixel 5-412 (e.g., gates RS and SF) are proximate to like components of the third side of pixel 5-416, while the components of the third side of pixel 5-412 (e.g., regions PPD and C/B$_4$) are opposite to like components of the fourth side of pixel 5-416. Although not shown in FIG. 5-5, it should be appreciated that the configuration of pixels 5-412 to 5-418 may be repeated in columns and/or rows of an array. For example, regions C/B$_2$ may be shared among multiple pixels in a row in the first direction and/or region C/B$_4$ may be shared among multiple pixels in a column in the second direction.

FIG. 5-6 is a layout sketch of an example pixel 5-612 having multiple charge storage regions SD0 and SD1 that may be included in integrated device 5-102, according to some embodiments. In some embodiments, pixel 5-612 may be configured in the manner described herein for pixel 5-412 and/or any other pixel described herein. As shown in FIG. 5-6, charge storage region SD1 may have multiple sub-regions SD1-0 and SD1-1. For example, in some embodiments sub-regions SD1-0 and SD1-1 may have different intrinsic electric potential levels, such as due to sub-region SD1-1 having a high dopant concentration than sub-region SD1-0. The inventors recognized that such a configuration can increase the rate of charge transfer between charge storage region SD1 and readout region FD.

FIG. 5-7A is a layout sketch of a plurality of pixels 5-712, 5-714, 5-716, and 5-718 having multiple charge storage regions in a mirrored configuration that may be included in integrated device 5-102, according to some embodiments. FIG. 5-7B is a layout sketch illustrating the positioning of a metal shield over portions of pixels 5-712, 5-714, 5-716, and 5-718, according to some embodiments. In some embodiments, pixels 5-712 to 5-718 may be configured in the manner described herein for pixel 5-612, for example including multiple sequentially-coupled charge storage regions.

As shown in FIGS. 5-7A and 5-7B, pixels 5-712 to 5-718 are in a mirrored configuration in two directions, such as described herein for pixels 5-412 to 5-418. For example, pixels 5-712 and 5-714 are in a mirrored configuration 5-702 in a first direction and pixels 5-716 and 5-718 are in a mirrored configuration 5-704 in a second direction. Similarly, pixels 5-716 and 5-718 are in a mirrored configuration 5-706 in the first direction and pixels 5-714 and 5-718 are in a mirrored configuration 5-708 in the second direction.

As shown in FIG. 5-7B, a single region C/B$_3$ may extend across multiple pixels 5-712 and 5-714 and/or 5-716 and 5-718. For example, region C/B$_2$ may be discontinuous, split between regions C/B$_{21}$ and C/B$_{22}$. Similarly, region C/B$_1$ may be discontinuous, split between region C/B$_{11}$ and C/B$_{12}$.

Also shown in FIG. 5-7B, a metal shield may be positioned to block light from reaching at least some components of pixels 5-712 to 5-718. For example, the metal shield may be positioned to block light from reaching charge storage regions SD0 and SD1. Due to the mirrored configurations 5-704 and 5-708 positioning photodetection regions PPD opposite one another, the metal shield may continuously cover regions of pixels 5-712 to 5-718. In some embodiments, continuous coverage of pixels 5-712 to 5-718 from the metal shield may improve the light shielding efficiency of the arrangement as compared to having a larger number of discontinuous shield portions. Also shown in FIG. 5-7B, the metal shield may be positioned around photodetection regions PPD to block light from reaching the surrounding C/B regions. The metal shield is shown having apertures sized and positioned to allow light to reach photodetection regions PPD.

Figures 1, 4:
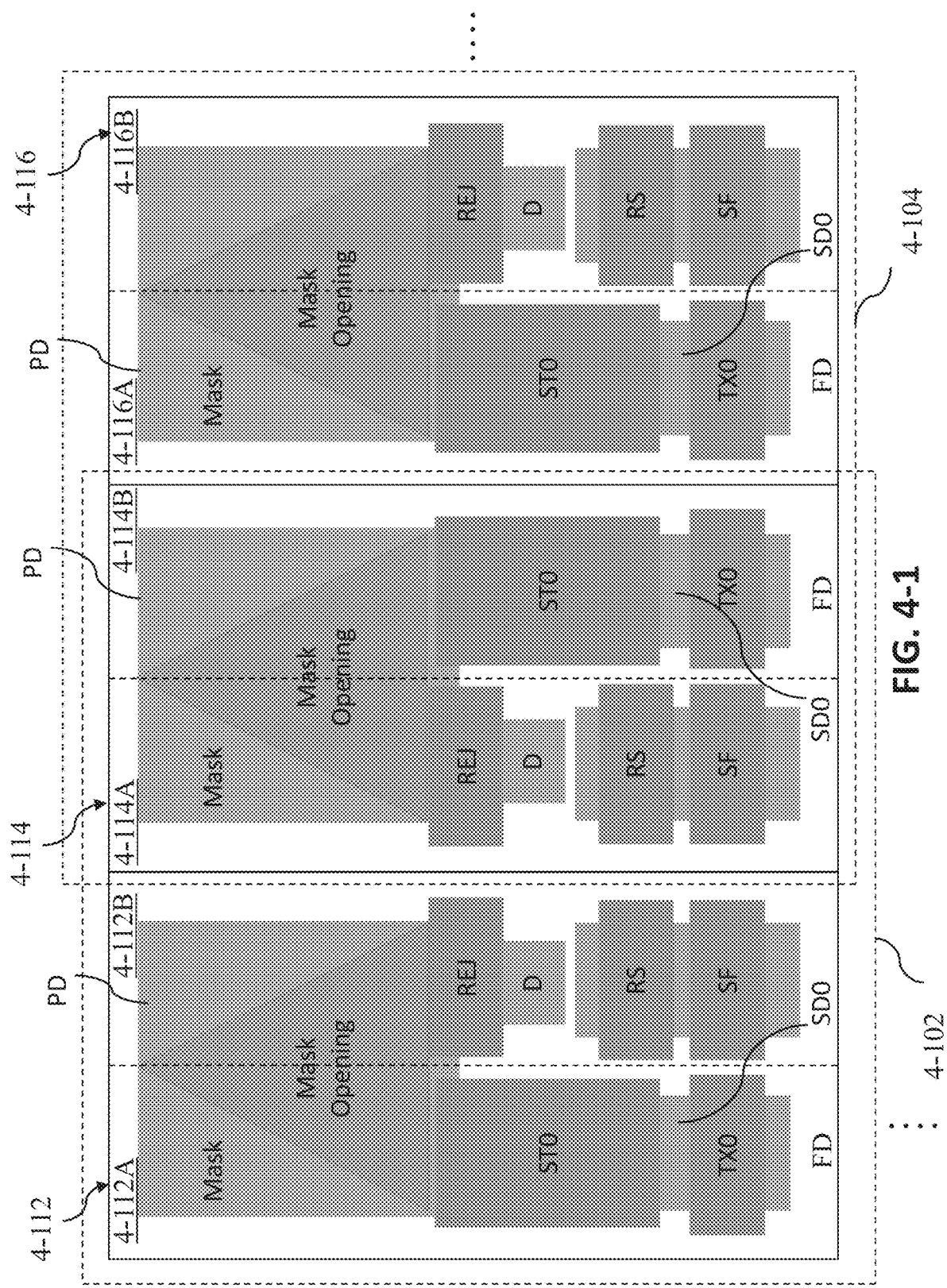
Figures 2, 4:
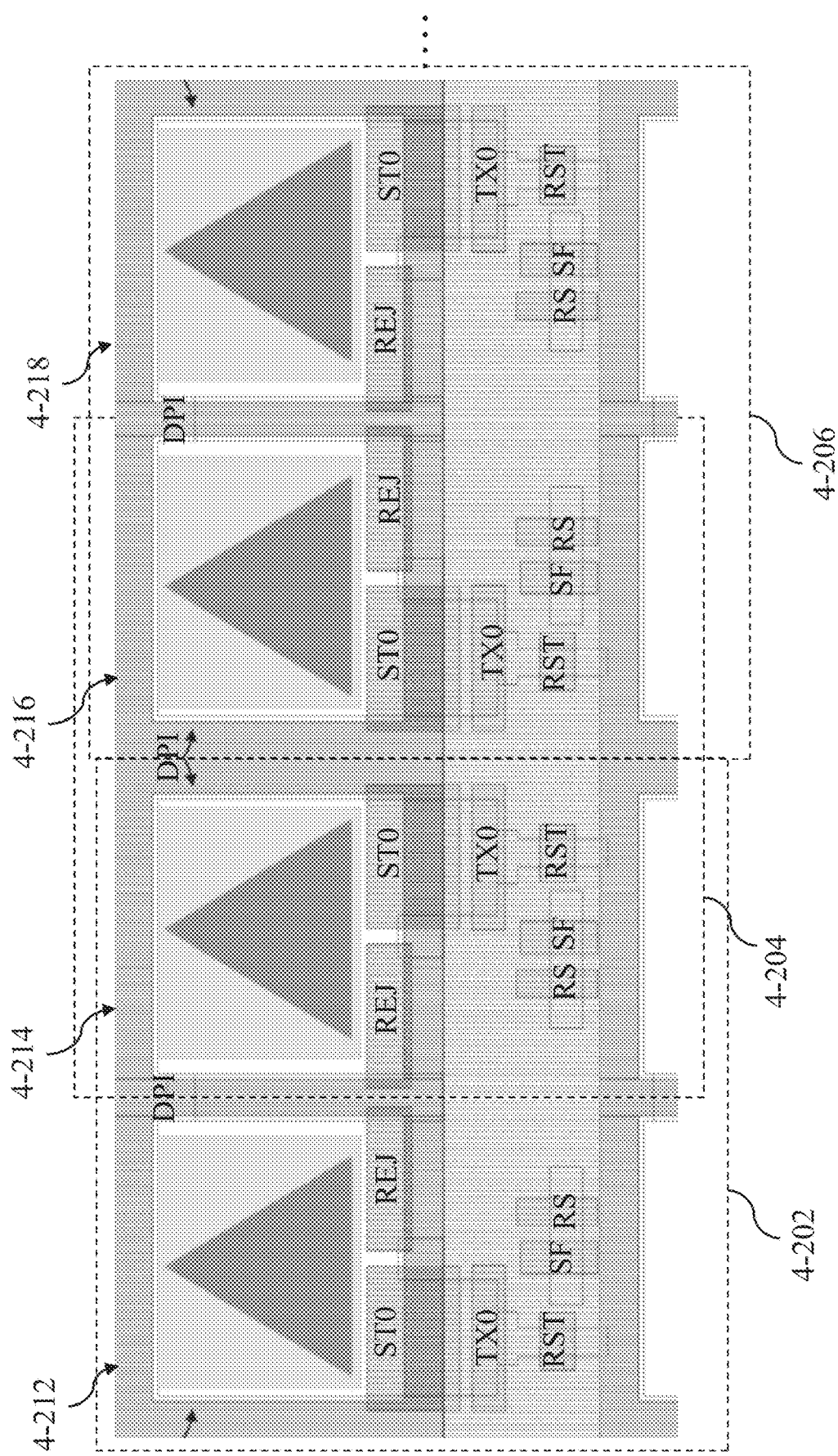
Figures 3, 4:
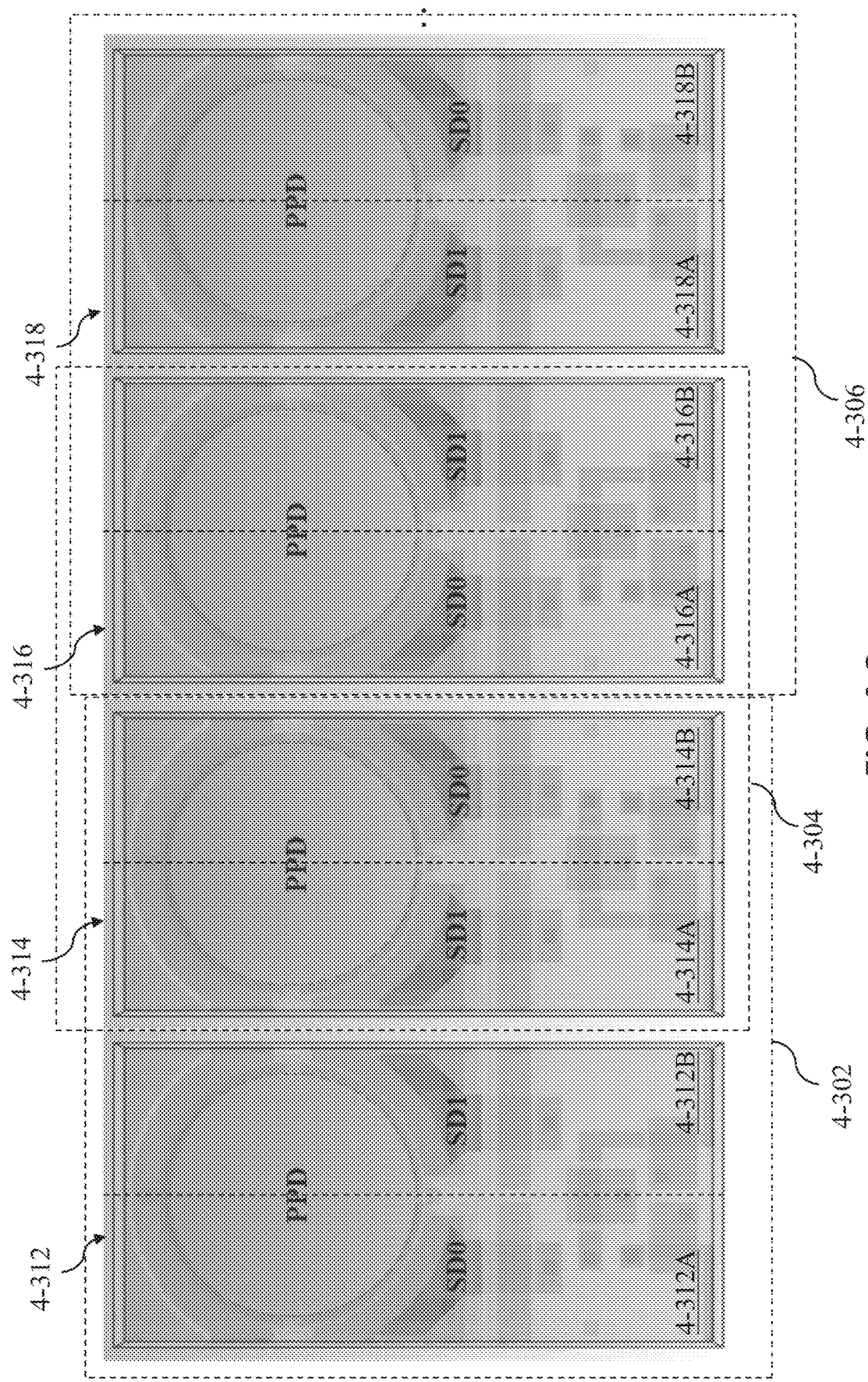
Figure 4:
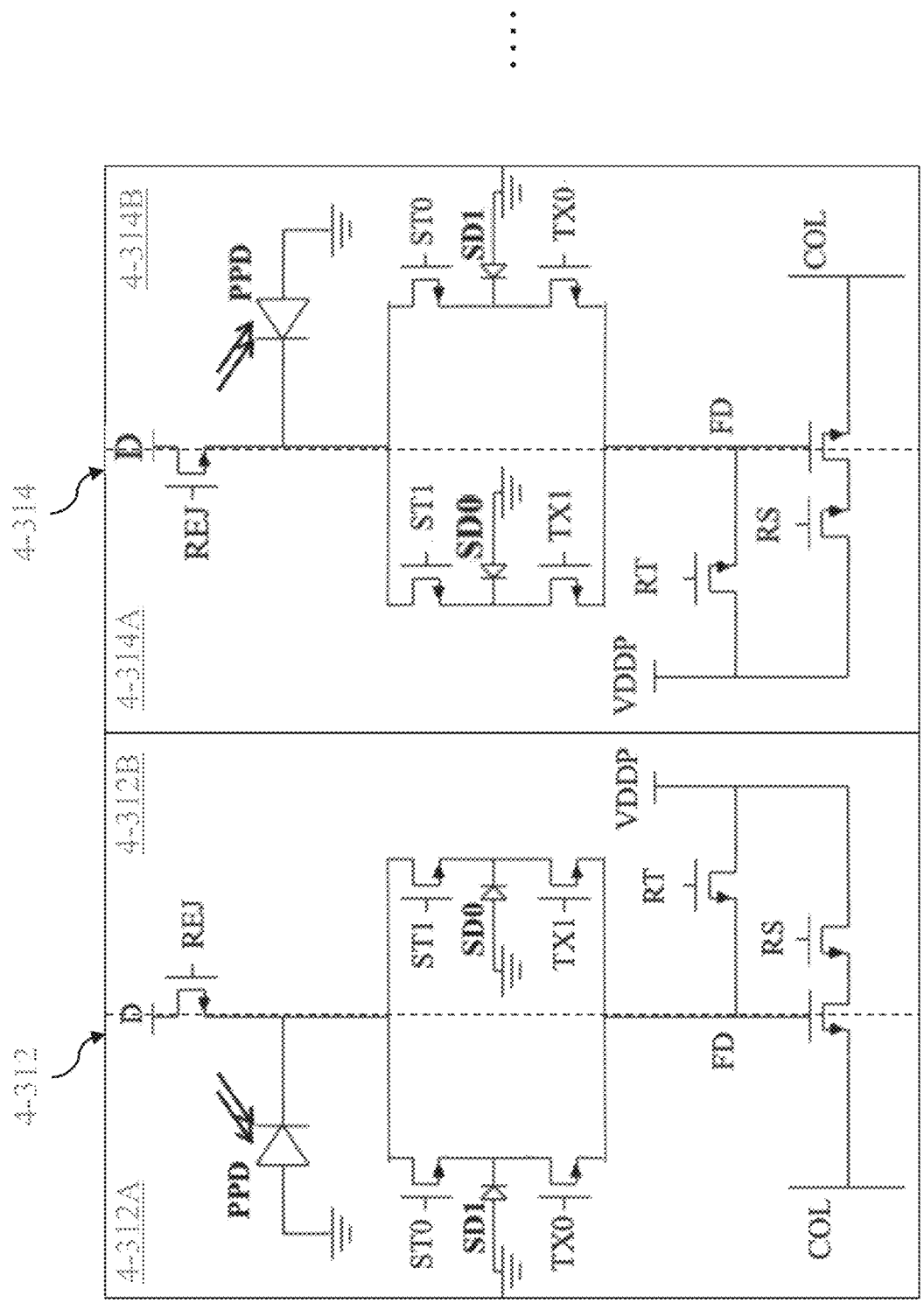
Figures 4, 5:
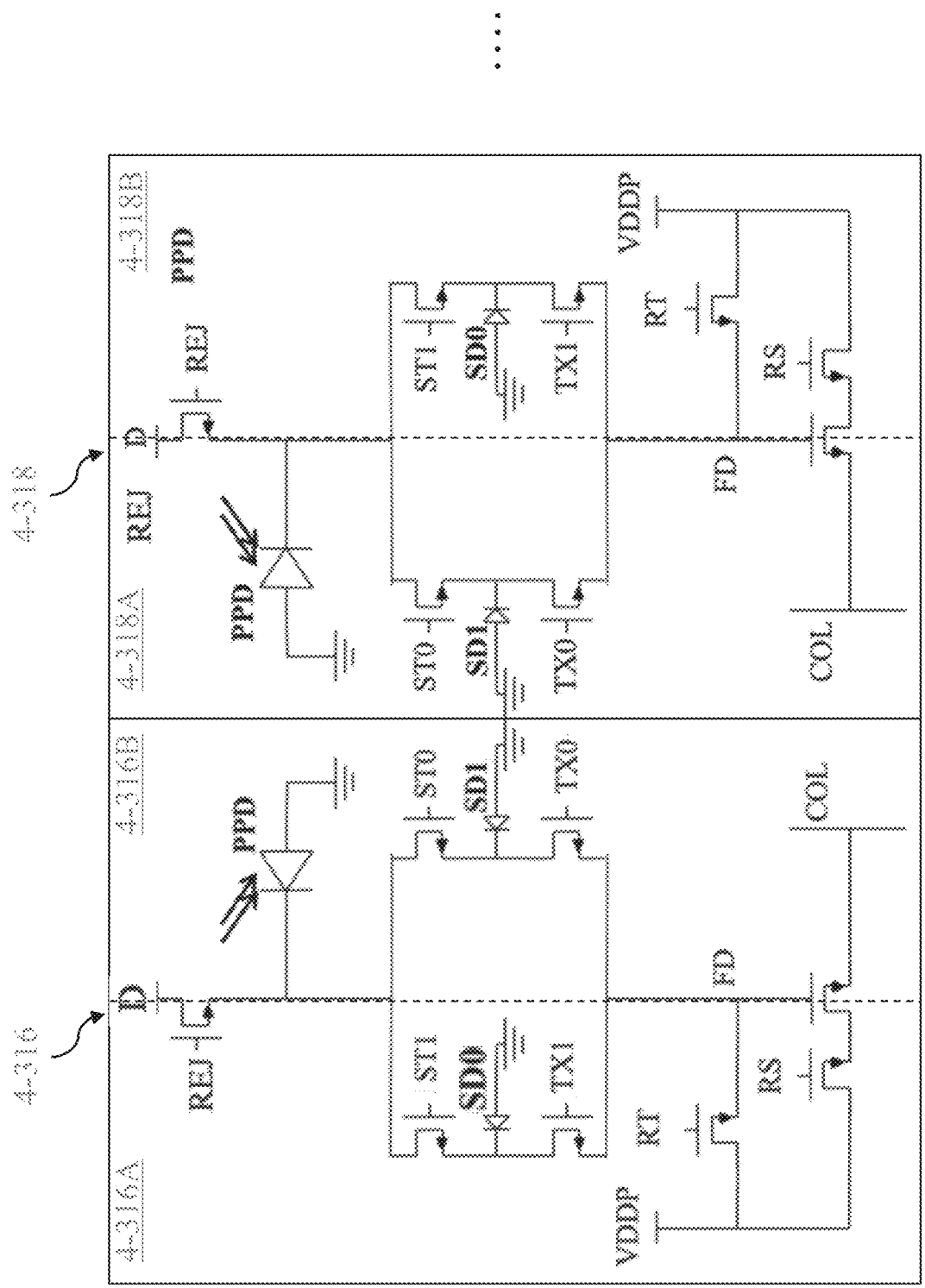
Figures 4, 5, 6:
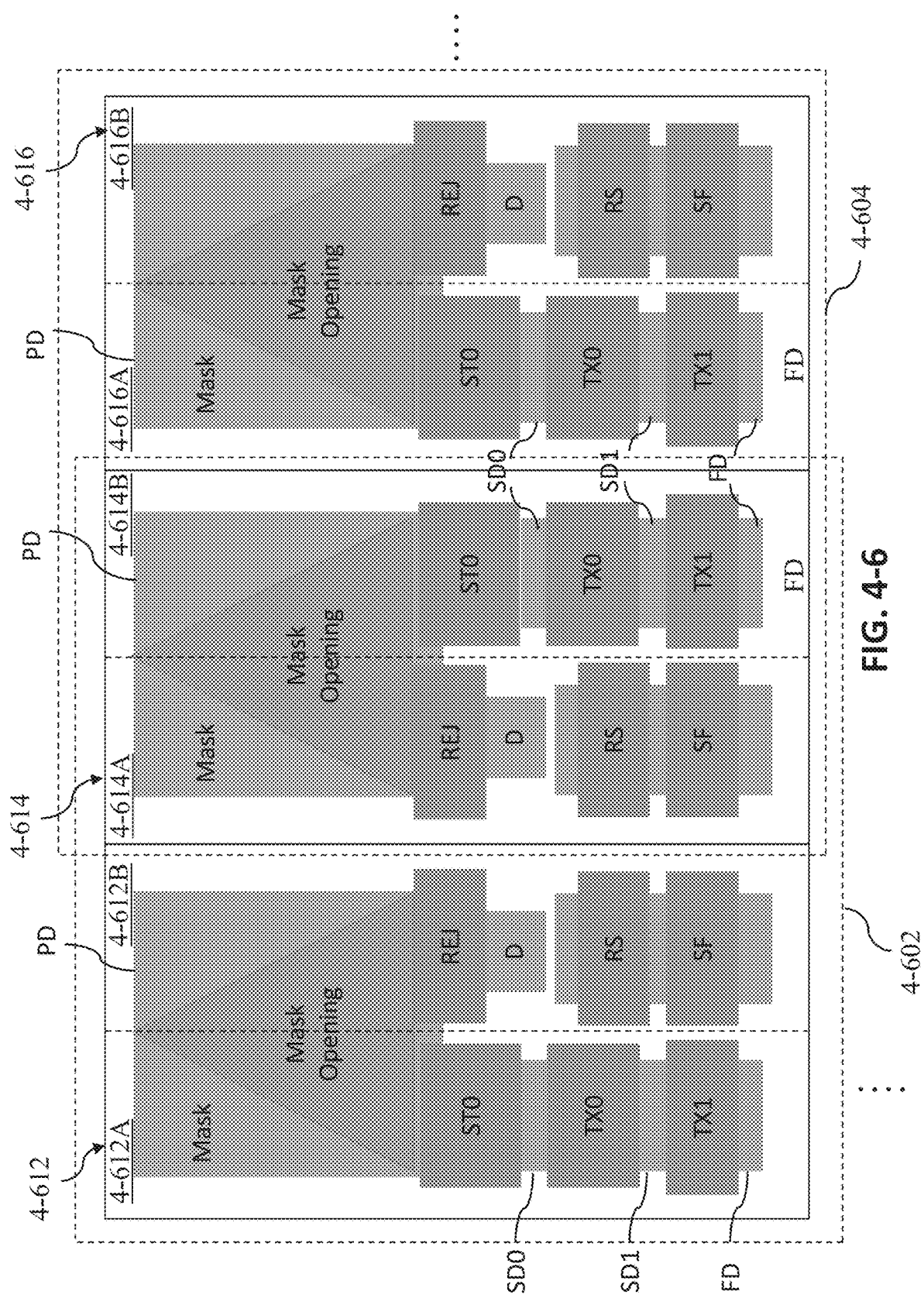
Figures 4, 5, 6, 7:
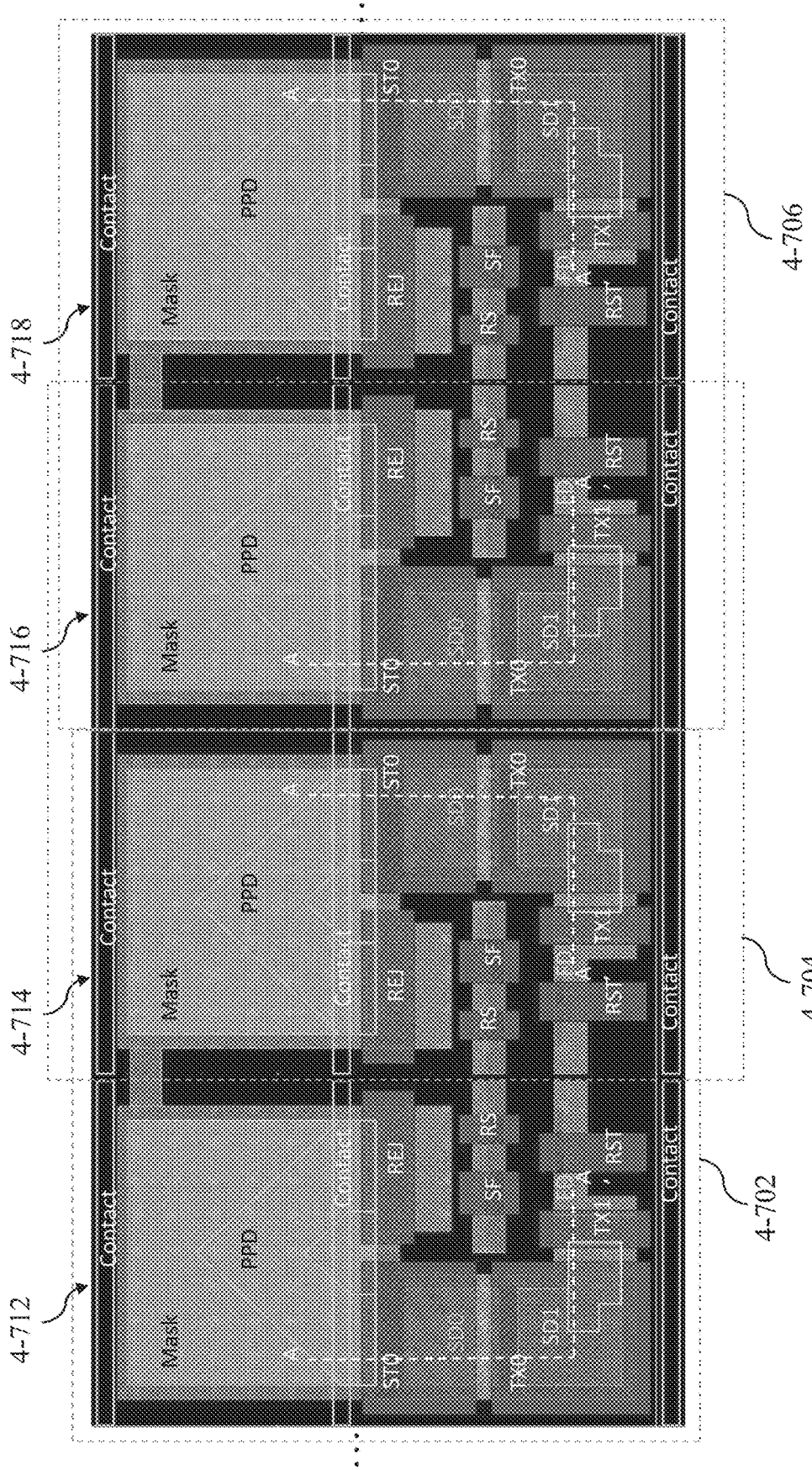
Figures 1, 5:
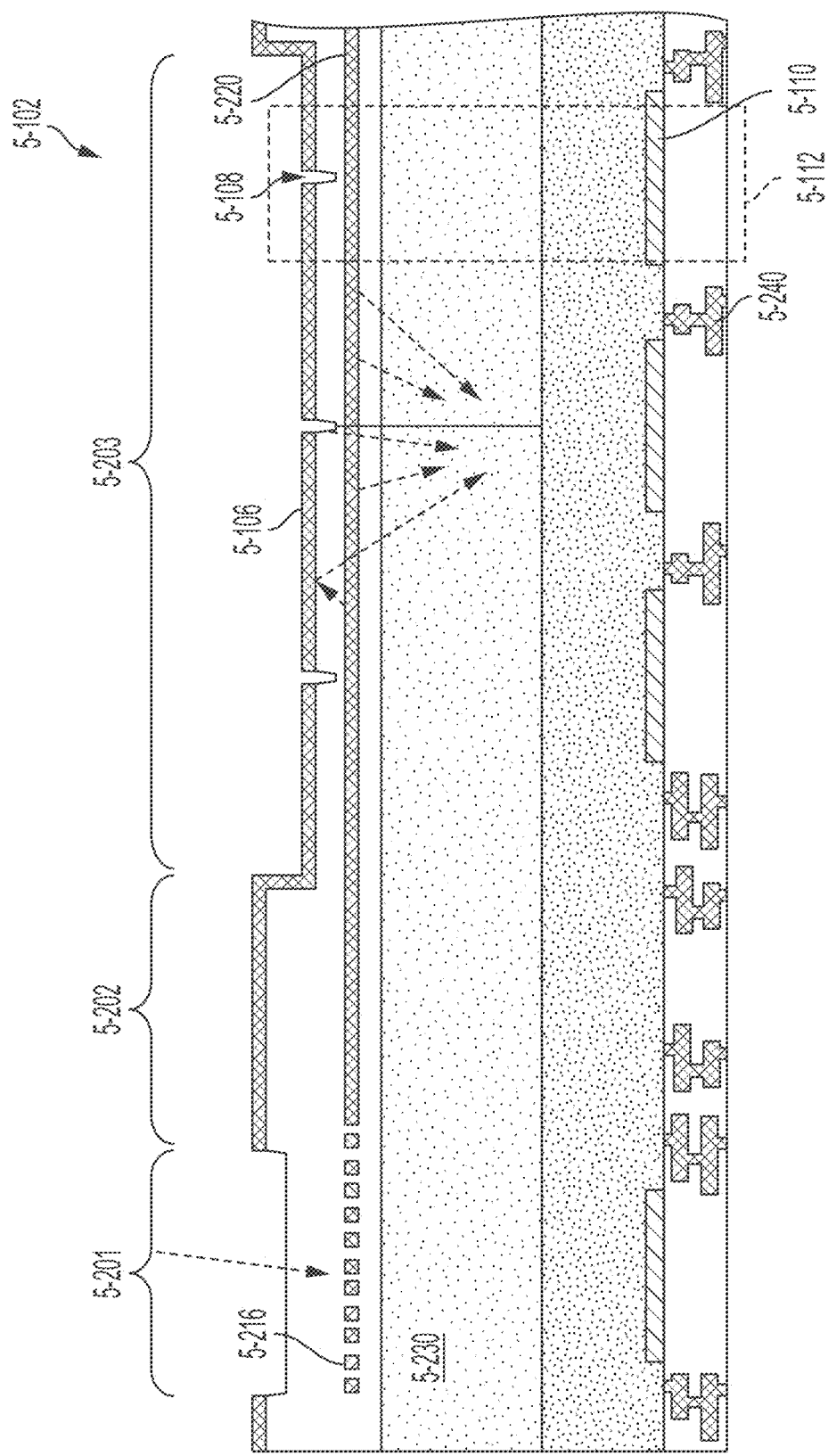
Figures 2, 5:
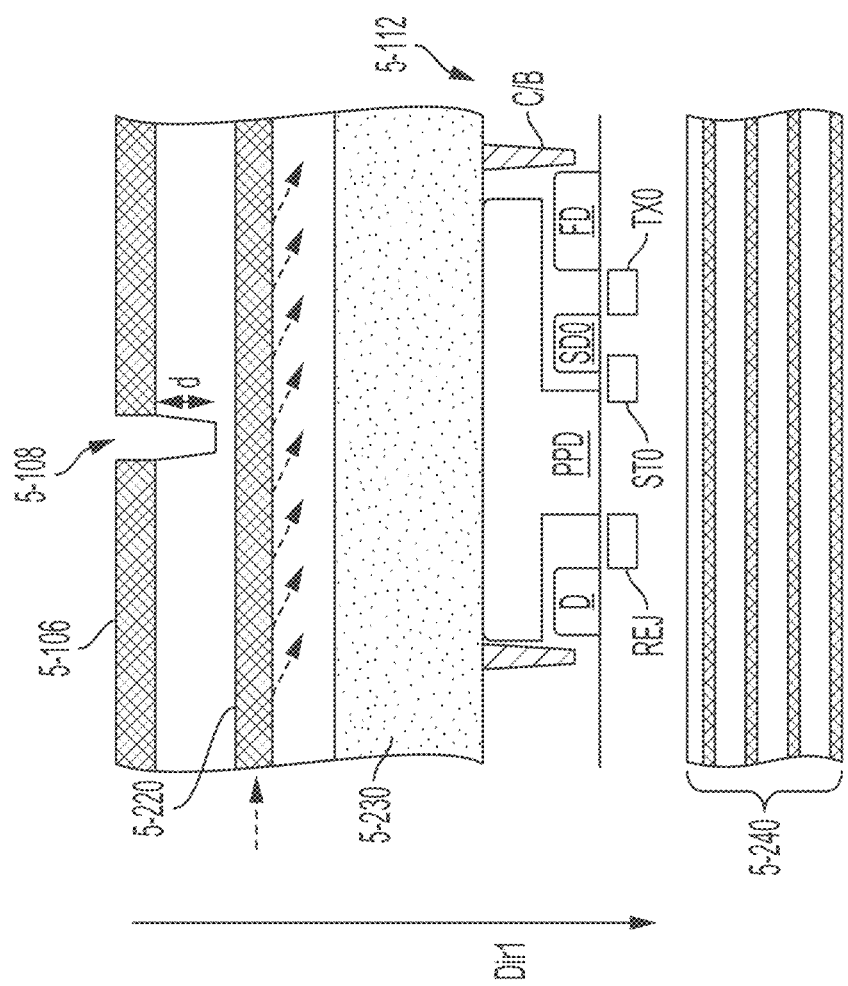
Figures 3, 5:
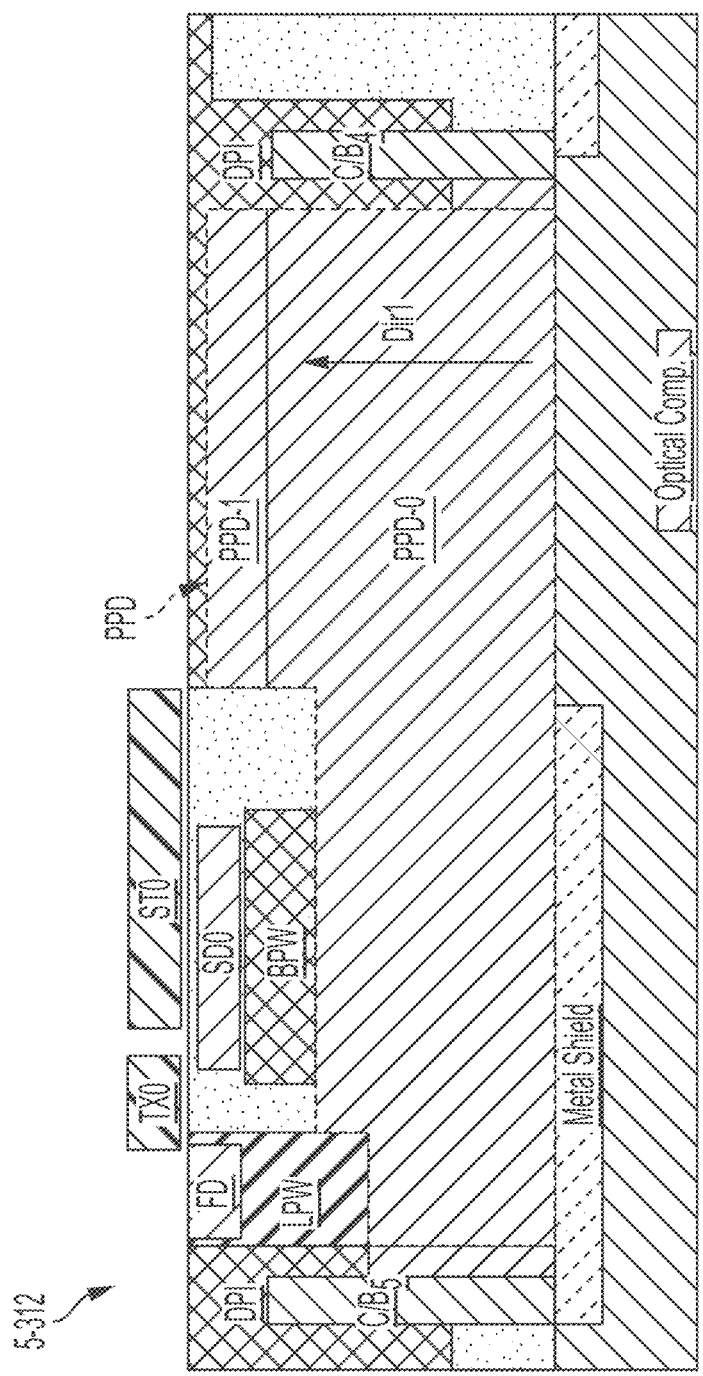
Figures 4, 5:
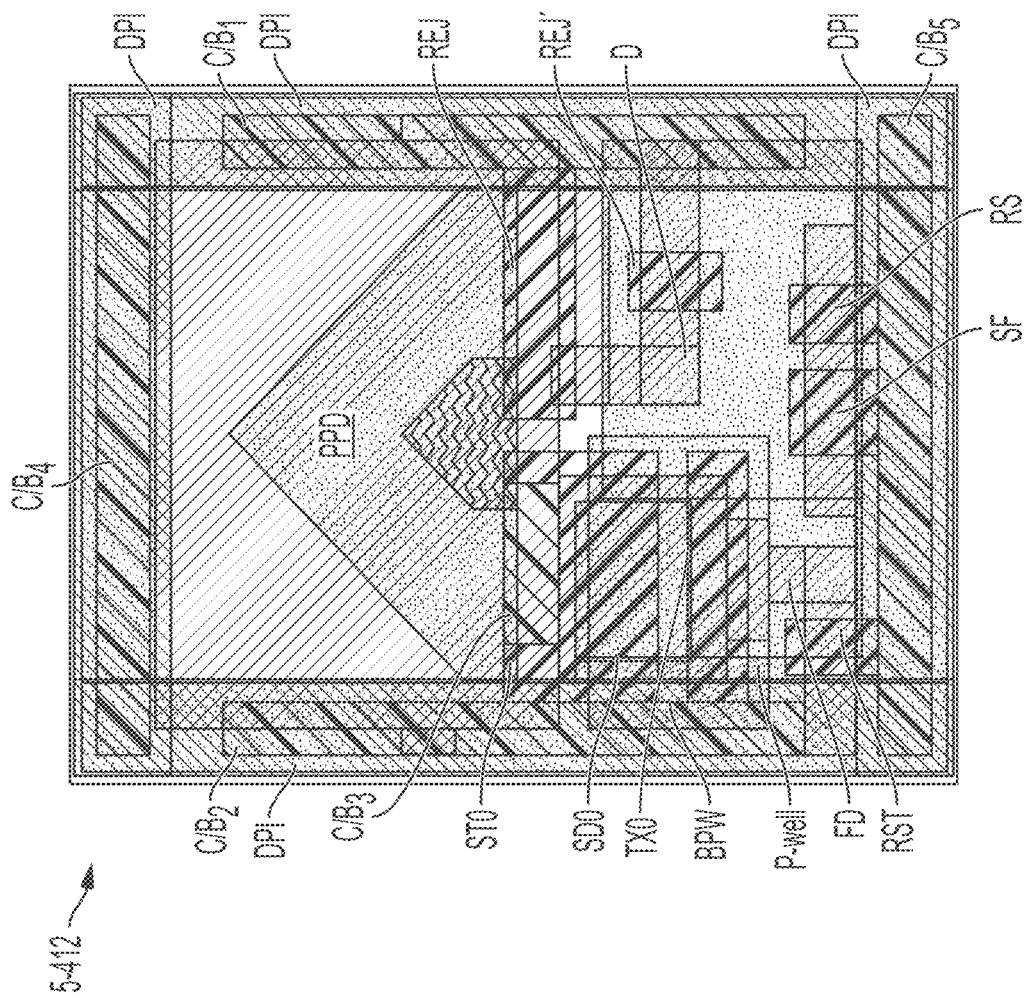
Figure 5:
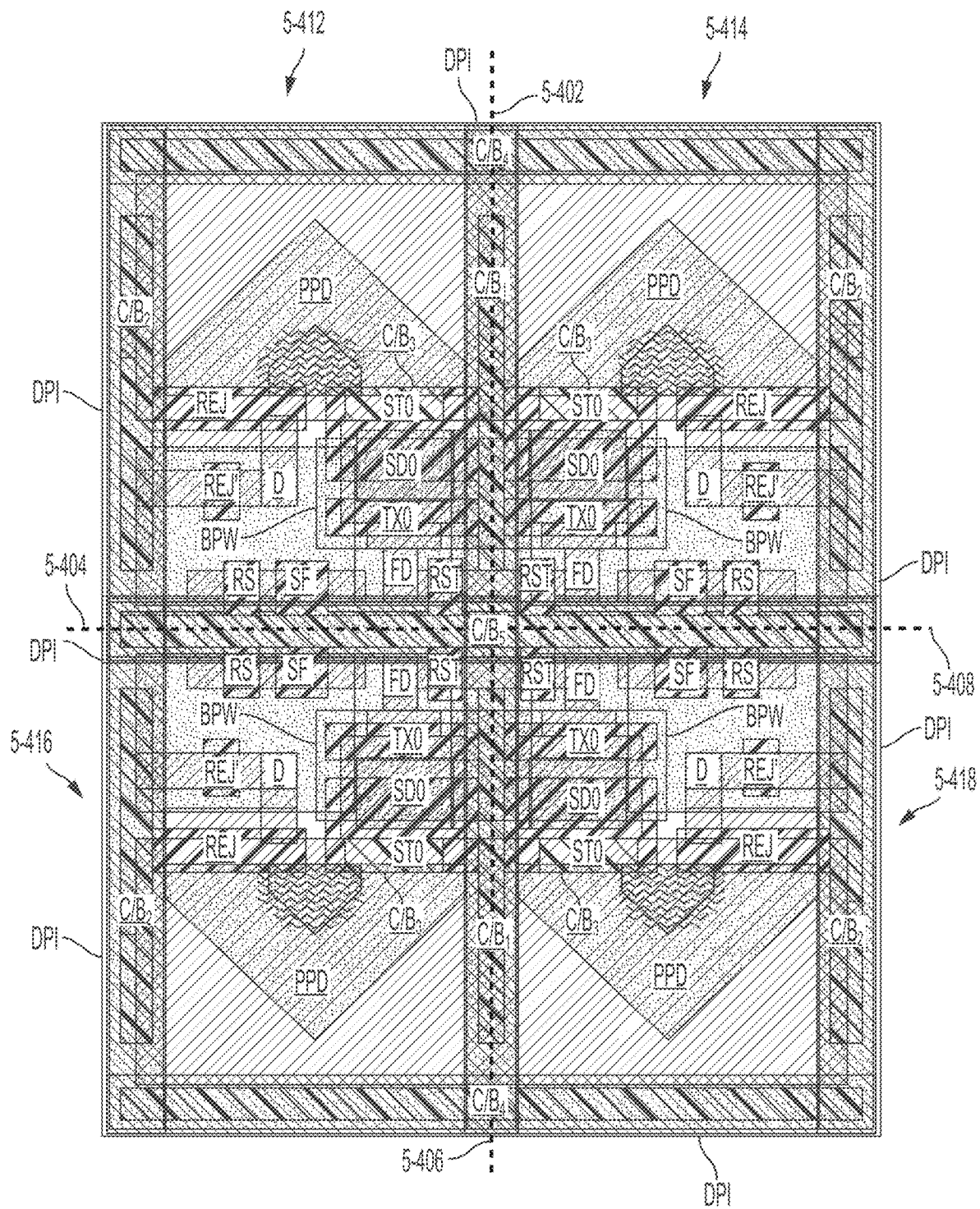
Figures 5, 6:
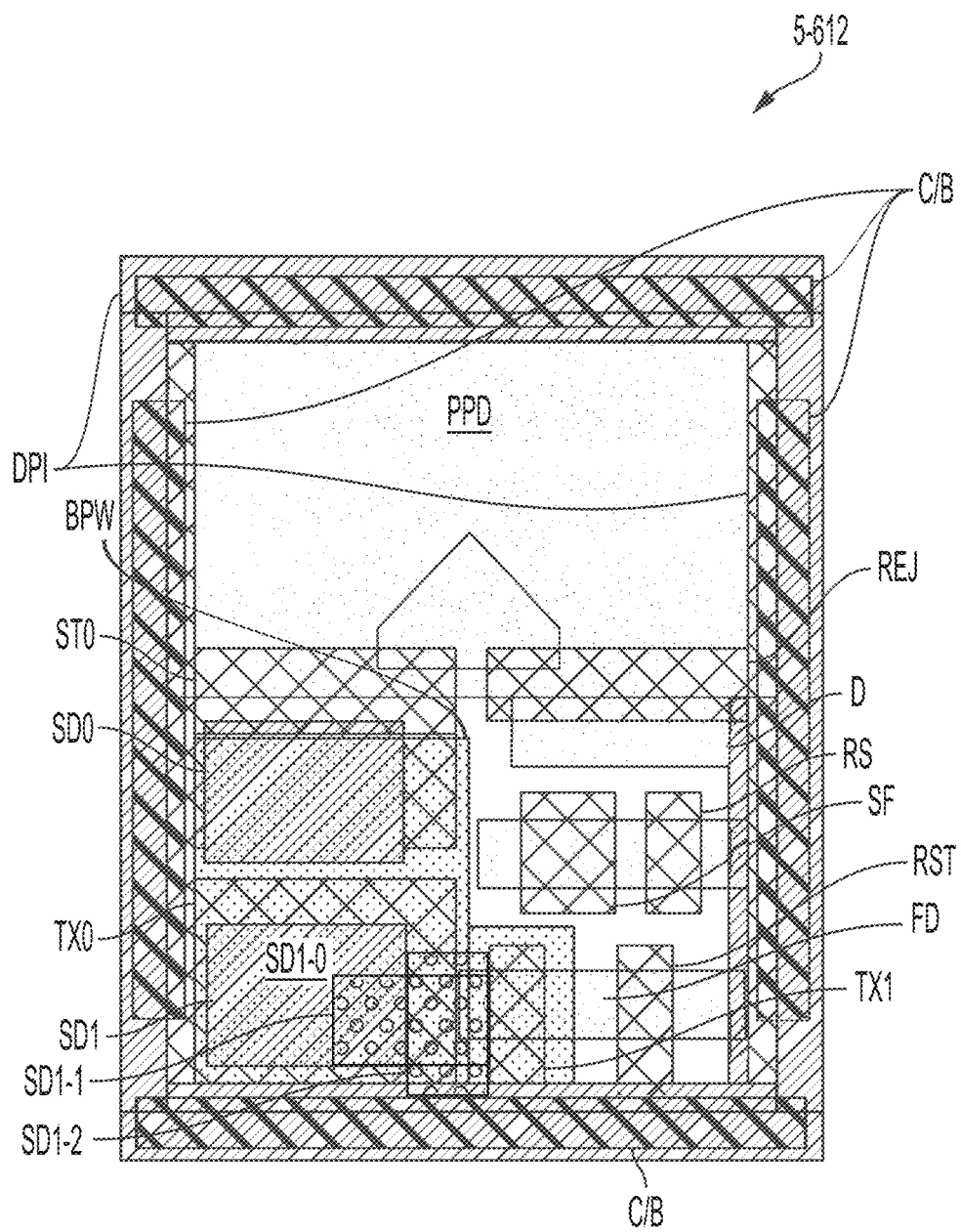
Figures 5, 6, 7, 8:
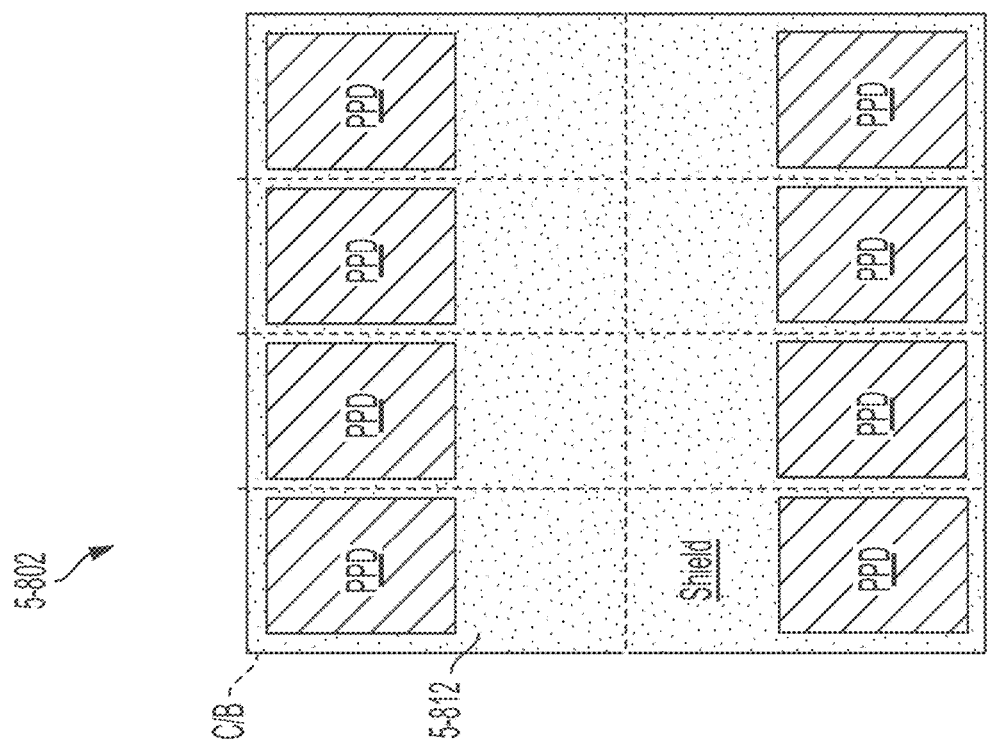
Figures 1, 6:
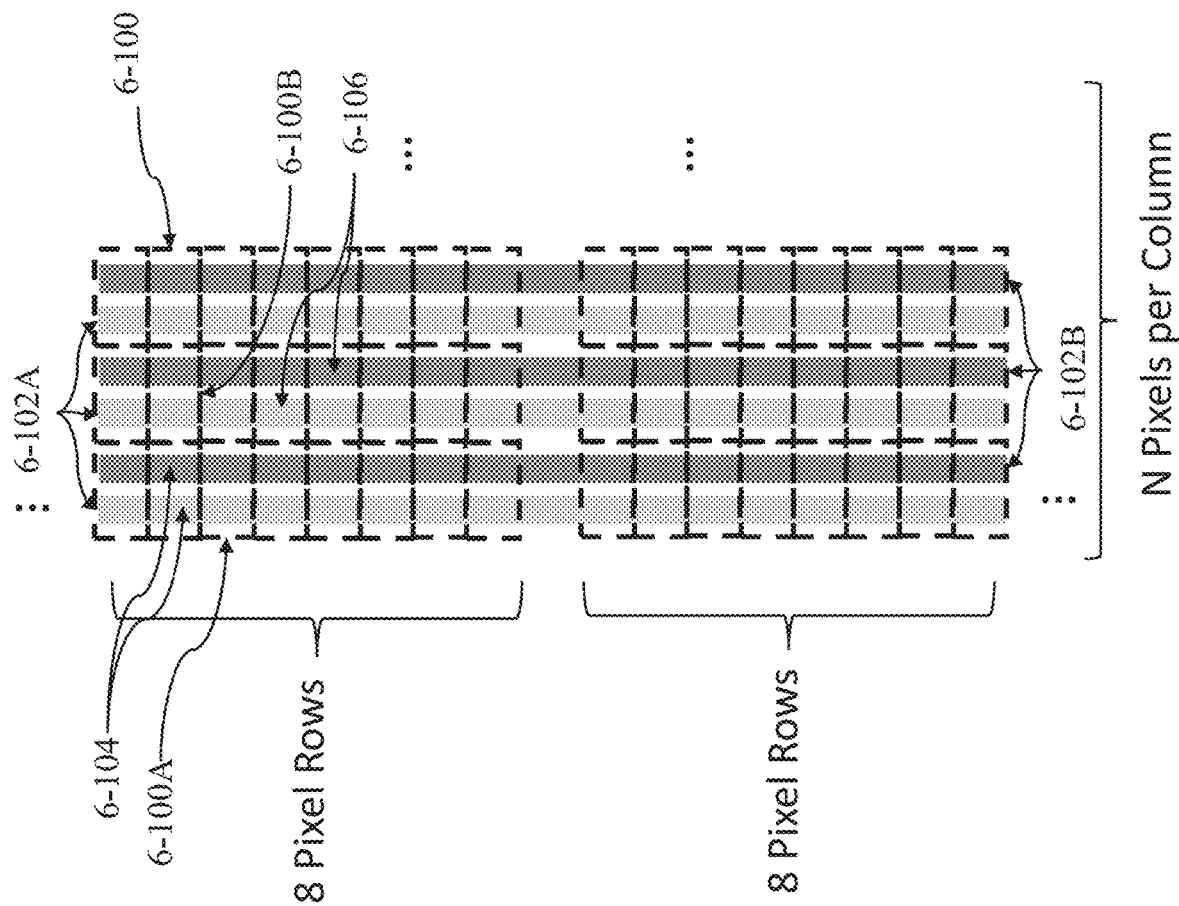
Figures 2, 6:
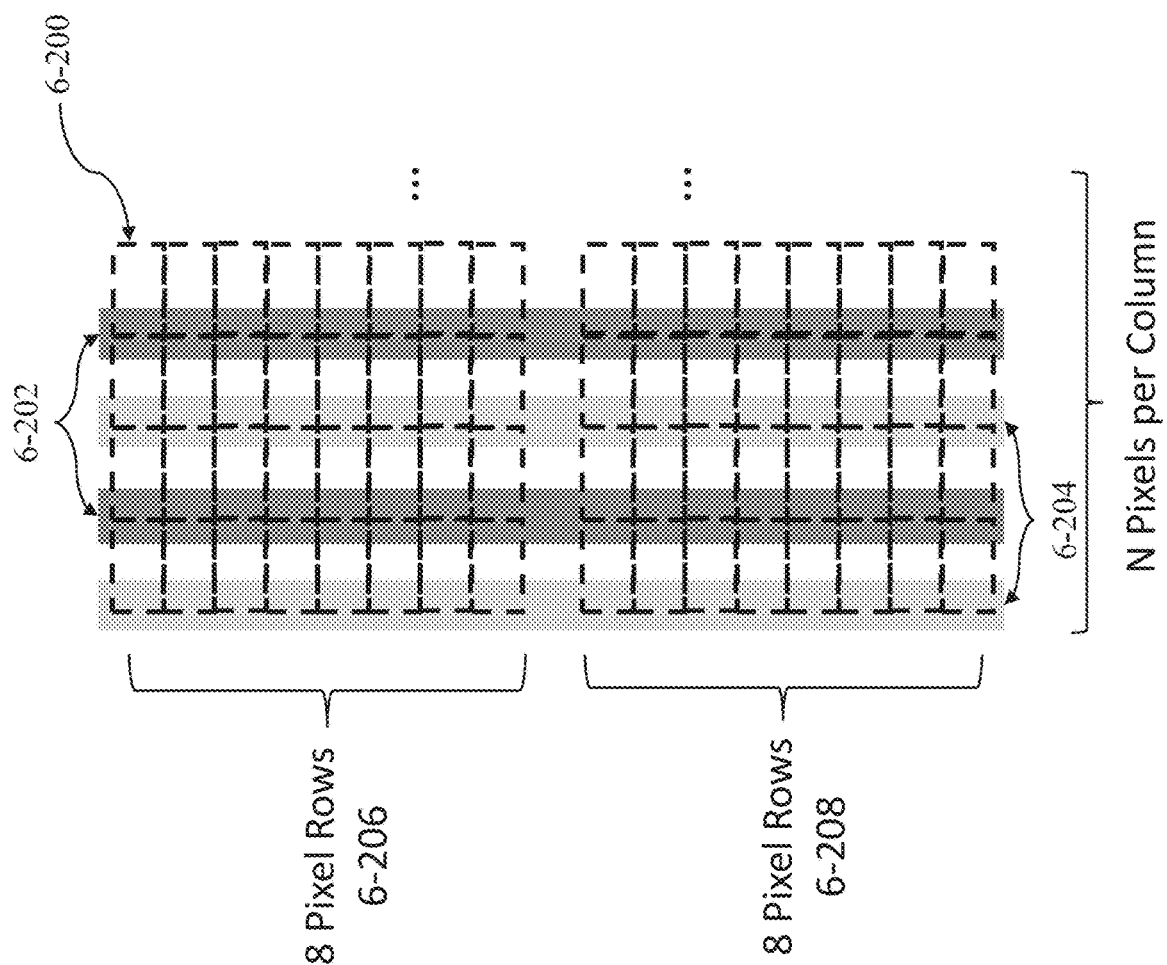
Figures 3, 6:
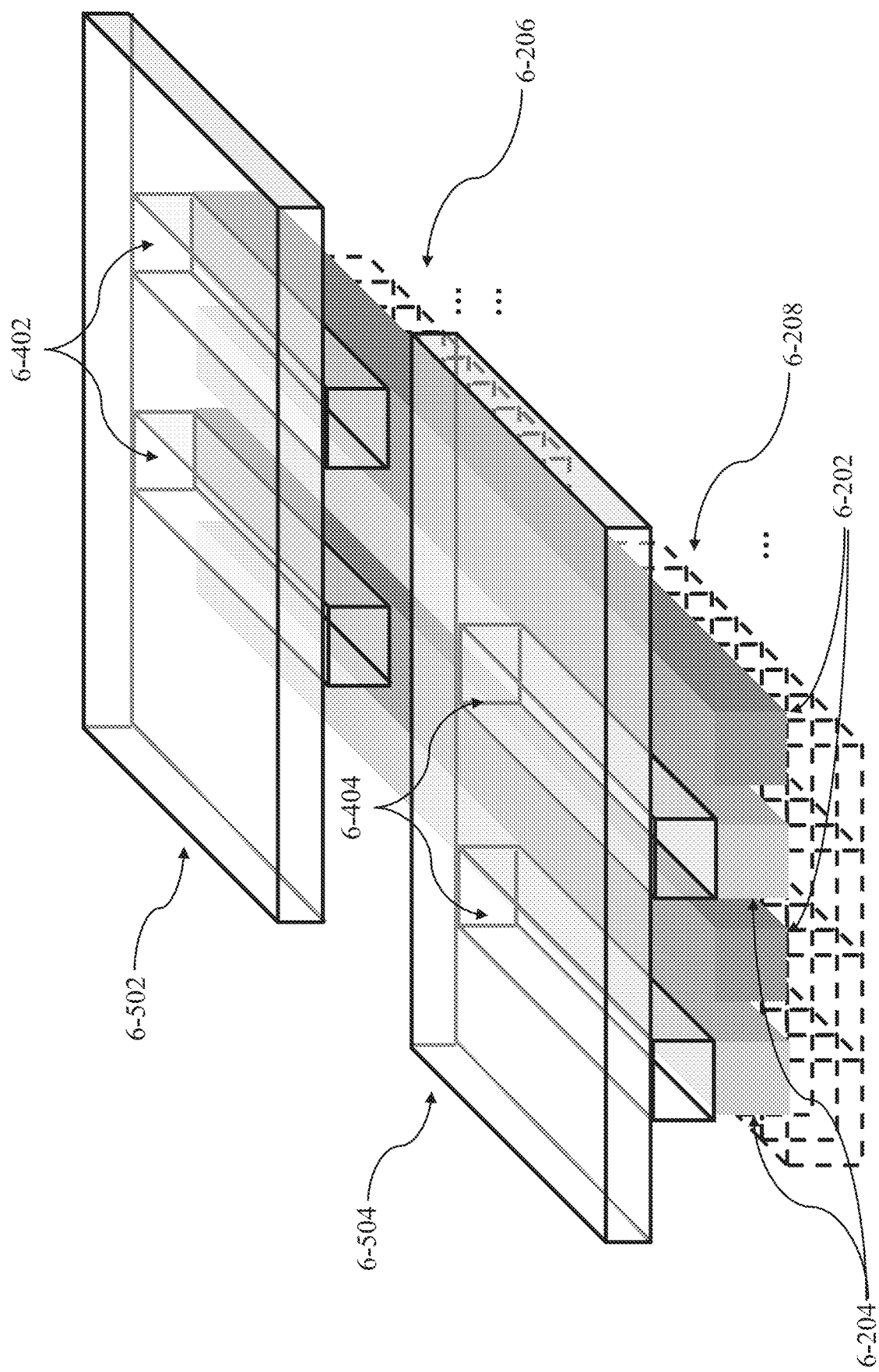
Figures 4, 6:
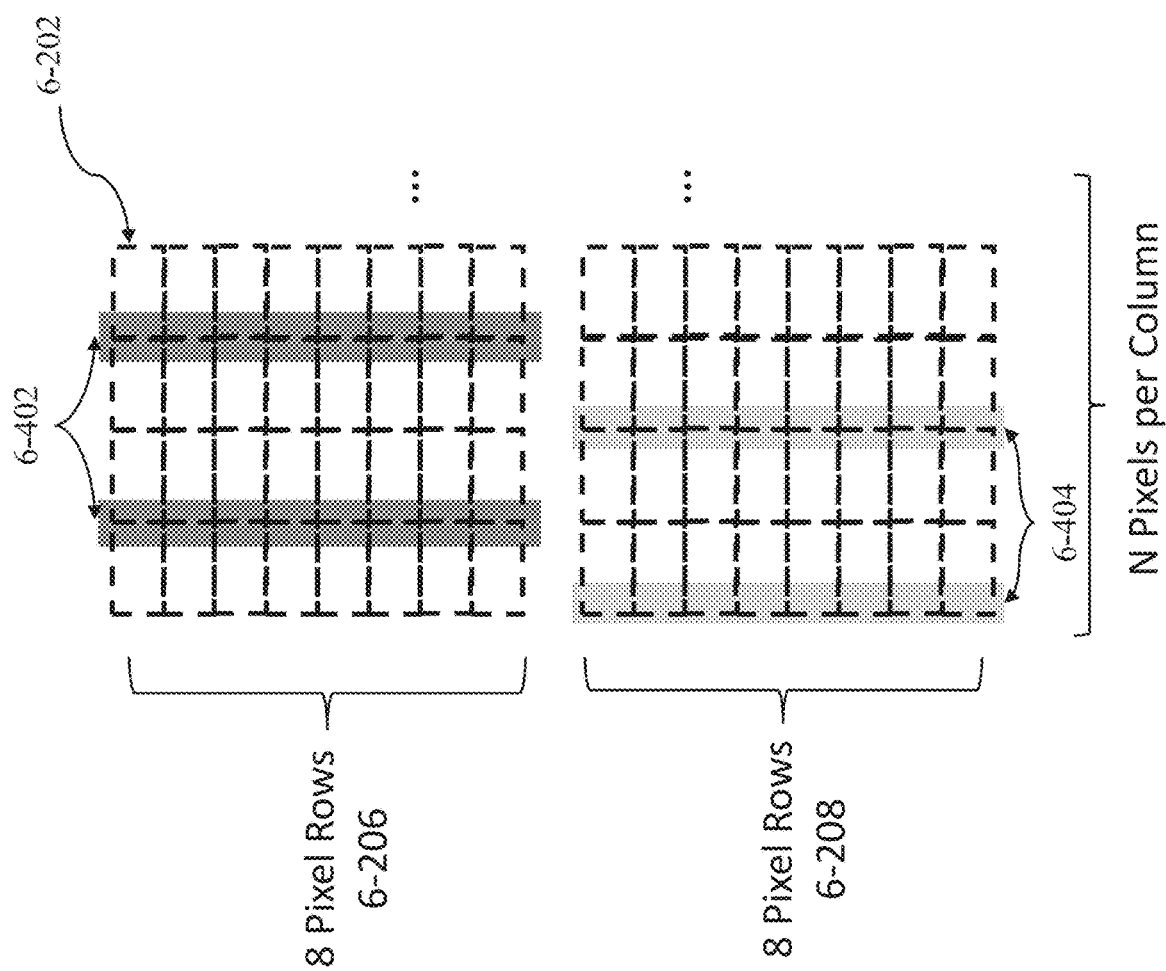
Figures 5, 6:
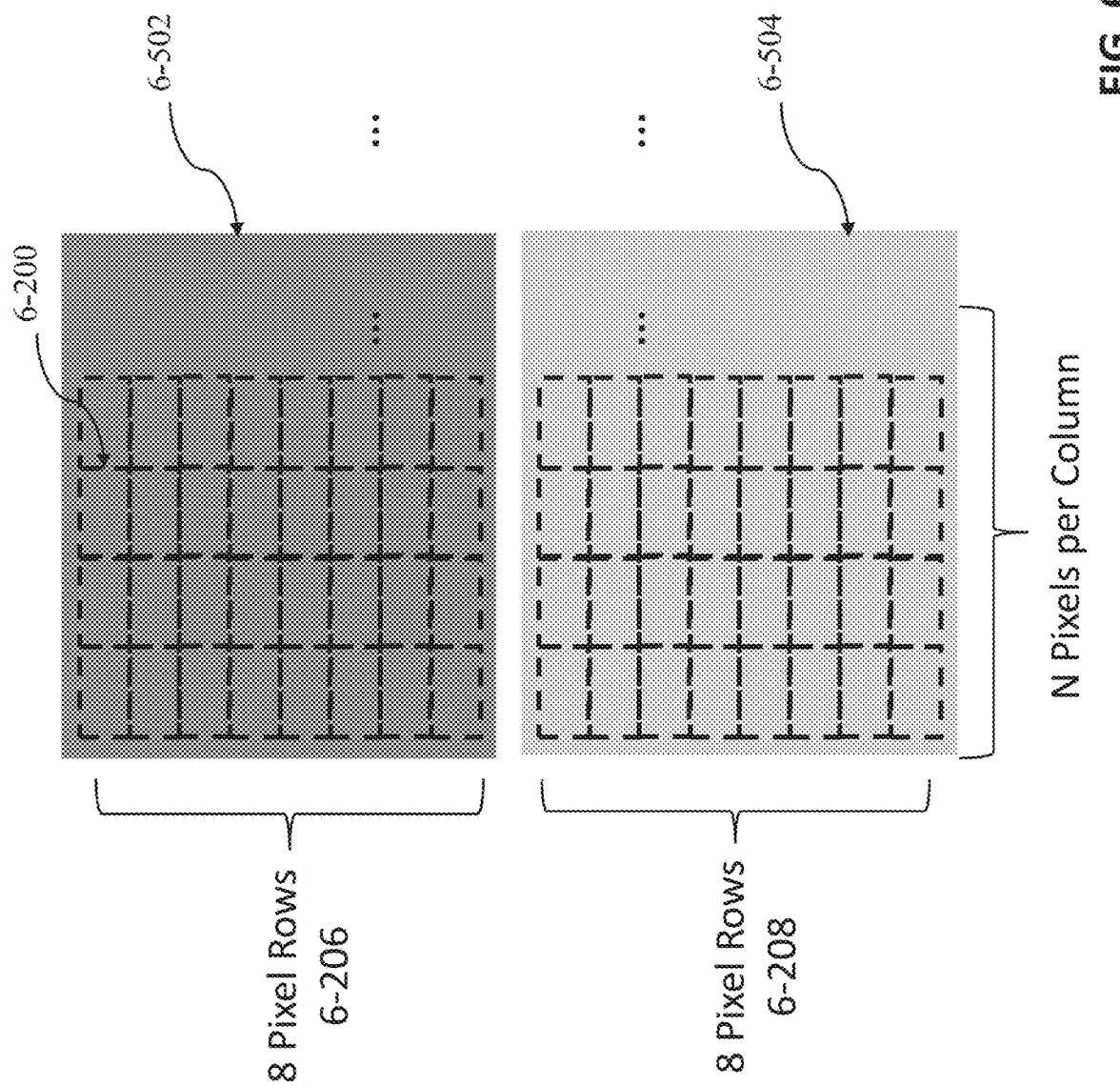
Figure 6:
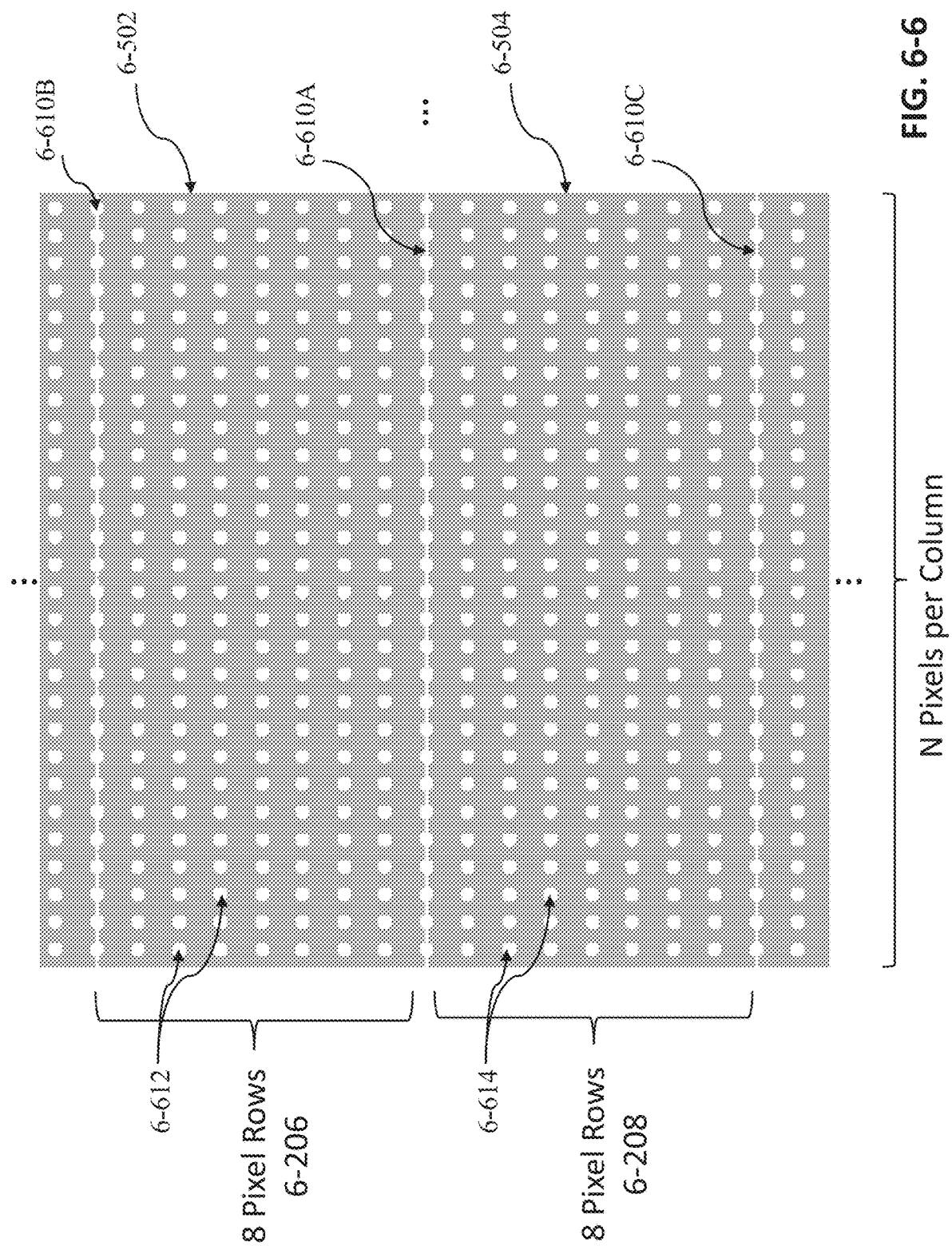
Figures 6, 7:
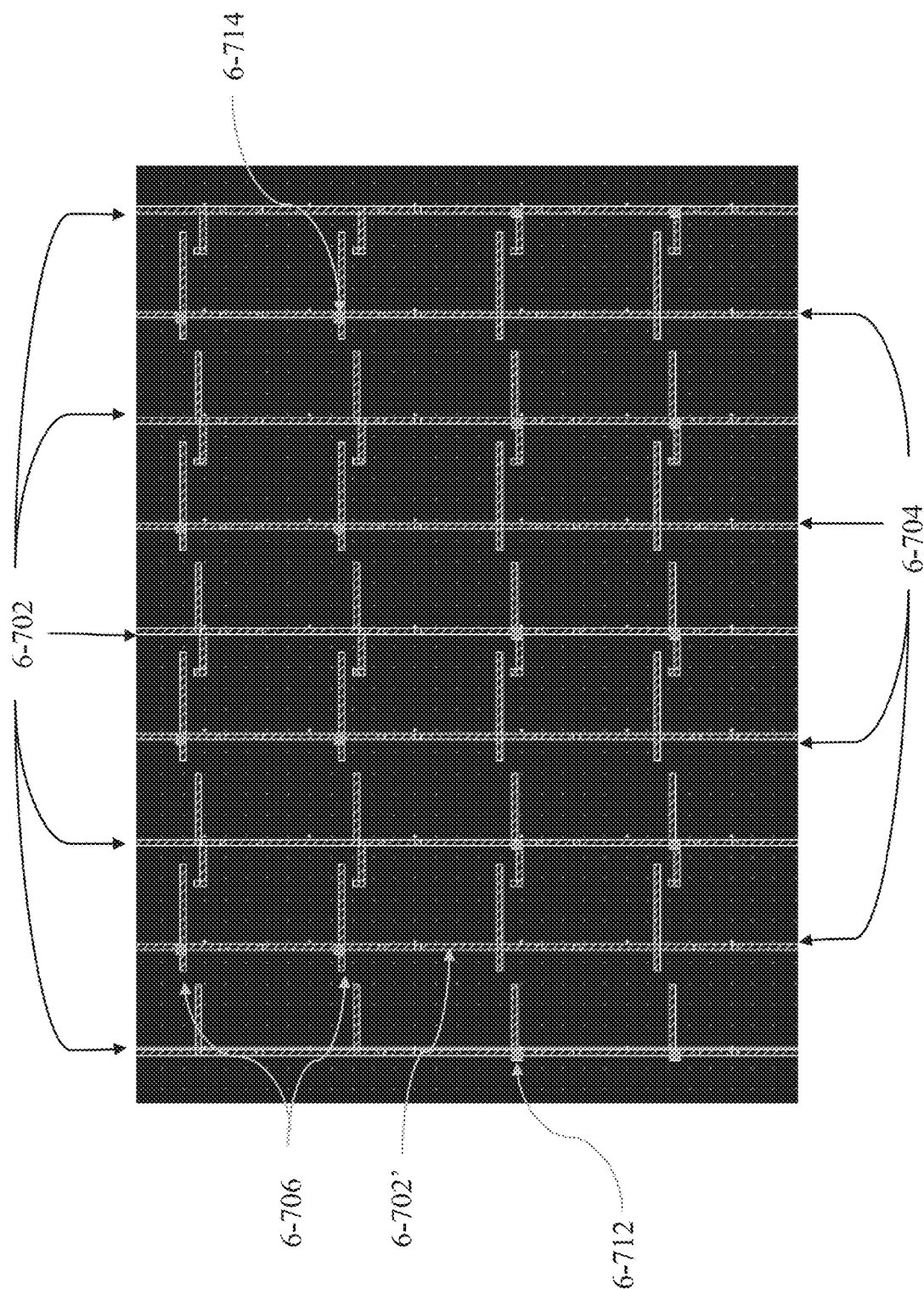
Figures 6, 7, 8:
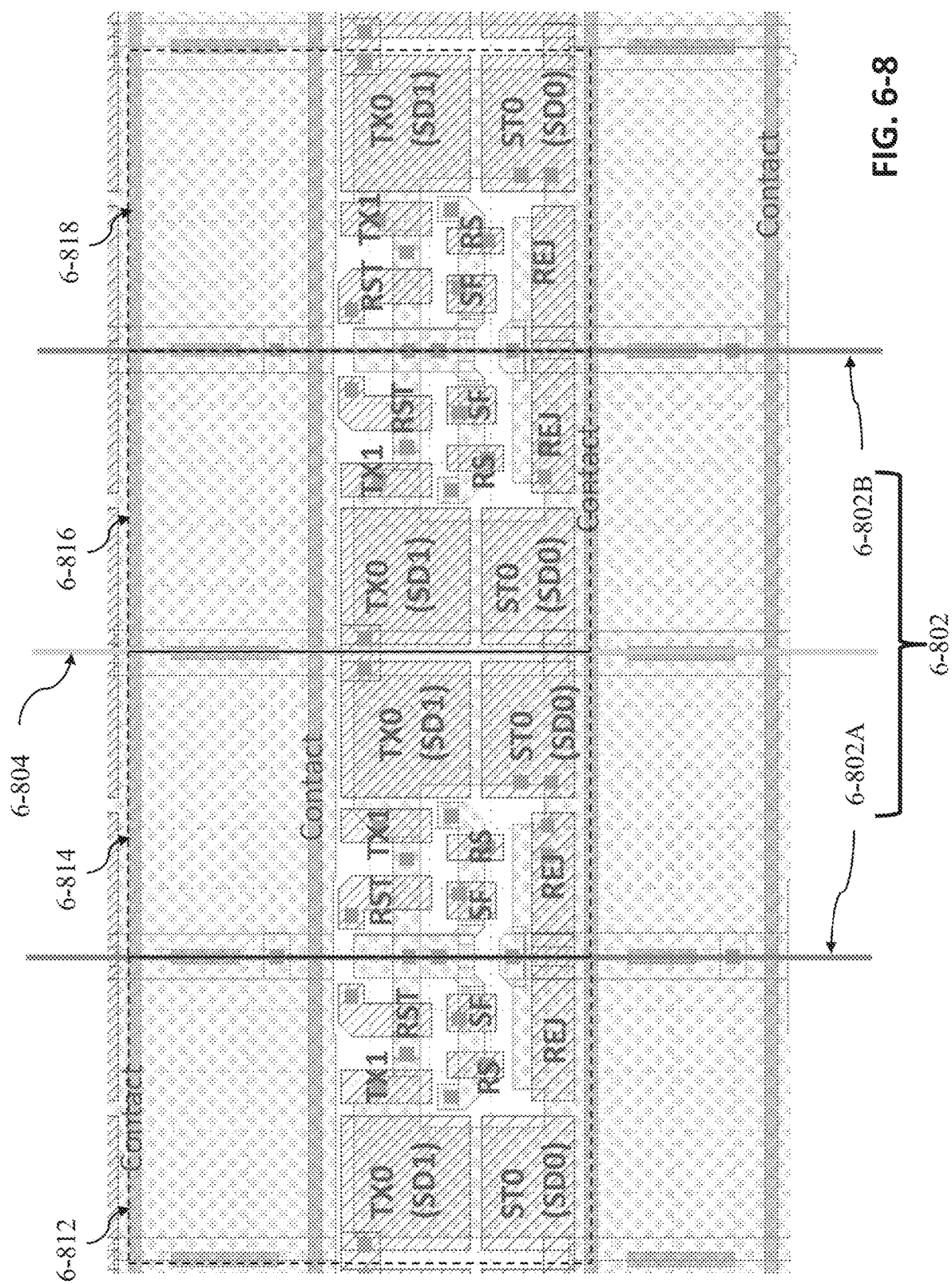

FIG. 5-8 is a top view of a portion of an example integrated device 5-802 having a metal shield positioned over portions of pixels 5-812, according to some embodiments. In some embodiments, pixels 5-812 may be configured in the manner described herein for pixels 5-712, 5-714, 5-716, and 5-718, and/or any other pixel described herein. As shown in FIG. 5-8, the metal shield has apertures sized and positioned to block light from reaching at least some components (e.g., charge storage regions) of pixels 5-812 and allow light to reach photodetection regions PPD. In the example of FIG. 8, pixels 5-812 may have mirrored configurations that allow the metal shield to continuously cover components of multiple adjacent pixels.

V. Techniques for Line Routing

As described herein, circuits can include conductive lines that provide electrical signals to pixel components. The conductive lines can be, for example, metal lines and/or lines made of other conductive material(s). The conductive lines can be used, for example, to distribute electrical signals to various control gates of the pixels. In some embodiments, a bias voltage of a control gate can be used to configure a conductivity state of a channel region associated with the control gate. FIG. 6-1 is a top view of an example portion of a pixel array 6-100 (shown in phantom) overlaid with conductive lines 6-102A and 6-102B (collectively, conductive lines 6-102), according to some embodiments. As shown in this example, the pixel array 6-100 includes two sets of eight rows of pixels (the rows extend horizontally in FIG. 6-1) and N pixels per column (the columns extend vertically in FIG. 6-1). The conductive lines 6-102 are disposed along the pixel array such that one of each conductive line 6-102A and 6-102B is disposed proximate to each pixel in the pixel array 6-100 in order to connect to associated components of the pixel. Each conductive line 6-102A and 6-102B can carry a different conductive signal for different components of the pixels of the pixel array 6-100. For example, one or more of conductive lines 6-102A can carry a REJ signal for a transfer gate REJ that controls when a drain region of a pixel receives charge carriers. As another example, one or more conductive lines 6-102B can carry a ST0 signal for a ST0 gate of a pixel that controls when a charge storage region SD0 receives charge carriers.

As shown in FIG. 6-1, each pixel on a pixel row has a dedicated conductive line from each set of conductive lines 6-102A and 6-102B. For example, pixel 6-100A receives electrical signals from the pair of conductive lines 6-104, while pixel 6-100B receives electrical signals for the same components from a different pair of conductive lines 6-106, and so on. Each line for a particular pixel may carry electrical signals that switch pixel components at a high frequency, such as down to the nanosecond-level. The inventors have appreciated that using a configuration with dedicated pairs of conductive lines for each pixel of a pixel row (e.g., such as that shown in FIG. 6-1) only allows for thin conductive strips for each conductive line (and therefore a limited amount of conductive material to carry the electrical signal). The inventors have also appreciated that using such a configuration can additionally or alternatively cause electrical coupling between adjacent pairs of conductive lines (e.g., which can cause skew in electrical signals). These deficiencies can make the conductive lines shown in FIG. 6-1 unsuitable for some applications. It should be appreciated, however, that the structures shown in FIG. 6-1 may be suitable for other applications and thus may be used in some embodiments.

The inventors have developed technical improvements to such conductive structures that address these and other potential deficiencies. In some embodiments, a conductive line extending in a column direction can be in electrical communication with components of first pixel and a second pixel that is proximate (e.g., adjacent) the first pixel in a row direction, providing a large space between the conductive line and adjacent conductive lines, allowing the conductive line to be made large for low resistance and low capacitance. In some embodiments, first and second conductive lines extending in the column direction can be in electrical communication with different pairs of adjacent pixels, with ones of the first conductive lines positioned between adjacent ones of the second conductive lines.

In some embodiments, third and fourth conductive lines can be positioned above or below the pixels and in electrical communication with the first and second conductive lines, respectively, such as to distribute control signals to the first and second conductive lines. In some embodiments, the third and fourth conductive lines can overlie or underlie different rows of pixels, providing a large space between the third and fourth conductive lines for low capacitance. For example, the third and fourth conductive lines can extend in the column direction, the row direction, and/or both. Alternatively or additionally, in some embodiments, fifth and sixth conductive lines be positioned above or below the pixels and in electrical communication with the first and second conductive lines, respectively, such as to distribute the control signals. In some embodiments, the fifth and sixth conductive lines can overlie or underlie different rows of pixels. For example, the third and fourth conductive lines can extend in the column direction, partially overlying or underlying the first and second conductive lines, respectively, while being offset from one another in the column direction. In this example, the fifth and sixth conductive lines can extend in the row direction overlying or underlying different rows of pixels.

FIG. 6-2 is a top view of an example pixel array 6-200 overlaid with a plurality of conductive lines 6-202 and 6-204, according to some embodiments. As shown in FIG. 6-2, pixel array 6-200 includes a first group 4-206 of eight rows of pixels and a second group 4-208 of eight rows of pixels. In some embodiments, the conductive lines 6-202 and 6-204 of the third layer extend along the column direction. For example, in FIG. 6-2, conductive lines 6-202 and 6-204 extend along the column direction to overlie (or underlie) pixels of the first group 6-206 and 6-208. In some embodiments, the conductive lines 6-202 and 6-204 can be disposed between adjacent columns of pixels. For example, in FIG. 6-2, conductive lines 6-202 and 6-204 are in electrical communication with pixels in multiple rows, including rows in both the first group 6-206 and the second group 6-208. In some embodiments, the conductive lines can be electrically connected to components of pairs of adjacent pixels (e.g., to avoid needing dedicated lines for each component). For example, a conductive line can connect (e.g., via a physical connection, such as a physical connection that forms an ohmic DC contact) to one or more of the same components of neighboring pixels along a row direction, such that an electrical signal can be provided to these components by one conductive line. Also shown in FIG. 6-2, ones of the conductive lines 6-202 are positioned, in the row direction, between adjacent ones of the conductive lines 6-204 (and vice versa). In some embodiments, the conductive lines 6-202 and 6-204 may be electrically separate from one another so as to carry different electrical signals.

In some embodiments, the metal structures described herein can be used with pixel arrays that have mirrored pixel arrangements. For example, as described herein neighboring pixels (e.g., along the row direction and/or column direction) can be mirrored, which can result in one or more components of a first pixel being proximate to one or more components of a second pixel. As described herein, in some embodiments the first pixel and the second pixel each have a first side (e.g., a left side, or a top side) and a second side (e.g., a right side, or a bottom side). The first pixel can be adjacent the second pixel such that the second side of the first pixel is adjacent the first side of the second pixel. In some embodiments, the mirrored configuration can include proximate components such that at least one component of the first pixel disposed on the second side of the first pixel, and at least one component of the second pixel disposed on the first side of the second pixel. In some embodiments, the mirrored configuration can include opposite components such that at least one component of the first pixel disposed on the first side of the first pixel, and at least one component of the second pixel disposed on the second side of the second pixel.

In some embodiments, proximate components of mirrored pixels can be disposed closer to a conductive line compared to non-mirrored configurations. For example, the proximate components can be a same type of component, such as charge storage regions or rejection regions. The proximate components can share a conductive line, such as a conductive line that is disposed between the mirrored pixels. The conductive line can be used to provide electrical signals to the components of the neighboring pixels.

FIG. 6-3 is a 3D diagram showing the example pixel array 6-200, according to some embodiments. FIG. 6-4 is a top view of the example pixel array 6-200 showing conductive lines 6-402 and 6-404, according to some embodiments. FIG. 6-5 is a top view of the example pixel array 6-200 showing conductive lines 6-502 and 6-504, according to some embodiments.

In some embodiments, the conductive lines 6-402 may be configured to distribute the control signals to the conductive lines 6-202, and the conductive lines 6-202 may be configured to distribute the control signals to the pixel array 6-200. As shown in FIGS. 6-3 and 6-4, conductive lines 6-402 are positioned above (or below) and in electrical communication with conductive lines 6-202, with conductive lines 6-202 positioned between conductive lines 6-402 and the pixel array 6-200. For example, the conductive lines 6-402 may be positioned on a layer above or below the layer that includes the conductive lines 6-202. As shown in FIGS. 6-3 and 6-4, the conductive lines 6-402 can extend in the column direction overlying or underlying the conductive lines 6-202 and overlying or underlying pixels of the pixel array 6-200. For example, in FIGS. 6-3 and 6-4, the conductive lines 6-402 are shown overlying or underlying rows of the group 6-206 of rows of pixels of the pixel array 6-200.

In some embodiments, the conductive lines 6-502 may be configured to distribute control signals to the conductive lines 6-402. As shown in FIGS. 6-3 and 6-5, conductive lines 6-502 are positioned above (or below) and in electrical communication with conductive lines 6-202, with conductive lines 6-202 positioned between the conductive lines 6-502 and the pixel array 200. For example, the conductive lines 6-502 may be alternatively or additionally positioned on a layer above (or below) the layer that includes the conductive lines 6-202. As shown in FIG. 6-3, the conductive lines 6-402 are positioned between the conductive lines 6-502 and the conductive lines 6-202. As shown in FIGS. 6-3 and 6-5, the conductive lines 6-502 can extend in the column direction overlying or underlying the conductive lines 6-202 and overlying or underling pixels of the pixel array 6-200. For example, in FIGS. 6-3 and 6-5, the conductive lines 6-502 are shown, like the conductive lines 6-402, overlying or underlying rows of the group 6-206 of pixels of the pixel array 6-200. Also as shown in FIGS. 6-3 and 6-5, the conductive lines 6-502 extend in the row direction to overlie or underlie rows of pixels in the group 6-206.

In some embodiments, the conductive lines 6-404 may be configured to distribute the control signals to the conductive lines 6-204, and the conductive lines 6-204 may be configured to distribute the control signals to the pixel array 6-200. For example, the conductive lines 6-402 may be configured to provide a reject control signal to pixels of the pixel array 6-200, and/or the conductive lines 6-404 may be configured to provide a collect signal to pixels of the pixel array 6-200, and/or vice versa. As shown in FIGS. 6-3 and 6-4, conductive lines 6-404 are positioned above (or below) and in electrical communication with the conductive lines 6-204, with the conductive lines 6-204 positioned between the conductive lines 6-404 and the pixel array 6-200. For example, the conductive lines 6-404 may be positioned on the same layer as (and/or an adjacent layer to) the conductive lines 6-402 above or below the layer that includes the conductive lines 6-204. As shown in FIGS. 6-3 and 6-4, the conductive lines 6-404 can extend in the column direction overlying or underlying the conductive lines 6-204 and overlying or underlying pixels of the pixel array 6-200. For example, in FIGS. 6-3 and 6-4, the conductive lines 6-404 are shown overlying or underlying rows the group 6-208 of rows of pixels of the pixel array 6-200. As shown in FIG. 6-3, the conductive lines 6-502 may be wider than the conductive lines 6-402, such as with ones of the conductive lines 6-402 being positioned between adjacent pixels in a row and with the conductive lines 6-502 spanning multiple pixels in the row direction, such as an entire row of pixels.

In some embodiments, the conductive lines 6-504 may be configured to distribute control signals to the conductive lines 6-404. As shown in FIGS. 6-3 and 6-5, conductive lines 6-504 are positioned above (or below) and in electrical communication with the conductive lines 6-204, with the conductive lines 6-204 positioned between the conductive line 6-504 and the pixel array 6-200. For example, the conductive lines 6-504 may be alternatively or additionally positioned on the same layer as (and/or an adjacent layer to) the layer that includes the conductive lines 6-502 above or below the layer that includes the conductive lines 6-204. In the example of FIGS. 6-3 and 6-5, the conductive lines 6-404 are positioned between the conductive lines 6-504 and the conductive lines 6-204. As shown in FIGS. 6-3 and 6-5, the conductive lines 6-504 can extend in the column direction overlying or underlying the conductive lines 6-204 and overlying or underlying pixels of the pixel array 6-200. For example, in FIGS. 6-3 and 6-5, the conductive lines 6-504 are shown, like the conductive lines 6-404, overlying or underlying rows of the group 6-208 of pixels of the pixel array 6-200. Also as shown in FIGS. 6-3 and 6-5, the conductive lines 6-504 extend in the row direction to overlie or underlie rows of pixels in the group 6-208. As shown in FIG. 6-3, the conductive lines 6-504 may be wider than the conductive lines 6-404, such as with ones of the conductive lines 6-404 being positioned between adjacent pixels in a row and with the conductive lines 6-504 spanning multiple pixels in the row direction, such as an entire row of pixels.

In some embodiments, the conductive lines 6-502 may be electrically separate from the conductive lines 6-504 so as to provide different electrical signals from one another. In some embodiments, the conductive lines 6-502 and 6-504 may be spaced from one another such that the conductive lines 6-502 and 6-504 overlie or underlie different rows of pixel array 6-200. For example, in FIGS. 6-3 and 6-5, the conductive lines 6-502 and 6-504 are shown spaced from each other in the column direction such that the conductive lines 6-502 overlie or underlie pixels in the group 6-206 whereas the conductive lines 6-504 overlie or underlie pixels in the group 6-208.

Similarly, in some embodiments, the conductive lines 6-402 and 6-404 may be electrically separate from one another so as to provide different electrical signals. In some embodiments, the conductive lines 6-402 and 6-404 may be spaced from one another such that the conductive lines 6-402 and 6-404 overlie or underlie pixels of different rows of pixel array 6-200. For example, in FIGS. 6-3 and 6-4, the conductive lines 6-402 and 6-404 are shown spaced from each other in the column direction such that the conductive lines 6-402 overlie or underlie pixels in the group 6-206 whereas the conductive lines 6-404 overlie or underlie pixels in the group 6-208.

Alternatively or additionally, in some embodiments, the conductive lines 6-402 and 6-404 may be spaced from one another in the row direction. For example, as shown in FIGS. 6-3 and 6-4, the conductive lines 6-402 and 6-404 may be offset such that ones of the conductive lines 6-402 and 6-404 are disposed between different pairs of pixels of pixel array 6-200, such as with ones of the conductive lines 6-402 disposed between adjacent ones of the conductive lines 6-404 and/or vice versa. In some embodiments, the conductive lines 6-402 and 6-404 may be spaced from one another in the row direction by at least one pixel width. For example, in FIG. 6-4, the conductive lines 6-402 and 6-404 are shown with a center-to-center spacing of one pixel width in the row direction.

While the conductive lines 6-502 and 6-504 are shown in FIGS. 6-3 and 6-5 as extending continuously in the row and column directions, it should be appreciated that, in some embodiments, the conductive lines 6-502 and/or 6-504 may be discontinuous in at least one of the column and row directions. For example, the conductive lines 6-502 and/or 6-504 may extend in the row direction substantially parallel to one another and spaced from one another in the column direction, and/or vice versa.

While the conductive lines 6-402 and 6-404 are shown in FIGS. 6-3 and 6-4 as extending continuously in the column direction to overlie or underlie multiple rows of pixels, it should be appreciated that, in some embodiments, the conductive lines 6-402 and/or 6-404 can extend in the column direction by including vias positioned consecutively along the column direction with gaps between the vias.

FIG. 6-6 is a plan view of an example configuration of the conductive lines 6-502 and 6-504, according to some embodiments. As shown in FIG. 6-6, the conductive lines 6-502 are electrically separated from the conductive lines 6-504 by a space 6-210A, and the conductive lines 6-502 the conductive lines 6-502 are electrically separated from neighboring conductive lines in the column direction by spaces 6-610B and 6-610C, respectively. As shown in FIG. 6-6, the conductive lines 6-502 and 6-504 are patterned with a series of holes. For example, the conductive lines 6-502 are patterned with holes 6-612, and the conductive lines 6-504 are patterned with holes 6-614. In some embodiments, the holes can be configured (e.g., sized and/or positioned) to allow light to travel between adjacent portions within the conductive lines 6-502 and 6-504 to reach photodetection regions of pixels disposed above or below the conductive lines 6-502 and 6-504. For example, referring to FIG. 6-3, if light is traveling in a direction from the conductive lines 6-502 and 6-504 toward the pixel array 6-200, holes in the conductive lines 6-502 can allow the light to pass through the wide conductive line 6-502 and onto the photodetection regions of the pixels in the pixel array 6-200. In the example shown in FIG. 6-6, the space 6-610A is formed by connecting adjacent holes in the conductive layer containing the conductive lines 6-502 and 6-504 to separate the conductive lines 6-502 and 6-504 from one another.

FIG. 6-7 is a top schematic view of conductive lines 6-702 and 6-704 positioned above or below a portion of an example pixel array, according to some embodiments. FIG. 6-7 shows two groups of conductive lines 6-702 and 6-704. The conductive lines 6-702 and 6-704 can, for example, be implemented in the manner described with conductive lines 6-202 and 6-204 in connection with FIGS. 6-2 and 6-3. As shown in FIG. 6-7, each conductive line 6-702 and 6-704 can be connected to auxiliary conductive lines extending transversely from the conductive lines 6-702 and 6-704 in the row direction. For example, the conductive line 6-702' shown in FIG. 6-7 is connected to an auxiliary conductive line 6-704 extending in the row direction. The auxiliary conductive lines can connect individual conductive lines to components of two (or more) neighboring pixels along the row direction. Also shown in FIG. 6-7, the conductive lines 6-702 and 6-704 may be connected to conductive lines on a different layer by vias 6-712 and 6-714, respectively. For example, as shown in FIG. 6-7, vias 6-712 are spaced from vias 6-714 in the column and row directions, such as for connecting to the conductive lines 6-502 and 6-504, respectively, and/or 6-202 and 6-204, respectively.

FIG. 6-8 is a top schematic view of a portion of an example array of pixels 6-812, 6-814, 6-816 and 6-818 in mirrored configurations, according to some embodiments. As described herein, pixel 6-812 is in a mirrored configuration with pixel 6-814, pixel 6-814 is in a mirrored configuration with pixel 6-816, and pixel 6-816 is in a mirrored configuration with pixel 6-818.

As shown in FIG. 6-8, conductive lines 6-802, including conductive lines 6-802A and 6-802B), may be in electrical communication with one another as described herein for the conductive lines 6-702. The conductive lines 6-802 and 6-804 may be electrically separate, such as described herein for the conductive lines 6-702 and 6-704. For example, conductive lines 6-802 can be in electrical communication with conductive lines (e.g., 6-502) that extend above or below the pixels 6-812 to 6-818, and the conductive lines 6-804 can be in electrical communication with conductive lines (e.g., 6-504) that extend across a different set of rows of pixels from the pixels 6-812 to 6-818, such as spaced from the pixels 6-812 to 6-818 in the column direction.

As shown in FIG. 6-8, conductive lines 6-802 and 6-804 extend along the column direction between mirrored pairs of pixels: conductive line 6-802A is disposed between pixel 6-812A and pixel 6-814, conductive line 6-804 is disposed between pixel 6-814 and pixel 6-816, and conductive line 6-802B is disposed between pixel 6-816 and pixel 6-818. The conductive lines can be electrically connected to adjacent components of the pixels, such as transfer gates, drain gates, etc. For example, conductive lines 6-802 can be electrically connected to the REJ transfer gates of the associated neighboring pixels (such that conductive line 6-802A is connected to the REJ transfer gates of pixels 6-812 and 6-814, and conductive line 6-804B is connected to the REJ transfer gates of pixels 6-816 and 6-818). As another example, conductive line 6-804 can be electrically connected to the ST0 transfer gates of neighboring pixels 6-814 and 6-816. A bias voltage can be applied to the conductive structures to determine a conductivity state of transfer channel regions associated with the transfer gates.

In some embodiments, the techniques include a method of manufacturing an integrated circuit with one or more conductive lines. In some embodiments, the method includes forming a first pixel and a second pixel that is proximate to the first pixel along a row direction, and forming a conductive line extending along a column direction that intersects with the row direction, such that the conductive line is in electrical communication with a first component of the first pixel and a second component of the second pixel. In some embodiments, the method includes forming a first pixel and a second pixel that is proximate to the first pixel along a column direction, and forming a conductive line extending along a row direction that intersects with the column direction, such that the conductive line is in electrical communication with a first component of the first pixel and a second component of the second pixel.

In some embodiments, the method includes forming a first pixel and a second pixel in a first row along a row direction and a third pixel and a fourth pixel in a second row along the row direction, forming a conductive line extending along a column direction that intersects with the row direction, such that the conductive line is in electrical communication with (a) a first component of the first pixel and a second component of the second pixel, and (b) a third component of the third pixel and a fourth component of the fourth pixel. In some embodiments, the method includes forming a first pixel and a second pixel in a first column along a column direction and a third pixel and a fourth pixel in a second column along the column direction, forming a conductive line extending along a row direction that intersects with the column direction, such that the conductive line is in electrical communication with (a) a first component of the first pixel and a second component of the second pixel, and (b) a third component of the third pixel and a fourth component of the fourth pixel.

In some embodiments, the techniques include a method of using a pixel array. In some embodiments, the method can include applying an electrical signal to a conductive line that extends along a column direction that intersects with a row direction, and applying, via the conductive line, at least a portion of the electrical signal to a first component of a first pixel and a second component of a second pixel that is proximate to the first pixel. In some embodiments, the method includes applying an electrical signal to a conductive line, and applying, via the conductive line, at least a portion of the electrical signal to: (a) a first component of a first pixel and a second component of a second pixel, where the first pixel and the second pixel are in a first row along a row direction; and (b) a third component of a third pixel and a fourth component of a fourth pixel, where the third pixel and the fourth pixel are in a second row along the row direction.

In some embodiments, the pixel array can be formed with a conductive line that is in electrical communication with N number of pixel rows, where N is an even number (e.g., two rows, four rows, six rows, eight rows, ten rows, twelve rows, fourteen rows, sixteen rows, etc.). In some embodiments, the same pixel array can be formed with a conductive line that is in electrical communication with N number of pixel columns, where N is an even number (e.g., two rows, four rows, six rows, eight rows, ten rows, twelve rows, fourteen rows, sixteen rows, etc.). In some embodiments, the number of columns and/or rows combined can be determined based on capacitance and resistance. For example, the number of rows can be determined based on when the total capacitance and resistance gain of grouping more rows together is lost by the increased resistance and capacitance of the local interconnection lines (e.g., vertical interconnect lines). In some embodiments, the selected number of row or column groupings can be determined based on process technology (e.g., based on different metal materials (e.g., Al vs. Cu) widths, dielectric thicknesses, design rules, etc.

In some embodiments, the method can include applying an electrical signal to a conductive line that extends along a row direction that intersects with a column direction, and applying, via the conductive line, at least a portion of the electrical signal to a first component of a first pixel and a second component of a second pixel that is proximate to the first pixel. In some embodiments, the method includes applying an electrical signal to a conductive line, and applying, via the conductive line, at least a portion of the electrical signal to: (a) a first component of a first pixel and a second component of a second pixel, where the first pixel and the second pixel are in a first column along a column direction; and (b) a third component of a third pixel and a fourth component of a fourth pixel, where the third pixel and the fourth pixel are in a second column along the column direction.

It should be appreciated that while one example of a conductive structure is described in connection with FIGS. 6-1 through 6-8, the conductive structure can include any number of layers as desired, such as four layers, six layers, etc. (e.g., depending on the integrated circuit configuration, manufacturing process, pixel array size, desired electrical characteristics, etc.). Additionally, it should be appreciated that different configurations of each layer of the conductive structure can be used without departing from the spirit of the techniques described herein. It should further be appreciated that while the examples provided herein show portions of the conductive structure based on a small portion of a pixel array, the pixel arrays can be significantly larger and include thousands of pixels or more, and therefore the conductive lines of the conductive structures can likewise be much larger and extend across (significantly) more pixels in the row and/or column direction.

In some embodiments, conductive structures described herein may be implemented in integrated devices having photodetector circuitry (e.g., gates and/or storage regions) positioned on a different face of the integrated than the face that is configured to receive incident photons, such as further described herein. In some cases, such conductive structures may be implemented in BSI integrated devices. For instance, a BSI integrated device may have a plurality of layers spanning one or more wafers and/or a bonded (e.g., hybrid-bonded) wafer stack.

The inventors have also recognized that challenges arise in distributing control signals within an integrated photodetector that includes and/or is operable within a wafer stack where two or more wafers are bonded and electrically connected. For instance, it may be desirable to connect a logic wafer to a photodetection wafer to provide control signals from the logic wafer to the photodetection wafer for controlling the photodetection wafer. If the pixels and the wafer bond pads of the photodetection wafer have the same center-to-center spacing, then control signals could be transmitted between the logic and photodetection wafers via the wafer bond pads, and vertical conductors within the photodetection wafer extending between the wafer bond pads and the pixels could route the control signals vertically from the wafer bond pads to the pixels. However, to do so, the center-to-center spacing between the pixels would have to match the center-to-center spacing of the wafer bond pads, which the inventors recognized can be disadvantageous for some applications. For instance, it also may be desirable to minimize the center-to-center spacing between adjacent pixels so as to fit as many pixels as possible in an integrated photodetector, and at the same time, it may be desirable to maximize the center-to-center spacing between wafer bond pads (e.g., carrying different signals) so as to reduce capacitive coupling between adjacent wafer bond pads. Alternatively or additionally, it may be necessary to conform the center-to-center spacing between adjacent wafer bond pads to a manufacturing limit for producing the wafer, and that spacing may be larger than desirable for the pixels.

To overcome these drawbacks, the inventors have developed integrated circuits with different center-to-center spacings between adjacent wafer bond pads than between adjacent pixels that are in electrical communication with at least some of the bond pads. For example, an integrated circuit described herein may have a center-to-center spacing between adjacent wafer bond pads that is greater than a center-to-center spacing of pixels in electrical communication with the wafer bond pads. In some cases, the wafer bond pads may include signal bond pads in electrical communication with the pixels as well as auxiliary bond pads that are substantially floating with respect to the pixels. In some embodiments, the wafer bond pads (e.g., signal bond pads) and pixels may be in electrical communication via a plurality of conductive lines positioned between the bond pads and the pixels. For example, the conductive lines may be configured to route electrical signals from the wafer bond pads to pixels overlying or underlying the wafer bond pads and/or to pixels positioned between the adjacent wafer bond pads (e.g., in the direction of the center-to-center spacing). In some embodiments, the conductive lines may be arranged in novel patterns or groupings so as to reduce undesirable electrical and/or physical properties such as coupling resistance or capacitance.

FIG. 7-1 is a side view of a cross-section of an integrated device 7-100, according to some embodiments. As shown in FIG. 7-1, integrated device 7-100 includes a photodetection wafer 7-102 and a logic wafer 7-104, which may be bonded together to form at least a part of the integrated device 7-100.

In some embodiments, the pixel layer 7-120 may be configured to receive incident photons and generate charge carriers. In some embodiments, the photodetection wafer 7-102 may be configured to receive incident photons in a first direction Dir1 and generate charge carriers in response to receiving the incident photons while being controlled using signals from the logic wafer 7-104. As shown in FIG. 7-1, the photodetection wafer 7-102 includes a pixel layer 7-120, a routing layer 7-130, and a bonding layer 7-140. In FIG. 7-1, the pixel layer 7-120 is shown including pixels 7-122, which may include photodetection regions for generating charge carriers in response to receiving incident photons, drain regions for discarding charge carriers generated in response to light from an excitation source, and/or charge storage regions for collecting charge carriers generated in response to fluorescence light. In some embodiments, the pixels 7-122 may be arranged in an array having row and column directions. For example, the cross-section shown in FIG. 7-1 illustrates a column of pixels 7-122 spanning a first group 7-106 of rows of pixels 7-122 and a second group 7-108 of rows of pixels 7-122. Also shown in FIG. 7-1, the pixel layer 1-120 further includes gates 7-124 (e.g., ST0 and/or REJ gates) that may be configured to control operation of the pixels 7-122, and vias 7-126 that may be configured to provide control signals to the gates 7-124 for controlling operation of the pixels 7-122. As shown in FIG. 7-1, the gates 7-124 are positioned after the pixels 7-122 in the direction in which the pixels 7-122 are configured to receive incident light. For example, the integrated device 7-100 may have a BSI configuration.

In some embodiments, the routing layer 7-140 may be configured to connect control signals received from the logic wafer 7-104 to the pixel layer 7-120. As shown in FIG. 7-1, the routing layer 7-140 includes conductive lines 7-132 and vias 7-136. In some embodiments, the conductive lines 7-132 may extend in the column direction of the array of pixels 7-122, such as having conductive lines 7-132 disposed between adjacent pixels 7-122 (e.g., in electrical communication with the adjacent pixels 7-122). As shown in FIG. 7-1, the conductive lines 7-132 may extend across both illustrated rows 7-106 and 7-108 of pixels 7-122. In some embodiments, the vias 7-136 may be configured to connect the conductive lines 7-132 to the bonding layer 7-140. As shown in FIG. 7-1, the vias 7-136 are positioned consecutively in the column direction so as to form conductive lines extending in the row direction above or below the first group 7-106 of rows of pixels 7-122.

In some embodiments, the bonding layer 7-140 may be configured to interface with the logic wafer 7-104 to receive control signals for operating the pixel layer 7-120. As shown in FIG. 7-140, the bonding layer 7-140 includes wafer bond pads including signal bond pads 7-142 and auxiliary bond pads 7-144. In some embodiments, the signal bond pads 7-142 may be configured for electrically connecting to the logic wafer 7-104. For example, the signal bond pads 7-142 are shown in FIG. 7-1 connected to vias 7-136 of the routing layer 7-130 to provide control signals to the vias 7-136 from the logic wafer 7-104. In some embodiments, the signal bond pads 7-142 may be further configured to mechanically connect to the logic wafer 7-104. In some embodiments, the auxiliary bond pads 7-144 may be configured to only mechanically connect to the logic wafer 7-104. For example, the auxiliary bond pads 7-144 are shown in FIG. 7-1 to be at least substantially floating, with no vias connected to the auxiliary bond pads 7-144. The auxiliary bond pads 7-144 may be substantially floating, as opposed to perfectly floating, due to possible parasitic connections between the auxiliary bond pads 7-144 and one or more points of electric potential within the integrated device 7-100. In some embodiments, the first and auxiliary bond pads 7-142 and 7-144 may be configured as hybrid metal-dielectric bond pads, such as hybrid copper-oxide bond pads. In some cases, the auxiliary bond pads 7-144 may be configured as "dummy" bond pads.

In some embodiments, the logic wafer 7-104 may be configured to provide control signals to the photodetection wafer 7-102 to control operation of the pixels of the photodetection wafer 7-102. As shown in FIG. 7-1, the logic wafer 7-104 includes a bonding layer 7-160, a routing layer 7-170, and a substrate layer 7-180. In some embodiments, the logic wafer 7-104 may be a field programmable gate array (FPGA) and/or application specific integrated circuit (ASIC) programmable and/or programmed to include the bonding layer 7-160, routing layer 7-170, and/or substrate layer 7-180 described herein. According to various examples, the logic wafer 7-104 may be an ASIC having one or more gates and/or conductive lines interconnected in a fixed arrangement, or the logic wafer 7-104 may be an FPGA having one or more gates and/or conductive lines whose arrangement is programmable, or the logic wafer 7-104 may include a combination of gates and/or conductive lines interconnected in a fixed arrangement and gates and/or conductive lines whose arrangement is programmable, as embodiments described herein are not so limited.

In some embodiments, the bonding layer 7-160 may be configured to interface with the photodetection wafer 7-102 to provide control signals. As shown in FIG. 7-1, the bonding layer 7-160 includes signal bond pads 7-162 and auxiliary bond pads 7-164. In some embodiments, the signal bond pads 7-162 may be configured for electrically connecting to the photodetection wafer 7-102, such as described herein for the signal bond pads 7-142. In some embodiments, the auxiliary bond pads may be configured only for mechanically connecting to the photodetection wafer 7-102, such as described herein for the auxiliary bond pads 7-144.

In some embodiments, the routing layer 7-170 may be configured to provide control signals to the bonding layer 7-160. As shown in FIG. 7-1, the routing layer 7-170 includes vias 7-176, first conductive lines 7-174a and second conductive lines 7-174b. In some embodiments, the vias 7-176 may be configured to connect the first conductive lines 7-174a to the signal bond pads 7-162. As shown in FIG. 7-1, the vias 7-176 are positioned consecutively in the column direction aligned with the vias 7-136 of the photodetection wafer 7-102 (e.g., when the signal bond pads 7-142 are substantially aligned with the signal bond pads 7-162). In some embodiments, the first conductive lines 7-174a and the second conductive lines 7-174b may be electrically separate for carrying different control signals. For example, in the illustrated cross-section, the first conductive lines 7-174a are shown connected by vias 7-176 to the signal bond pads 7-162 to provide a first control signal to the photodetection wafer 7-102. In another cross-section (e.g., offset from the illustrated cross-section in the row direction), the second conductive lines 7-174b may be connected by a second set of vias 7-176 to a set of bond pads 7-162 to provide a second control signal to the photodetection wafer 7-102. In this example, the photodetection wafer 7-102 includes a set of bond pads 7-142, vias 7-136, and conductive lines 7-132 (e.g., positioned above or below the second group 7-108 of rows of pixels 7-122) for connecting to and receiving the second control signal from the second conductive lines 7-174b.

In some embodiments, the substrate layer 7-180 may be configured with additional gates 7-182, such as configured for processing signals received from the photodetection wafer 7-102 indicating amounts of charge carriers collected.

It should be appreciated that, when bonded together, the bond pads of the photodetection wafer 102 and the logic wafer 104 may be only substantially aligned, as perfect alignment may not always be possible.

FIG. 7-2 is a top view of the routing layer 7-130 of the integrated device 7-100, according to some embodiments. FIG. 7-3 is a 3D view of the routing layer 7-130 and bonding layers 7-140 and 7-160 of the integrated device 7-100, according to some embodiments.

As shown in FIGS. 7-2 and 7-3, the conductive lines 7-132 include first conductive lines 7-132a and second conductive lines 7-132b extending in the column direction. In some embodiments, the first conductive lines 7-132a and the second conductive lines 7-132b may be electrically separate from one another so as to carry different control signals to the pixels 7-122. As shown in FIGS. 7-2 and 7-3, ones of the second conductive lines 7-132b are disposed between adjacent ones of the first conductive lines 7-132a and vice versa.

In some embodiments, the first conductive lines 7-132a and the second conductive lines 7-132b may be in electrical communication with proximate pixels on opposite sides of the respective conductive lines in the row direction. Also shown in FIGS. 7-2 and 7-3, the first conductive lines 7-132a are connected to auxiliary conductive lines 7-134a extending transverse to the first conductive lines 7-132a to provide the control signal carried by the first conductive liens 7-132a to pixels 7-122 that are not adjacent the first conductive lines 7-132a. Similarly, in FIGS. 7-2 and 7-3, the second conductive lines 7-132b are connected to auxiliary conductive lines 7-134b extending transverse to the second conductive lines 7-132b to provide the control signal carried by the second conductive lines 7-132b to pixels 7-122 that are not adjacent the second conductive lines 7-132b. For example, as shown in FIG. 7-2, each first conductive line 7-132a is spaced from the nearest second conductive line 7-132b by three pixel widths, and the auxiliary conductive lines 7-134a and 7-134b extend two pixel widths in the row direction to provide the control signal from the first conductive line 132a to the two pixels between the first conductive line 7-132a and the second conductive line 7-132b that are not adjacent the first conductive line 7-132a.

Also shown in FIGS. 7-2 and 7-3, the vias 7-136 include first vias 7-136a and second vias 7-136b, and the signal bond pads 7-142 of the photodetection wafer 7-102 include first signal bond pads 7-142a connected to the first conductive lines 7-132a by the first vias 7-136a and second signal bond pads 7-142b connected to the second conductive lines 7-132b by the second vias 7-136b. As shown in FIG. 7-3, the first vias 7-136a and the second vias 7-136b are positioned along the column direction so as to form conductive lines extending in the column direction and spaced from one another in the row direction. In some embodiments, the conductive lines formed by the first vias 7-136a and the second vias 7-136b may overlie or underlie different rows of the pixels 7-122. For example, as shown in FIGS. 7-2 and 7-3, the first vias 7-136a overlie or underlie a first group 7-202 of rows of the pixels 7-122, whereas the second vias 7-136b overlie or underlie a second group 7-204 of rows of the pixels 7-122.

In some embodiments, the bond pads 7-142a, 7-142b, and/or 7-144 of integrated device 7-100 may have a different center-to-center spacing (e.g., in the row direction) than the pixels 7-122 of the integrated device 7-100. For instance, the bond pads of integrated device 7-100 may have a greater center-to-center spacing than the pixels 7-122. For example, in FIG. 7-2, the center-to-center spacing between adjacent bond pads 7-142a and 7-144 and between adjacent bond pads 7-142b and 7-144, in the row direction, is three pixel widths. In other embodiments, the center-to-center spacing between adjacent bond pads may be less than three pixel widths, such as two pixel widths, and/or greater than three pixel widths, such as four pixel widths, as embodiments described herein are not so limited.

In some embodiments, the conductive lines 7-132a and/or 7-132b may have a different center-to-center spacing than pixels 7-122. For instance, the conductive lines 7-132a and 7-132b may have a greater center-to-center spacing than the pixels 7-122. For example, in FIG. 7-2, the conductive lines 7-132a and 7-132b have a center-to-center spacing of three pixel widths, equal to the center-to-center spacing show for the bond pads 7-142a, 7-142b, and 7-144. It should be appreciated that embodiments described herein are not so limited, such as described herein for the bond pads 7-142, 7-142b, and 7-144. It should also be appreciated that the center-to-center spacing between the conductive lines may only substantially equal the center-to-center spacing of the bond pads, such as when the bond pads are not perfectly aligned with the conductive lines.

In some embodiments, the signal bond pads 7-142a and auxiliary bond pads 7-144 may be interspersed with one another along the row direction. For example, in FIGS. 7-2 and 7-3, rows of group 7-202 have an auxiliary bond pad 7-144 between adjacent signal bond pads 7-142a. Similarly, in some embodiments, the signal bond pads 7-142b and auxiliary bond pads 7-144 may be interspersed with one another along the row direction. For example, in FIGS. 7-2 and 7-3, rows of group 7-204 have an auxiliary bond pad 7-144 positioned between adjacent signal bond pads 7-142b. In some embodiments, such as shown in FIG. 7-2, the auxiliary bond pads 7-144 may be positioned in the same row as signal bond pads 7-142a and aligned, in the column direction, with respective bond pads 7-142b in other rows, and/or vice versa.

FIG. 7-4 is a top view of the routing layer 7-170 of the integrated device 7-100, according to some embodiments. FIG. 7-5 is a 3D view of the integrated device 7-100 further illustrating the routing layer 7-170, according to some embodiments.

In some embodiments, the first conductive lines 7-174a and the second conductive lines 7-174b may be spaced from one another in the column direction so as to be positioned above or below different rows of the pixels 7-122. For example, as shown in FIG. 7-4, the first conductive lines 7-174a are positioned above or below the first group 7-202 of rows of pixels 7-122, whereas the second conductive lines 7-174 are positioned above or below the second group 7-204 of rows of pixels 7-122. Also shown in FIGS. 7-4 and 7-5, the signal bond pads 7-162 of the logic wafer 7-104 include first signal bond pads 7-162a connected to the first conductive lines 7-174a by first vias 7-176a and second signal bond pads 7-162b connected to the second conductive lines 7-174b by second vias 7-176b.

In some embodiments, the signal bond pads 7-162a and auxiliary bond pads 7-164 may be interspersed with one another along the row direction. For example, in FIGS. 7-4 and 7-5, rows of group 7-202 have an auxiliary bond pad 7-164 between adjacent signal bond pads 7-162a. Similarly, in some embodiments, the signal bond pads 7-162b and auxiliary bond pads 7-164 may be interspersed with one another along the row direction. For example, in FIGS. 7-4 and 7-5, rows of group 7-204 have an auxiliary bond pad 7-164 positioned between adjacent signal bond pads 7-162b.

FIG. 7-6 is a top view of routing and pixel layers of another example integrated device 7-600, according to some embodiments. In some embodiments, the integrated device 7-600 may be configured in the manner described herein for the integrated device 7-100. For example, in FIG. 7-6, the integrated device 7-600 is shown including pixels 7-622 arranged in an array having column and row directions. Also shown in FIG. 7-6, a first conductive line 7-632a is shown extending in the column direction on a first side of the illustrated pixels 6-622 and a second conductive line 7-632b is shown extending in the column direction on a second side of the illustrated pixels 7-622. For example, the first conductive line 7-632a is shown connected to the transfer gate ST0 of each adjacent pixel 7-622 by a via 7-626a to provide a control signal, and an auxiliary conductive line 7-634a extends in the row direction from the first conductive line 7-632a and branching off in the column direction to connect to the transfer gates ST0 of the pixels 7-622 that are not adjacent the first conductive line 7-632a. Similarly, in FIG. 7-6, the second conductive line 7-632b is shown connected to transfer gates REJ of each adjacent pixels 7-622 by a via 6-626b to provide a control signal, and auxiliary conductive lines 7-634b extending in the row direction and branching off in the column direction to reach the transfer gates ST0 of the pixels 7-622 that are not adjacent the second conductive line 7-632b.

Also shown in FIG. 7-6, the integrated device 7-600 includes a first signal bond pad 7-642a connected to the first conductive line 7-132a and a second signal bond pad 7-642b connected to the second conductive line 7-132b on an opposite corner of the pixels 7-622, as well as auxiliary bond pads 7-644 on the other opposite corners of the pixels 7-622.

FIG. 7-6 also shows a plurality of conductive lines configured to carry signals to other gates of the pixels 7-622. For example, conductive lines are shown in FIG. 7-6 carrying a ground potential $V_{BGND}$ for connecting to the photodetection regions PPD of the pixels 7-622, a drain potential $V_{REJ}$ for connecting to the drain regions D of the pixels 7-622, a row-select signal for connecting to the RS gates of the pixels 7-622, a power supply potential $V_{DDP}$ for connecting proximate the SF and RST gates of the pixels 7-622, a reset control signal $V_{RST}$ for connecting to the RST gates of the pixels, 7-622, and transfer control signal $V_{TX0}$ and $V_{TX1}$ for connecting to the transfer gates TX0 and TX1, respectively, of the pixels 7-622.

FIG. 7-7 is a top view of a photodetection wafer of the integrated device 7-600 illustrating additional ones of conductive lines 7-632a and 7-632b, according to some embodiments. As shown in FIG. 7-7, ones of the second conductive lines 7-632b are positioned between adjacent ones of the first conductive lines 7-632a and vice versa. Also shown in FIG. 7-6, the first signal bond pads 7-142a are connected to the first conductive lines 7-632a by first vias 7-636a and the second signal bond pads 7-142b are connected to the second conductive lines 7-632b by second vias 7-636b. In FIG. 7-6, the first vias 7-636a are spaced from the second vias 7-636b in the column direction so as to overlie or underlie different rows of pixels 7-622. The first vias 7-636a and the second vias 7-636b are also positioned consecutively in the column direction so as to form conductive lines that extend in the column direction. The first vias 7-636a overlie or underlie a first group 7-702 of rows of pixels 7-622 and the second vias overlie or underlie a second group 7-704 of rows of pixels 7-622.

FIG. 7-8 is a top view of a logic wafer of the integrated device 7-600, according to some embodiments. As shown in FIG. 7-8, the integrated device 7-600 further includes first conductive lines 7-674a and 7-674b connected to respective first signal bond pads 7-662a and second signal bond pads 7-662b for connecting to the first signal bond pads 7-642a and 7-642b, respectively. The integrated device 7-600 further includes auxiliary bond pads 7-664, which may be aligned with the auxiliary bond pads 7-644 when the photodetection wafer and logic wafer are bonded together.

In some embodiments, the first conductive lines 7-674a and the second conductive lines 7-674b may be spaced from one another in the column direction so as to overlie or underlie different rows of pixels 7-622. For example, as shown in FIGS. 7-7 and 7-8, the first conductive lines 7-674a overlie or underlie the first group 7-702 of rows of pixels 7-622 and the second conductive lines 7-674b overlie or underlie the second group 7-704 of rows of pixels 7-622.

Figures 1, 7:
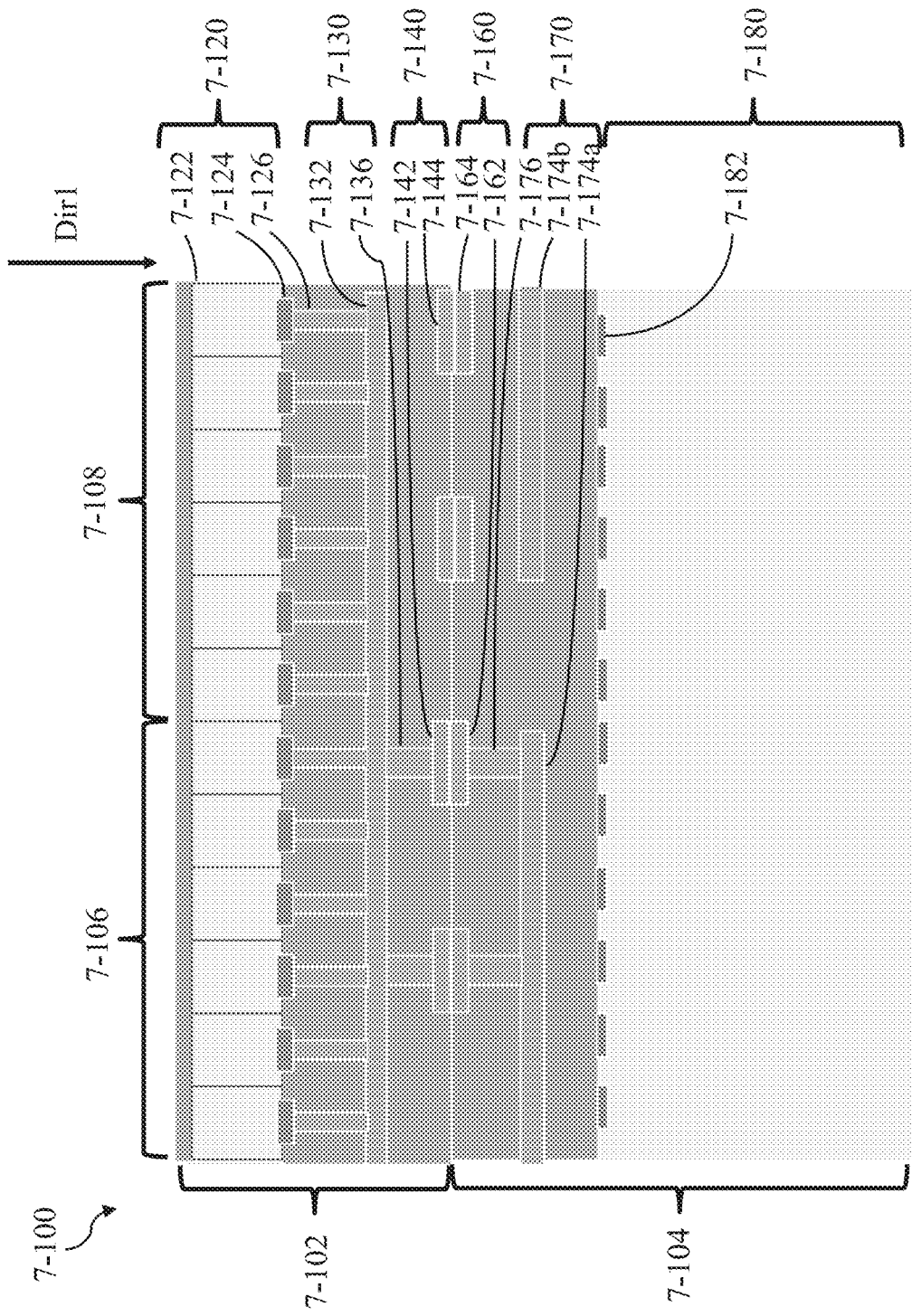
Figures 2, 7:
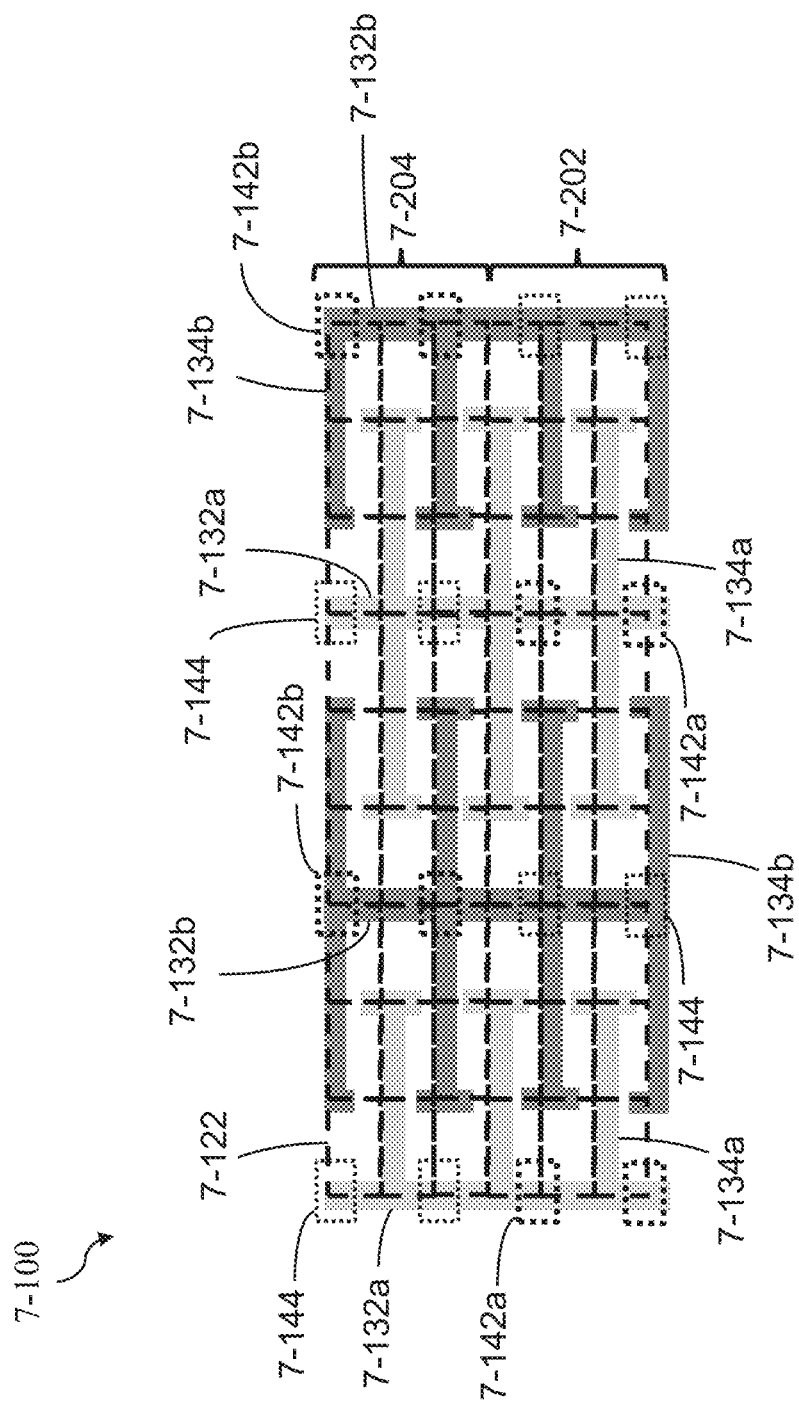
Figures 3, 7:
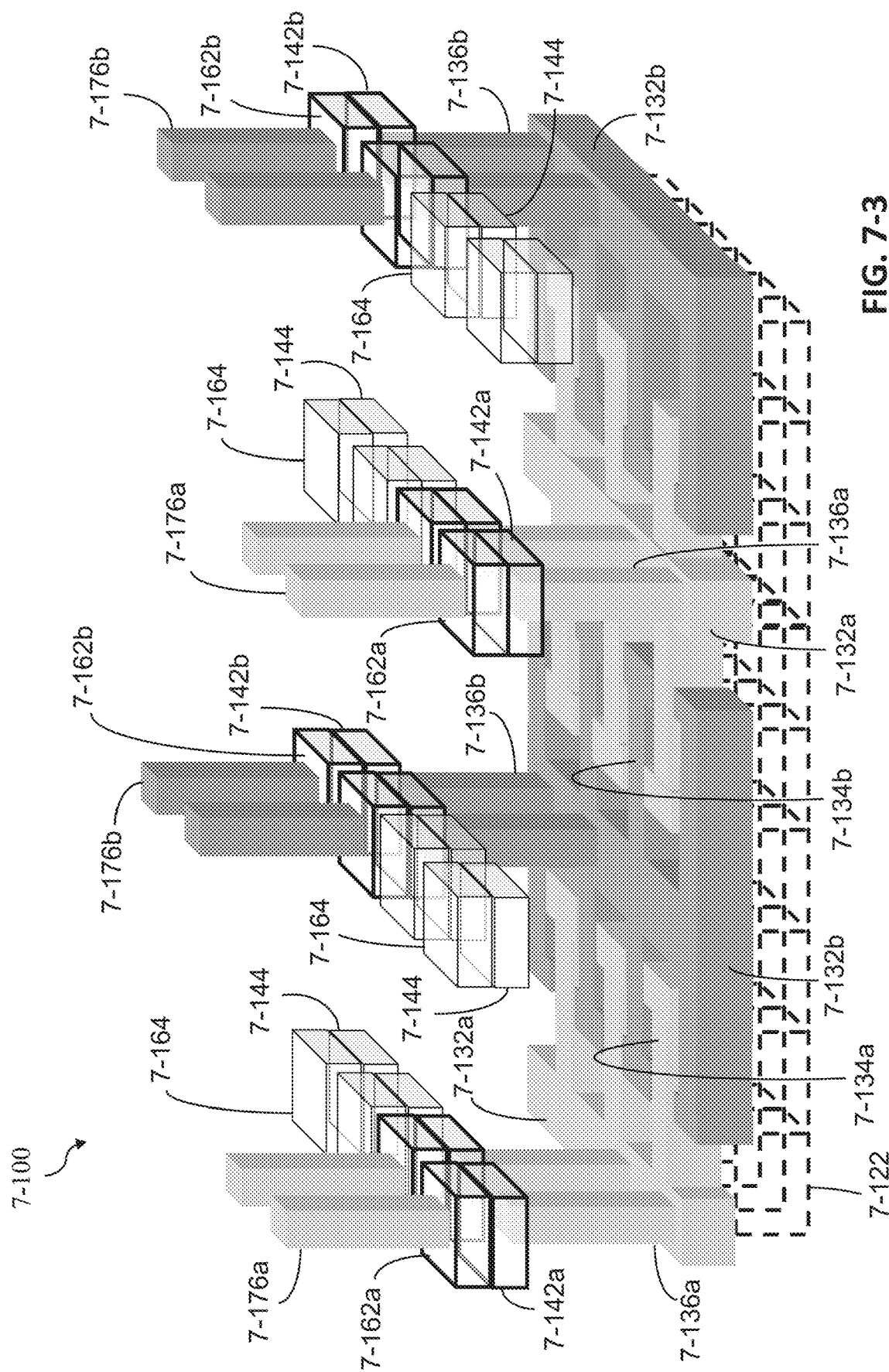
Figures 4, 7:
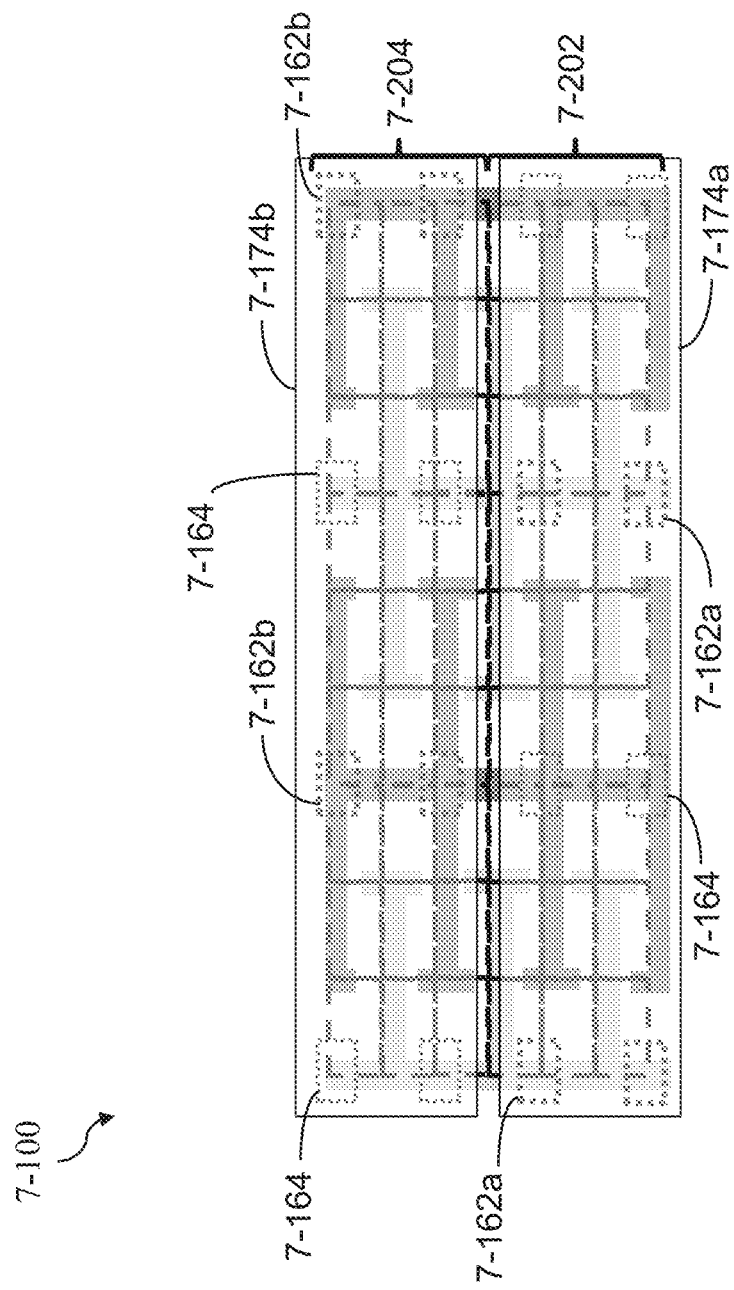
Figures 5, 7:
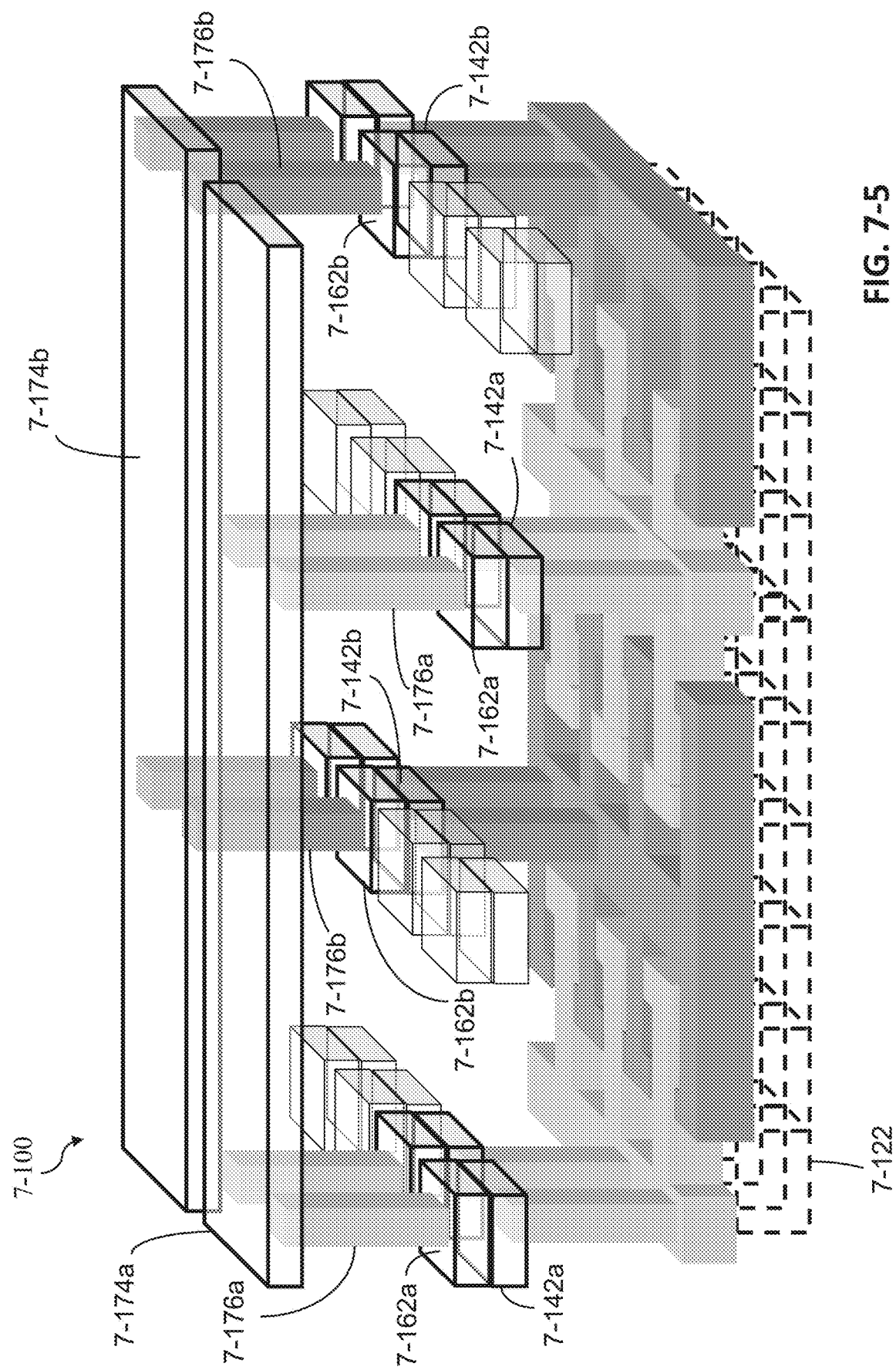
Figures 6, 7:
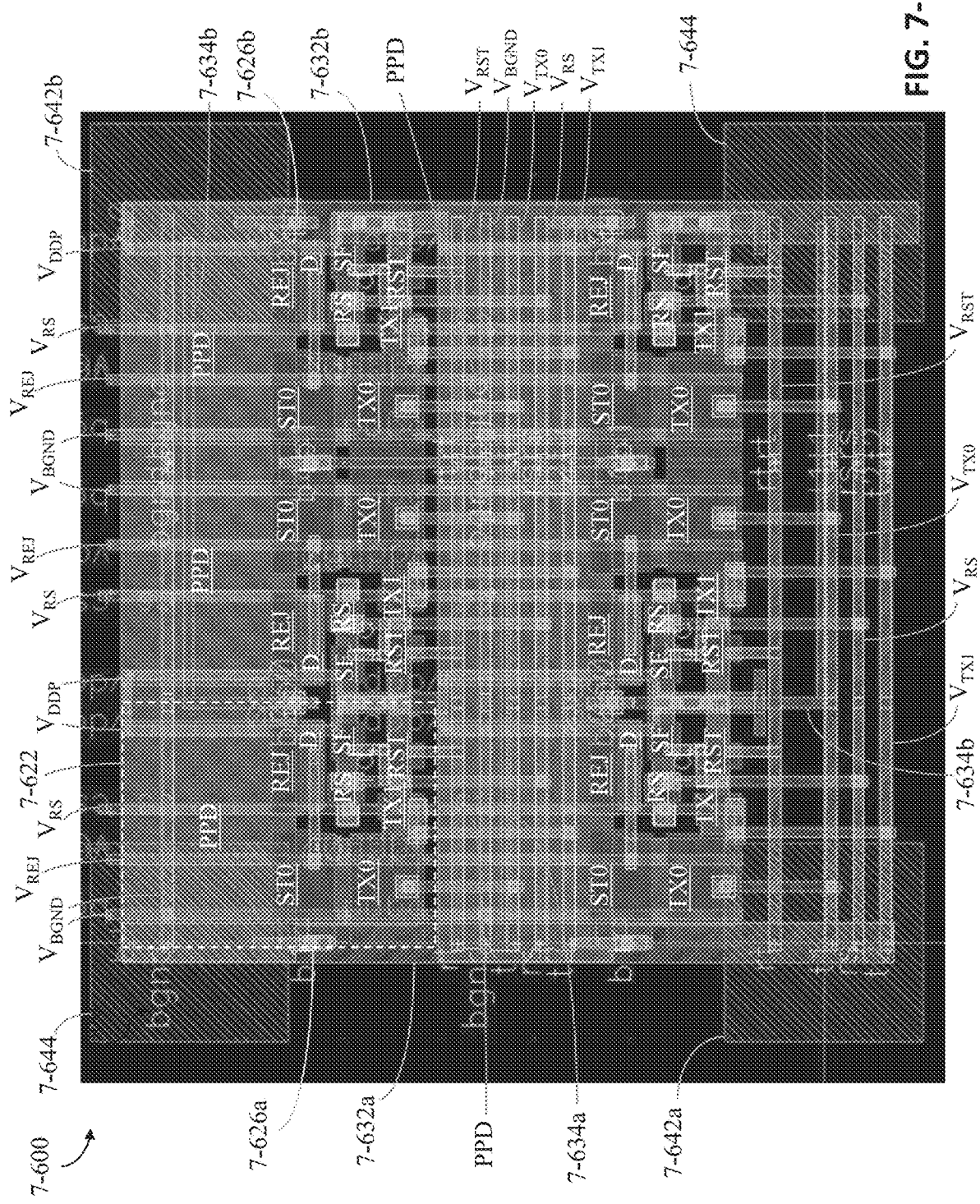
Figure 7:
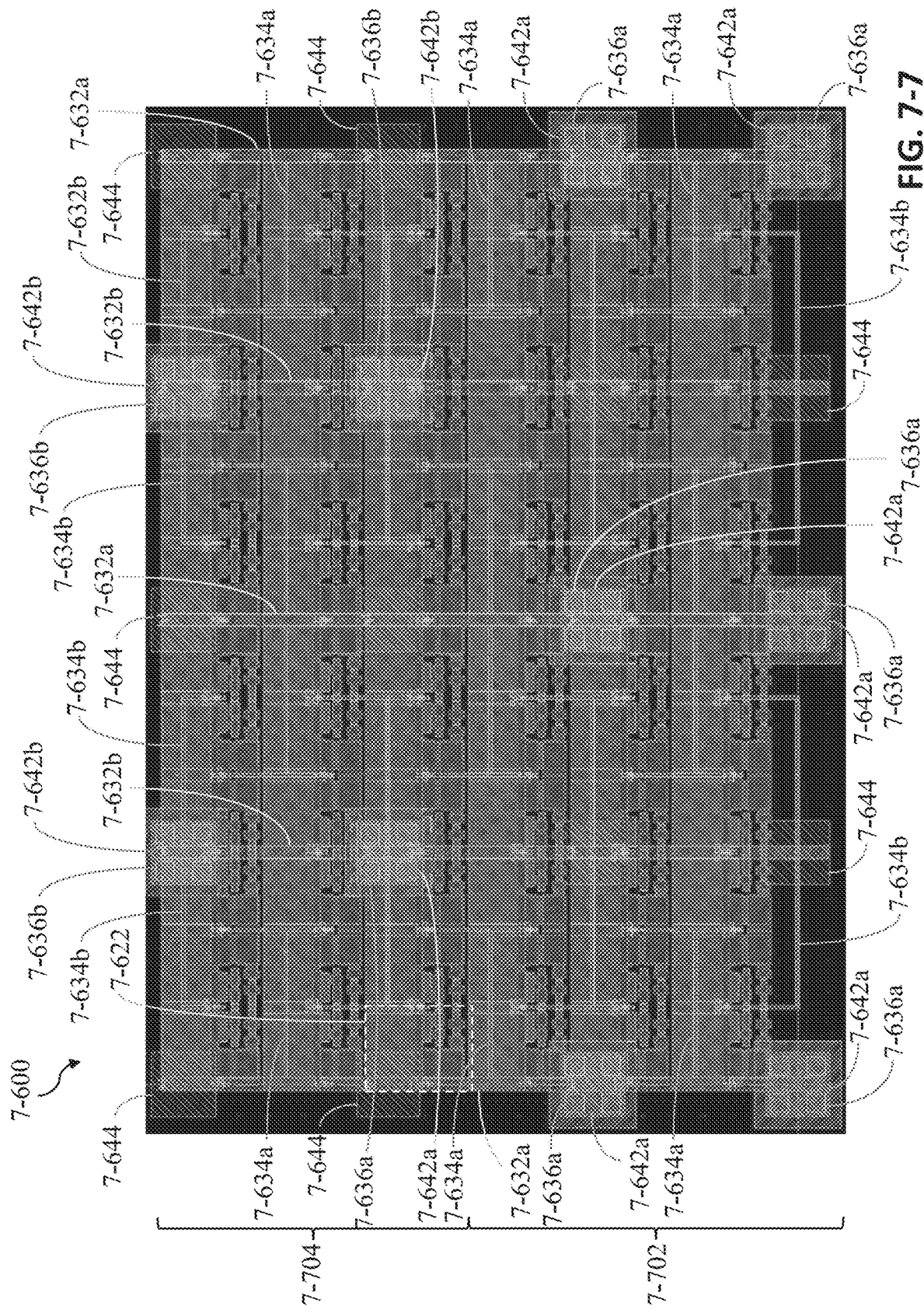
Figures 7, 8:
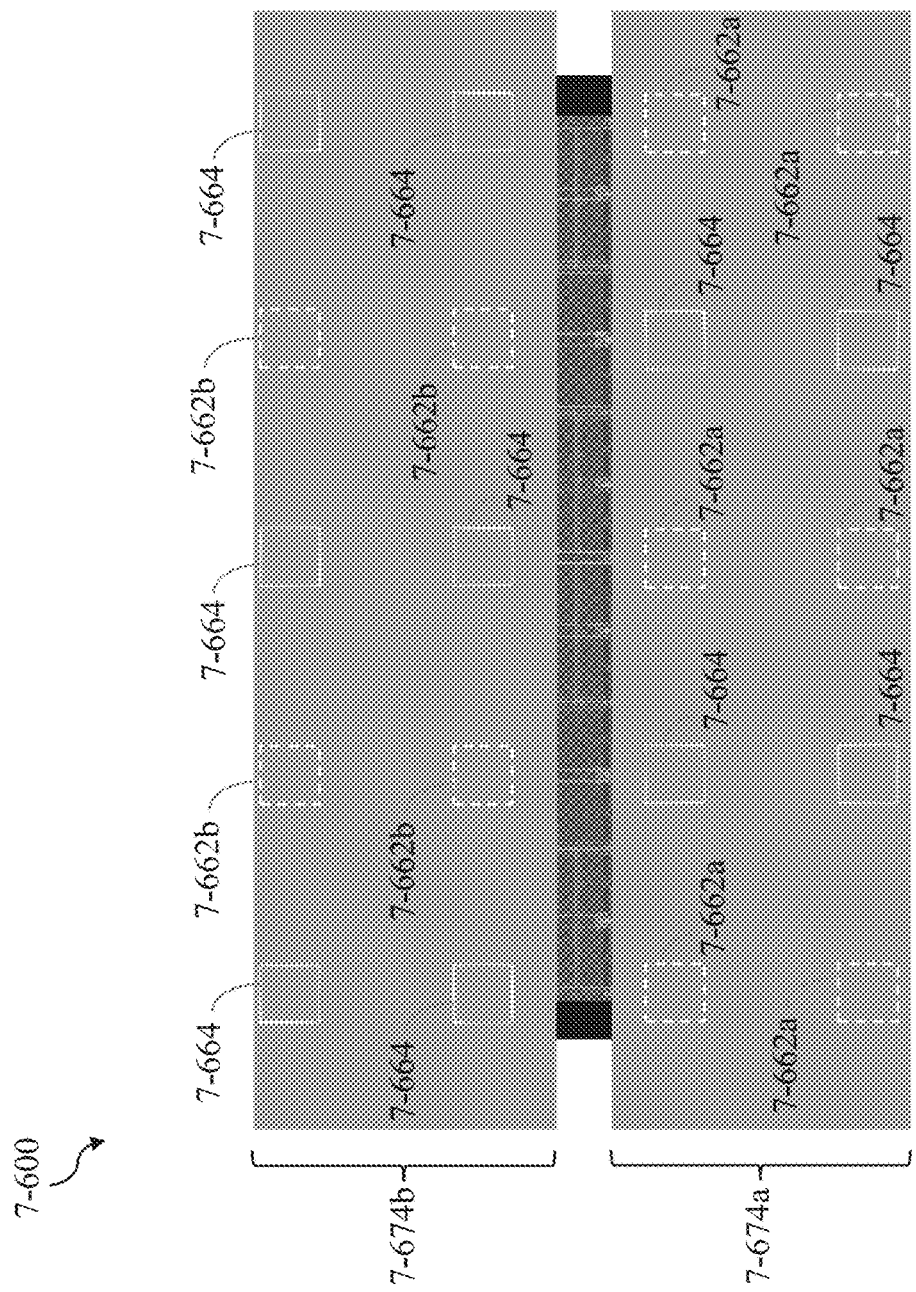
Figures 7, 8, 9:
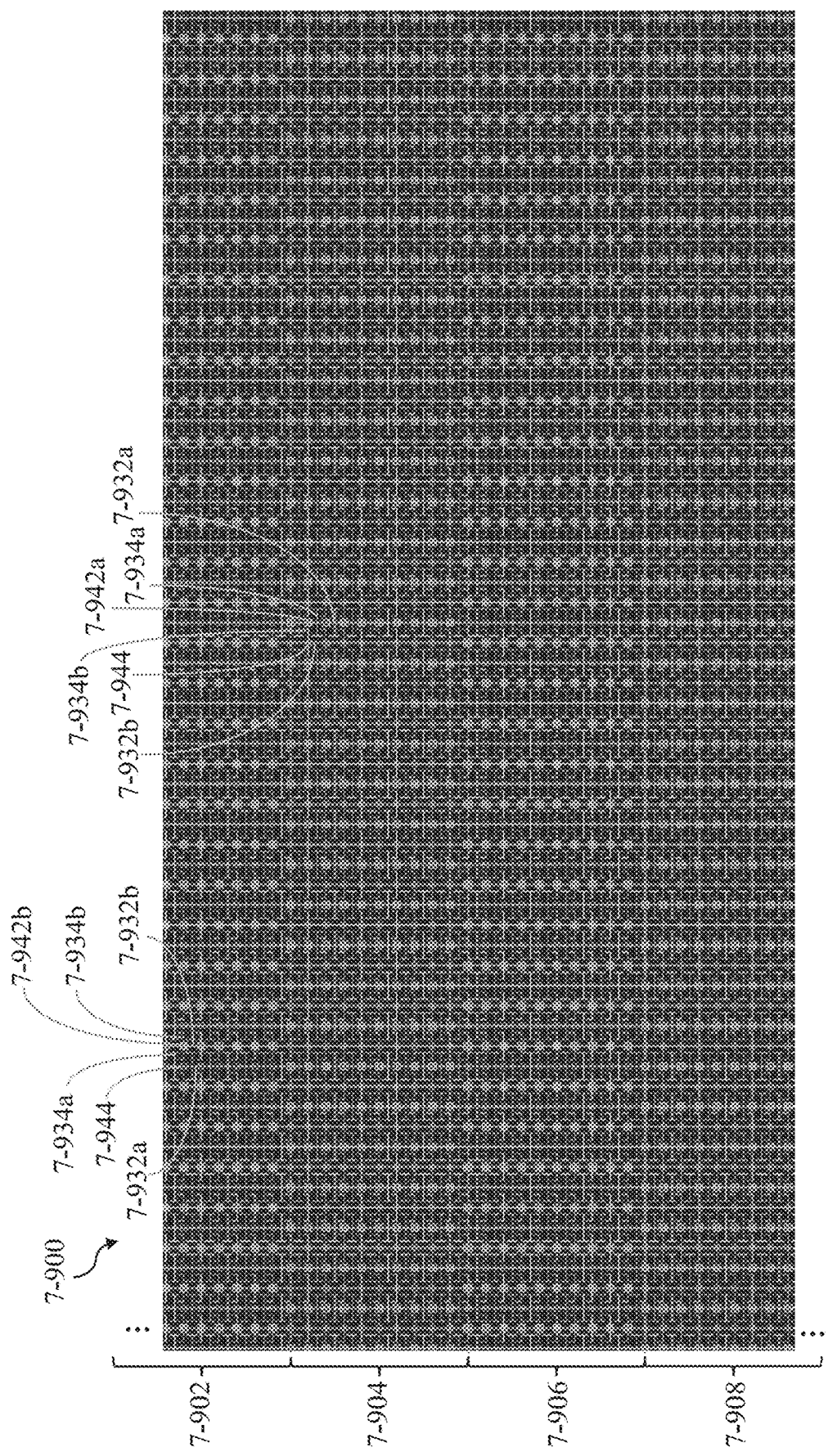
Figures 7, 8, 9, 10:
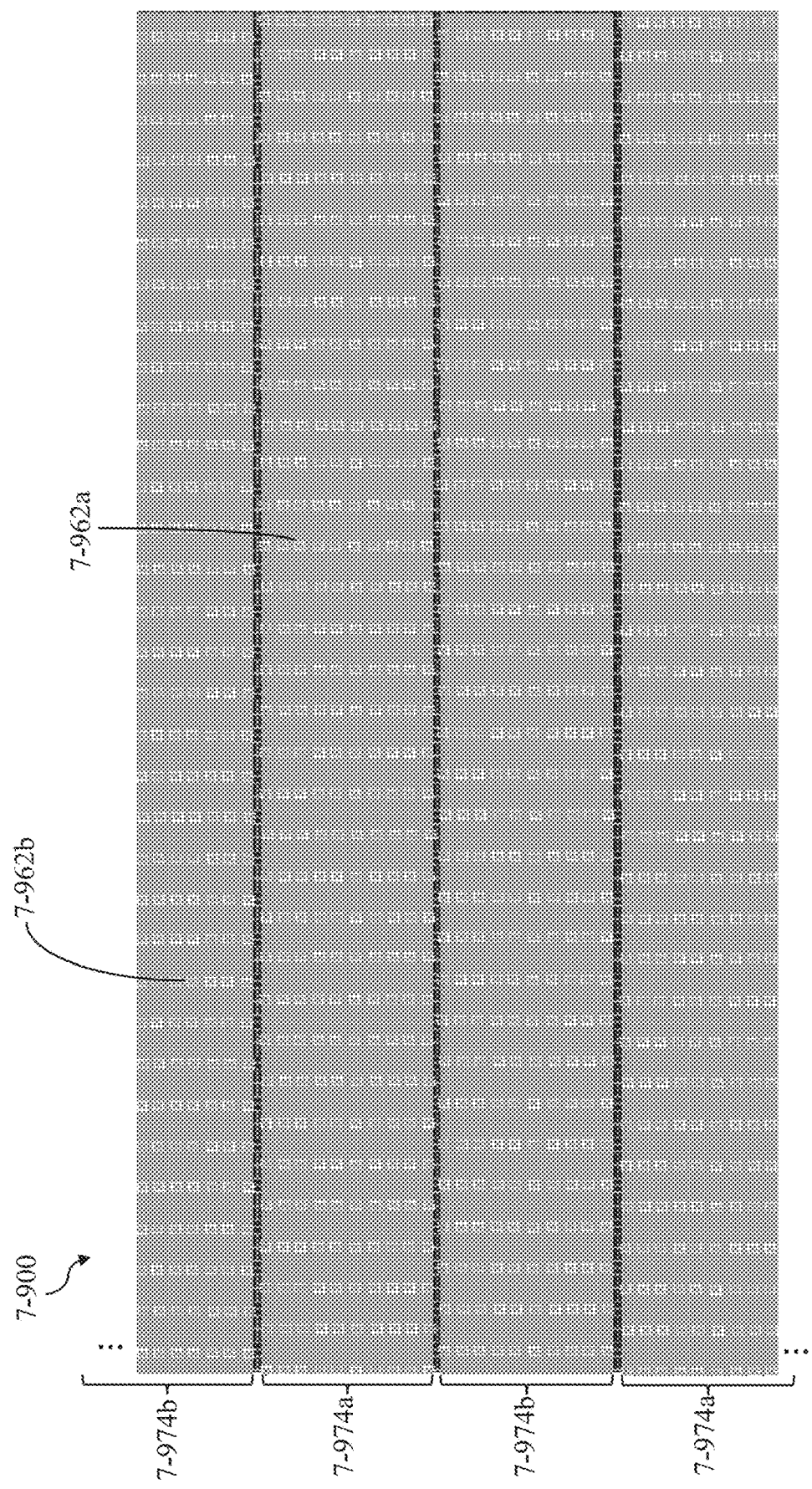
Figures 7, 8, 9, 10, 11:
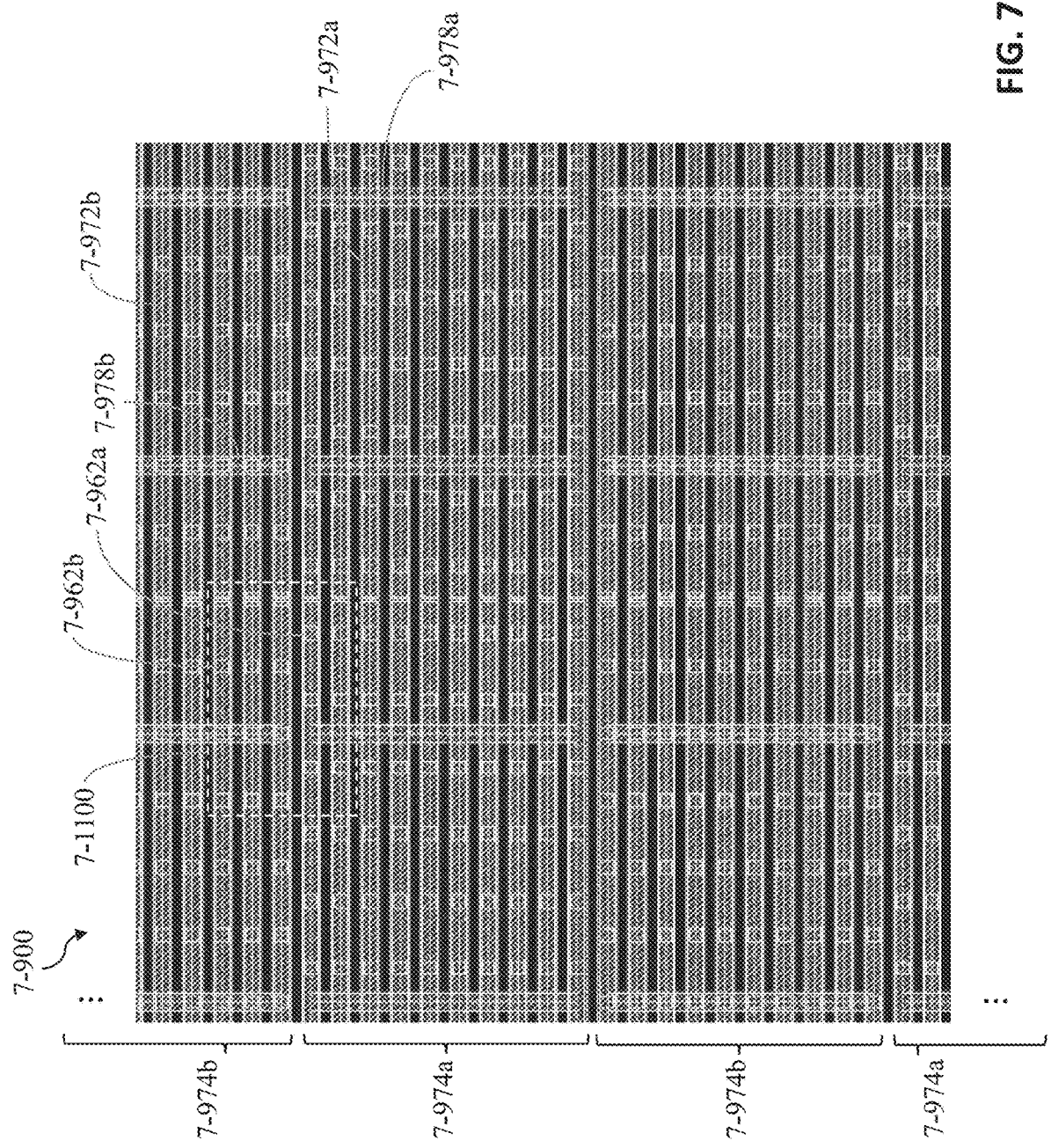
Figures 7, 8, 9, 10, 11, 12:
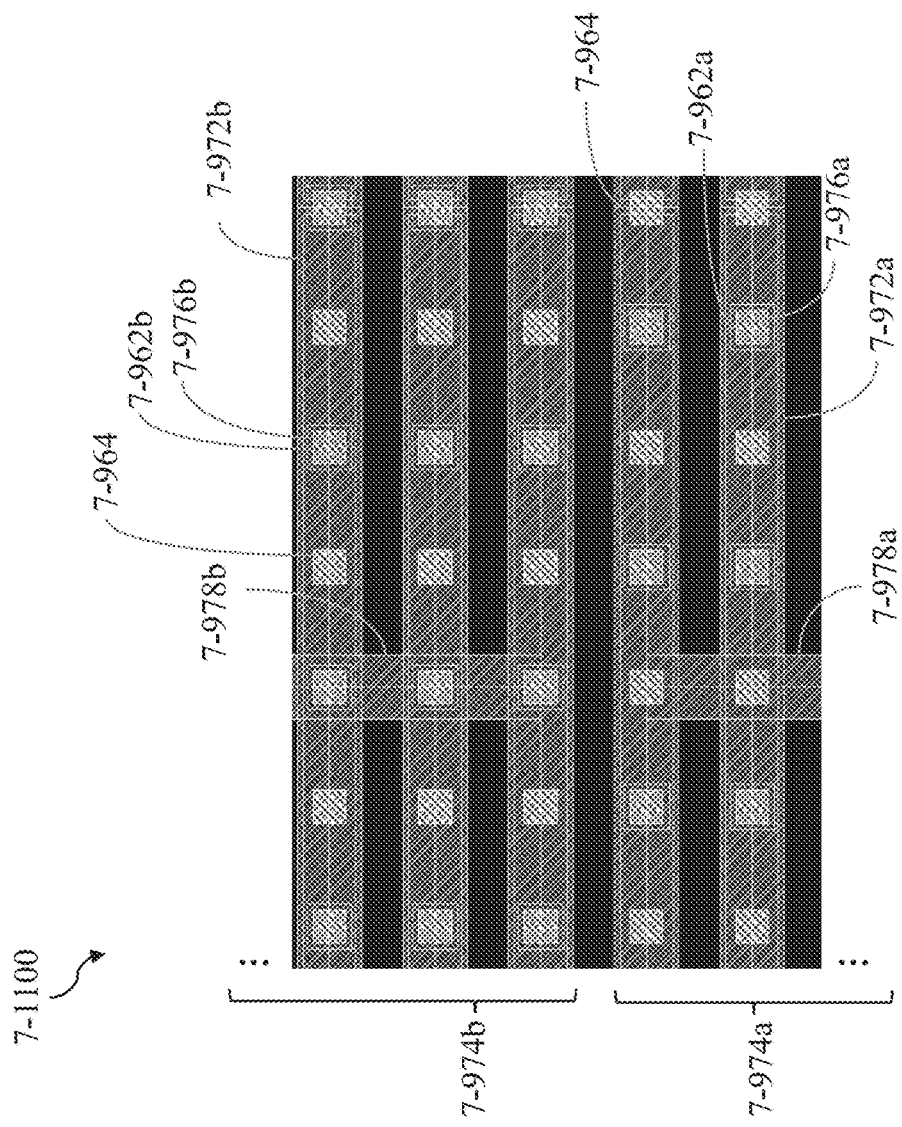
Figures 1, 8:
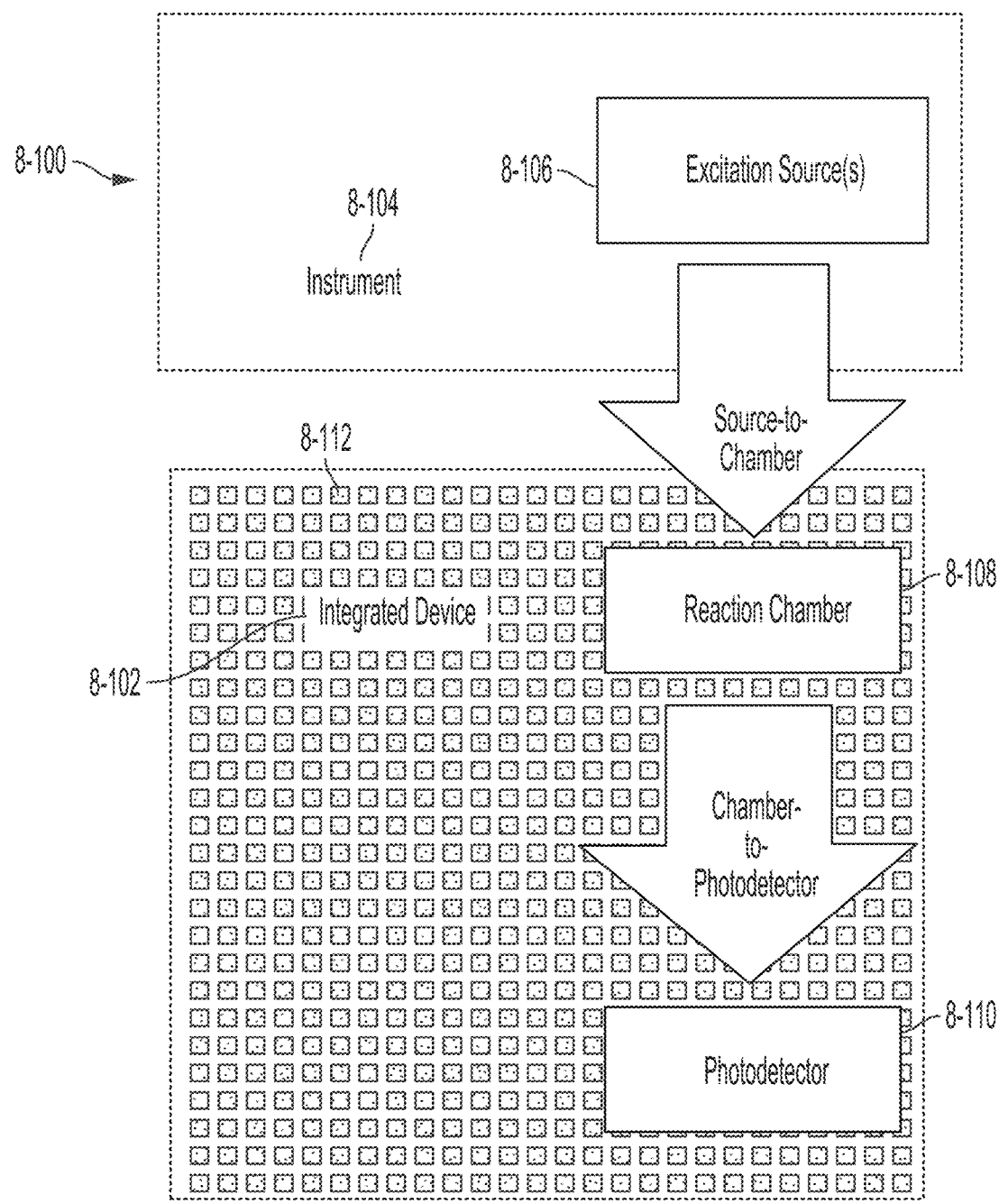
Figures 2, 8:
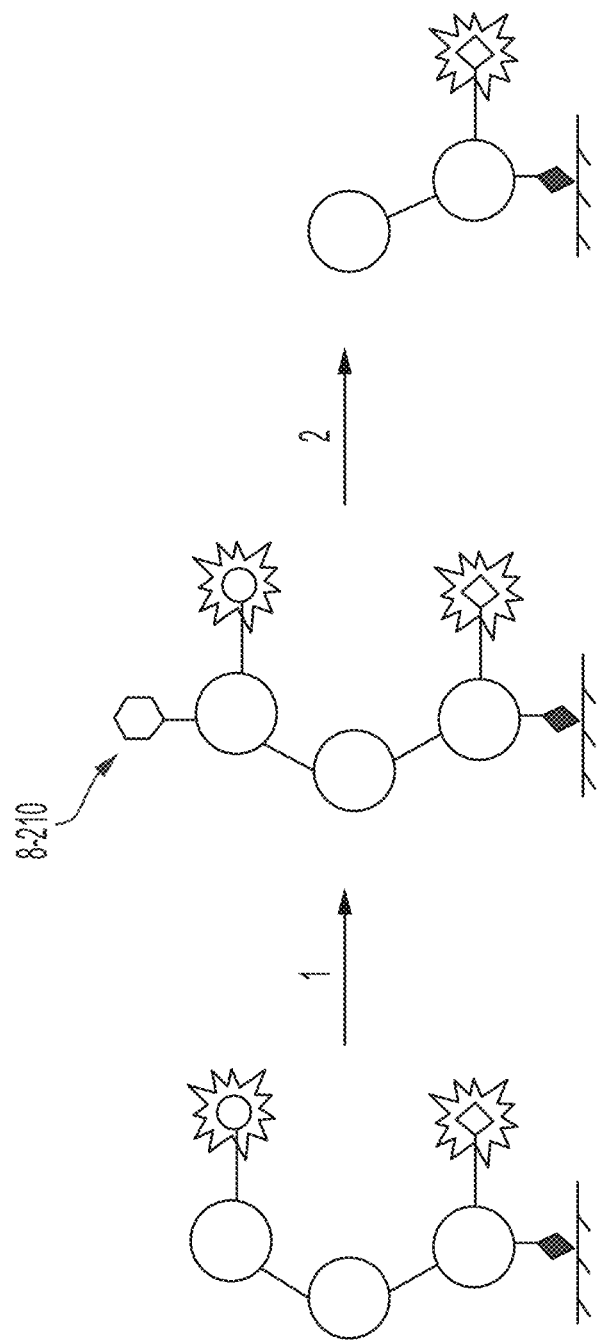
Figures 3, 8:
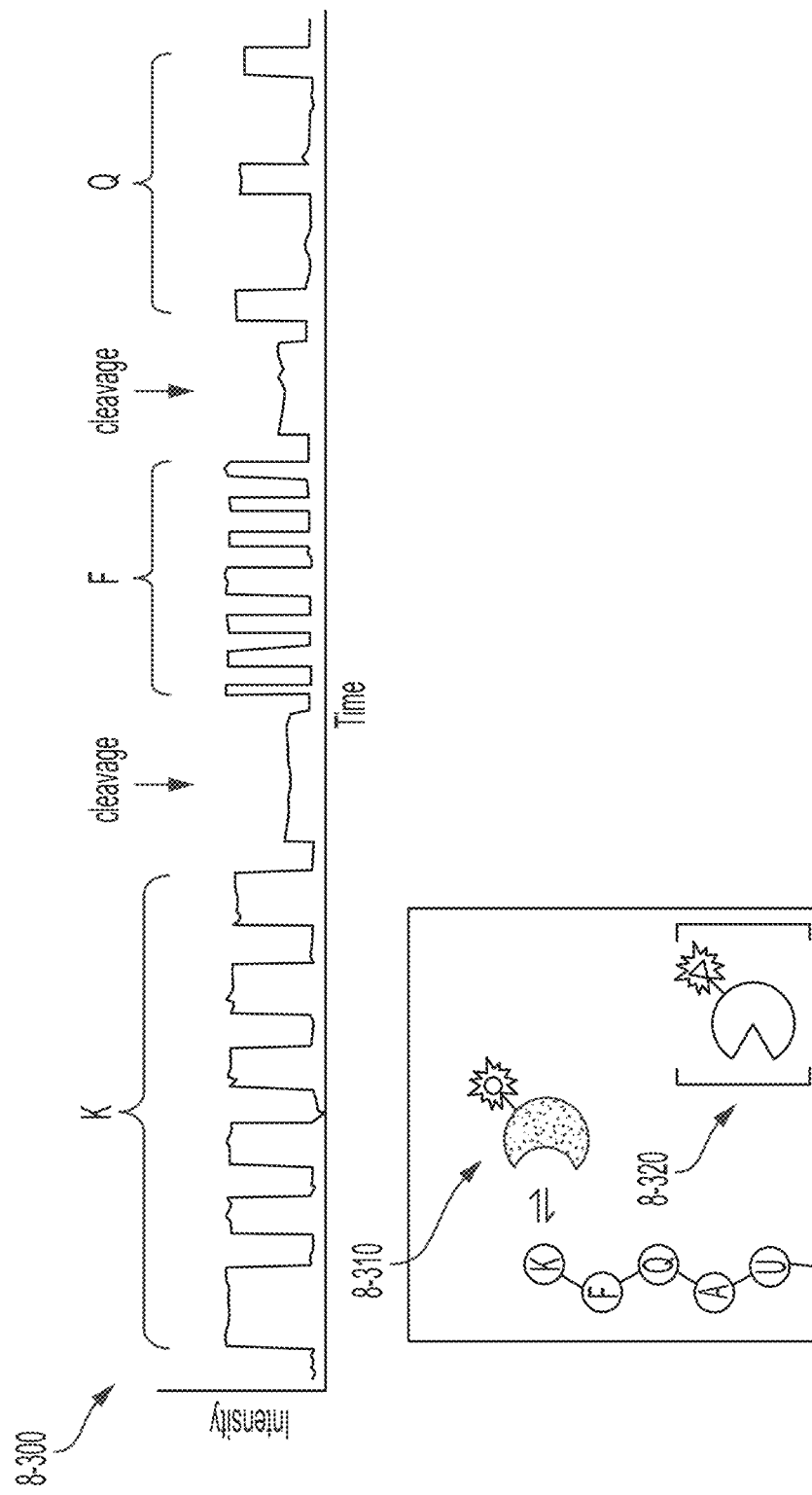

FIG. 7-9 is a top view of routing and bonding layers of a photodetection wafer of a further alternative integrated device 7-900, according to some embodiments. In some embodiments, the integrated device 7-900 may be configured in the manner described herein for the integrated devices 7-100 and 7-600, such as including a pixel array having a column direction and a row direction. For example, as shown in FIG. 7-9, the integrated device 7-900 includes first conductive lines 7-932a and second conductive lines 7-632b extending in the column direction, with ones of the second conductive lines 7-632b positioned between adjacent ones of the first conductive lines 7-932a and vice versa.

Also shown in FIG. 7-9, the first conductive lines 7-932a are connected to auxiliary conductive lines 7-934a to provide a control signal to pixels that are not adjacent the first conductive lines 7-932a, and the second conductive lines 7-932b are connected to auxiliary conductive lines 7-934b to provide a control signal to pixels that are not adjacent the second conductive lines 7-932b.

Also shown in FIG. 7-9, the first conductive lines 7-932a are connected to first signal bond pads 7-942a and the second conductive lines 7-932b are connected to second signal bond pads 7-942b. The first signal bond pads 7-942a (and/or vias connected thereto) may be spaced from the second signal bond pads 7-942b in the column direction so as to overlie or underlie different rows of pixels. For example, in FIG. 7-9, the integrated device 7-900 may be divided among groups 7-902, 7-904, 7-906, and 7-908 of rows of pixels, with the first signal bond pads 7-942a (and/or vias connected thereto) overlying or underlying groups 7-904 and 7-908 of rows of pixels and with the second signal bond pads 7-942b (and/or vias connected thereto) overlying or underlying groups 7-902 and 7-906 of rows of pixels.

FIG. 7-10 is a top view of a logic wafer of the integrated device 7-900, according to some embodiments. As shown in FIG. 7-10, the integrated device 7-900 includes first conductive lines 7-974a and second conductive lines 7-974b connected to first signal bond pads 7-962a and second signal bond pads 7-962b, respectively, for connecting to the first signal bond pads 7-942a and the second signal bond pads 7-942b, respectively. In some embodiments, the first conductive lines 7-974a and the second conductive lines 7-974b may be spaced from one another as to overlie or underlie different rows of pixels. For example, as shown in FIGS. 7-9 and 7-10, the first conductive lines 7-974a overlie or underlie groups 7-904 and 7-908 of rows of pixels, whereas the second conductive lines 7-974b overlie or underlie groups 7-902 and 7-906 of rows of pixels. Also shown in FIG. 7-10, the first conductive lines 7-974a and the second conductive lines 7-974b may be divided, in the column direction, among groups of conductive lines, with groups of the first conductive lines 7-974a positioned between adjacent groups of the second conductive lines 7-974b, and vice versa.

FIG. 7-11 is a partial bottom view of the logic wafer of the integrated device 7-900, according to some embodiments. As shown in FIG. 7-11, the first conductive lines 7-974a can include lines 7-972a extending substantially parallel to one another and lines 7-978a extending substantially parallel to one another and transversely to the lines 7-972a, with each of the first conductive lines 7-974a within each group interconnected to be in electrical communication with one another. Similarly, as shown in FIG. 7-11, the second conductive lines 7-974b include lines 7-972b extending substantially parallel to one another and lines 7-978b extending substantially parallel to one another and transversely to the lines 7-972b, with each of the second conductive lines 7-974b interconnected within each group to be in electrical communication with one another. For example, the lines 7-972a and 7-972b may extend along the row direction and/or the lines 7-978a and 7-978b may extend along the column direction. In some embodiments, ones of the lines 7-972a (and/or 7-972b) may be spaced from one another and/or from ones of the lines 7-978a (and/or 7-978b) as needed to accommodate a given manufacturing process. For instance, in some manufacturing processes, the lines may need to be sized and/or separated by at least a predefined distance (e.g., with nonconductive material in between) to prevent forming a continuous conductive area susceptible to variation in depth (e.g., due to a meniscus formed at the surface of a continuous metal area). As shown in FIG. 7-11, the lines 7-972a and 7-978a of the first conductive lines 7-974a may be spaced from the lines 7-972b and 7-978b of the second conductive lines 7-974b so as to electrically separate the first conductive lines 7-974a from the second conductive lines 7-974b.

FIG. 7-12 is a magnified bottom view of a portion 7-1100 of the logic wafer of the integrated device 7-900, according to some embodiments. As shown in FIG. 7-12, the first signal bond pads 7-962a are connected to the lines 7-972a and 7-978a by first vias 7-976a for connecting to the photodetection wafer. Similarly, the second signal bond pads 7-962b are connected to the lines 7-972b and 7-978b for connecting to the photodetection wafer. FIG. 7-12 also shows auxiliary bond pads 7-964, which may be aligned with auxiliary bond pads 7-944 when the logic wafer and photodetection wafer of the integrated device 7-900 are bonded together.

A. Example Control Signal Configurations

The mirrored pixel configurations and/or conductive structures described herein can be used to provide one or more control signals to one or more pixel components. The one or more control signals can be provided to components of one or more pixels (e.g., to one pixel, to neighboring pixels, pixels along a same row, pixels along a same column, etc.). In accordance with various embodiments, control signals (e.g., square wave control signals, sinusoidal control signals, etc.) may be configured to drive one or more transfer gates, a transfer gate and a drain gate, one or more drain gates, and/or other pixel components. In one example, a first control signal may be configured to bias one charge transfer channel to facilitate propagation of charge carriers from a photodetection region coupled to the charge transfer channel while a second control signal may be configured to bias another charge transfer channel to create an electrostatic potential barrier, preventing charge carriers from propagating from the photodetection region to the respective charge transfer channel. In an alternative example, the second control signal may be configured to bias a drain gate to facilitate propagating charge carriers from the photodetection region to a drain channel. In some embodiments, one control signal (e.g., having a shorter duty cycle) may be configured (e.g., timed, phase-shifted, etc.) to drain excitation charge carriers from the photodetection region at the beginning of an excitation pulse, and a second control signal (e.g., having a longer duty cycle) may be configured (e.g., timed, phase-shifted, etc.) to transfer fluorescent emission charge carriers from the photodetection region during a collection period following the drain period.

In some embodiments, a first transfer gate between a photodetection region and a charge storage region may be configured to receive one of the control signals and a second transfer gate between the photodetection region and another charge storage region may be configured to receive another control signal. In some embodiments, a drain gate between the photodetection region and a drain region may alternatively or additionally be configured to receive a control signal. Accordingly, draining and accumulation of charge carriers responsive to incident photons may be controlled using the control signals. For instance, a charge storage region or drain region may accumulate or drain charge carriers when the control signal corresponding to that charge storage region or drain gate has a high voltage, thus increasing the conductivity of the charge transfer or drain channel above or below the transfer gate or drain gate. It should be appreciated that, in some embodiments, biasing a transfer gate or drain gate with a low voltage may increase the conductivity of the charge transfer channel or drain channel.

In some embodiments, the DC offset and/or difference in control signal amplitudes may be configured such that the duration of charge carrier collection in the charge storage region(s) (and/or drain region) may be different. For instance, one charge storage region may collect for a longer time period than the other charge storage region. Alternatively or additionally, charge carriers may be drained to a drain region for a shorter time period than a charge storage region collection period. In one example, the charge transfer channel(s) and/or drain channel corresponding to the transfer gate(s) and/or drain gate that receive the control signals may have a same threshold voltage level for beginning charge transfer and/or draining. Accordingly, in this example, a control signal having a higher amplitude than another control signal may spend more time at a voltage higher than the threshold voltage level than the other control signal, which may cause the transfer and/or drain period set by the higher amplitude control signal to be longer than the other transfer and/or drain period set by the other control signal. In some embodiments, the DC offset level of the control signals may be configured based on the threshold voltage level(s). In some embodiments, the charge transfer and/or drain channel(s) may have different threshold voltage levels, and/or the threshold voltage levels may be configured such that lower amplitude control signals correspond to longer transfer and/or drain periods. In some embodiments, two charge storage regions may be configured to accumulate fluorescent emission charge carriers indicative of different fluorescence lifetime information. For instance, different timing and/or durations of charge accumulation may facilitate discrimination among charge carriers indicating different lifetime information.

In some embodiments, a first transfer gate between a photodetection region and a charge storage region may be configured to receive one control signal, a second transfer gate between the photodetection region and another charge storage region may be configured to receive a second control signal, a third transfer or drain gate may be configured to receive a third control signal, and so on. In some embodiments, a second drain gate may be alternatively or additionally be configured to receive one of the control signals. Accordingly, draining and accumulation of charge carriers responsive to incident photons may be controlled using the control signals.

VI. Example Applications

A. DNA and/or RNA Sequencing Applications

An analytic system described herein may include an integrated device and an instrument configured to interface with the integrated device. The integrated device may include an array of pixels, where a pixel includes a reaction chamber (e.g., sample well) and at least one photodetector. A surface of the integrated device may have a plurality of reaction chambers, where a reaction chamber is configured to receive a sample from a suspension placed on the surface of the integrated device. A suspension may contain multiple samples of a same type, and in some embodiments, different types of samples. In this regard, the phrase "sample of interest" as used herein can refer to a plurality of samples of a same type that are dispersed in a suspension, for example. Similarly, the phrase "molecule of interest" as used herein can refer to a plurality of molecules of a same type that are dispersed in a suspension. The plurality of reaction chambers may have a suitable size and shape such that at least a portion of the reaction chambers receive one sample from a suspension. In some embodiments, the number of samples within a reaction chamber may be distributed among the reaction chambers such that some reaction chambers contain one sample with others contain zero, two or more samples.

In some embodiments, a suspension may contain multiple single-stranded DNA templates, and individual reaction chambers on a surface of an integrated device may be sized and shaped to receive a sequencing template. Sequencing templates may be distributed among the reaction chambers of the integrated device such that at least a portion of the reaction chambers of the integrated device contain a sequencing template. The suspension may also contain labeled nucleotides which then enter in the reaction chamber and may allow for identification of a nucleotide as it is incorporated into a strand of DNA complementary to the single-stranded DNA template in the reaction chamber. In some embodiments, the suspension may contain sequencing templates and labeled nucleotides may be subsequently introduced to a reaction chamber as nucleotides are incorporated into a complementary strand within the reaction chamber. In this manner, timing of incorporation of nucleotides may be controlled by when labeled nucleotides are introduced to the reaction chambers of an integrated device.

Excitation light is provided from an excitation source located separate from the pixel array of the integrated device. The excitation light is directed at least in part by elements of the integrated device towards one or more pixels to illuminate an illumination region within the reaction chamber. A marker may then emit emission light when located within the illumination region and in response to being illuminated by excitation light. In some embodiments, one or more excitation sources are part of the instrument of the system where components of the instrument and the integrated device are configured to direct the excitation light towards one or more pixels.

Emission light emitted from a reaction chamber (e.g., by a fluorescent label) may then be detected by one or more photodetectors within a pixel of the integrated device. Characteristics of the detected emission light may provide an indication for identifying the marker associated with the emission light. Such characteristics may include any suitable type of characteristic, including an arrival time of photons detected by a photodetector, an amount of photons accumulated over time by a photodetector, and/or a distribution of photons across two or more photodetectors. In some embodiments, a photodetector may have a configuration that allows for the detection of one or more timing characteristics associated with emission light (e.g., fluorescence lifetime). The photodetector may detect a distribution of photon arrival times after a pulse of excitation light propagates through the integrated device, and the distribution of arrival times may provide an indication of a timing characteristic of the emission light (e.g., a proxy for fluorescence lifetime). In some embodiments, the one or more photodetectors provide an indication of the probability of emission light emitted by the marker (e.g., fluorescence intensity). In some embodiments, a plurality of photodetectors may be sized and arranged to capture a spatial distribution of the emission light. Output signals from the one or more photodetectors may then be used to distinguish a marker from among a plurality of markers, where the plurality of markers may be used to identify a sample or its structure. In some embodiments, a sample may be excited by multiple excitation energies, and emission light and/or timing characteristics of the emission light from the reaction chamber in response to the multiple excitation energies may distinguish a marker from a plurality of markers.

A schematic overview of the system 8-100 is illustrated in FIG. 8-1. The system comprises both an integrated device 8-102 that interfaces with an instrument 8-104. In some embodiments, instrument 8-104 may include one or more excitation sources 8-106 integrated as part of instrument 8-104. In some embodiments, an excitation source may be external to both instrument 8-104 and integrated device 8-102, and instrument 8-104 may be configured to receive excitation light from the excitation source and direct excitation light to the integrated device 8-102. The integrated device 8-102 may interface with the instrument using any suitable socket for receiving the integrated device and holding it in precise optical alignment with the excitation source. The excitation source 8-106 may be configured to provide excitation light to the integrated device 8-102. As illustrated schematically in FIG. 8-1, the integrated device 8-102 has a plurality of pixels 8-112, where at least a portion of pixels may perform independent analysis of a sample of interest. Such pixels 8-112 may be referred to as "passive source pixels" since a pixel receives excitation light from a source 8-106 separate from the pixel, where excitation light from the source excites some or all of the pixels 8-112. Excitation source 8-106 may be any suitable light source. Examples of suitable excitation sources are described in U.S. patent application Ser. No. 14/821,688, filed Aug. 7, 2015, titled "INTEGRATED DEVICE FOR PROBING, DETECTING AND ANALYZING MOLECULES," which is incorporated by reference in its entirety. In some embodiments, excitation source 8-106 includes multiple excitation sources that are combined to deliver excitation light to integrated device 8-102. The multiple excitation sources may be configured to produce multiple excitation energies or wavelengths.

A pixel 8-112 has a reaction chamber 8-108 configured to receive a single sample of interest and a photodetector 8-110 for detecting emission light emitted from the reaction chamber in response to illuminating the sample and at least a portion of the reaction chamber 8-108 with excitation light provided by the excitation source 8-106. In some embodiments, reaction chamber 8-108 may retain the sample in proximity to a surface of integrated device 8-102, which may ease delivery of excitation light to the sample and detection of emission light from the sample or a reaction component (e.g., a labeled nucleotide).

Optical elements for coupling excitation light from excitation light source 8-106 to integrated device 8-102 and guiding excitation light to the reaction chamber 8-108 are located both on integrated device 8-102 and the instrument 8-104. Source-to-chamber optical elements may comprise one or more grating couplers located on integrated device 8-102 to couple excitation light to the integrated device and waveguides to deliver excitation light from instrument 8-104 to reaction chambers in pixels 8-112. One or more optical splitter elements may be positioned between a grating coupler and the waveguides. The optical splitter may couple excitation light from the grating coupler and deliver excitation light to at least one of the waveguides. In some embodiments, the optical splitter may have a configuration that allows for delivery of excitation light to be substantially uniform across all the waveguides such that each of the waveguides receives a substantially similar amount of excitation light. Such embodiments may improve performance of the integrated device 8-102 by improving the uniformity of excitation light received by reaction chambers 8-108 of the integrated device 8-102.

Reaction chamber 8-108, a portion of the excitation source-to-chamber optics, and the reaction chamber-to-photodetector optics are located on integrated device 8-102. Excitation source 8-106 and a portion of the source-to-chamber components are located in instrument 8-104. In some embodiments, a single component may play a role in both coupling excitation light to reaction chamber 8-108 and delivering emission light from reaction chamber 8-108 to photodetector 8-110. Examples of suitable components, for coupling excitation light to a reaction chamber and/or directing emission light to a photodetector, to include in an integrated device are described in U.S. patent application Ser. No. 14/821,688, filed Aug. 7, 2015, titled "INTEGRATED DEVICE FOR PROBING, DETECTING AND ANALYZING MOLECULES," and U.S. patent application Ser. No. 14/543,865, filed Nov. 17, 2014, titled "INTEGRATED DEVICE WITH EXTERNAL LIGHT SOURCE FOR PROBING, DETECTING, AND ANALYZING MOLECULES," both of which are incorporated by reference in their entirety.

Pixel 8-112 is associated with its own individual reaction chamber 8-108 and at least one photodetector 8-110. The plurality of pixels of integrated device 8-102 may be arranged to have any suitable shape, size, and/or dimensions. Integrated device 8-102 may have any suitable number of pixels. The number of pixels in integrated device 8-102 may be in the range of approximately 10,000 pixels to 1,000,000 pixels or any value or range of values within that range. In some embodiments, the pixels may be arranged in an array of 512 pixels by 512 pixels. Integrated device 8-102 may interface with instrument 8-104 in any suitable manner. In some embodiments, instrument 8-104 may have an interface that detachably couples to integrated device 8-102 such that a user may attach integrated device 8-102 to instrument 8-104 for use of integrated device 8-102 to analyze at least one sample of interest in a suspension and remove integrated device 8-102 from instrument 8-104 to allow for another integrated device to be attached. The interface of instrument 8-104 may position integrated device 8-102 to couple with circuitry of instrument 8-104 to allow for readout signals from one or more photodetectors to be transmitted to instrument 8-104. Integrated device 8-102 and instrument 8-104 may include multi-channel, high-speed communication links for handling data associated with large pixel arrays (e.g., more than 10,000 pixels).

In operation, parallel analyses of samples within the reaction chambers are carried out by exciting some or all of the samples within the reaction chambers using excitation light and detecting signals with the photodetectors that are representative of emission light from the reaction chambers. Emission light from a sample or reaction component (e.g., fluorescent label) may be detected by a corresponding photodetector and converted to at least one electrical signal. The electrical signals may be transmitted along conducting lines (e.g., conductive lines described herein) in the circuitry of the integrated device, which may be connected to an instrument interfaced with the integrated device. The electrical signals may be subsequently processed and/or analyzed. Processing or analyzing of electrical signals may occur on a suitable computing device either located on or off the instrument.

B. Protein Sequencing Applications

Some aspects of the present disclosure may be useful for protein sequencing. For example, some aspects of the present disclosure are useful for determining amino acid sequence information from polypeptides (e.g., for sequencing one or more polypeptides). In some embodiments, amino acid sequence information can be determined for single polypeptide molecules. In some embodiments, one or more amino acids of a polypeptide are labeled (e.g., directly or indirectly) and the relative positions of the labeled amino acids in the polypeptide are determined. In some embodiments, the relative positions of amino acids in a protein are determined using a series of amino acid labeling and cleavage steps.

In some embodiments, the identity of a terminal amino acid (e.g., an N-terminal or a C-terminal amino acid) is assessed, after which the terminal amino acid is removed and the identity of the next amino acid at the terminus is assessed, and this process is repeated until a plurality of successive amino acids in the polypeptide are assessed. In some embodiments, assessing the identity of an amino acid comprises determining the type of amino acid that is present. In some embodiments, determining the type of amino acid comprises determining the actual amino acid identity, for example by determining which of the naturally-occurring 20 amino acids is the terminal amino acid is (e.g., using a recognition molecule that is specific for an individual terminal amino acid). However, in some embodiments assessing the identity of a terminal amino acid type can comprise determining a subset of potential amino acids that can be present at the terminus of the polypeptide. In some embodiments, this can be accomplished by determining that an amino acid is not one or more specific amino acids (and therefore could be any of the other amino acids). In some embodiments, this can be accomplished by determining which of a specified subset of amino acids (e.g., based on size, charge, hydrophobicity, binding properties) could be at the terminus of the polypeptide (e.g., using a recognition molecule that binds to a specified subset of two or more terminal amino acids).

As used herein, sequencing a polypeptide refers to determining sequence information for a polypeptide. In some embodiments, this can involve determining the identity of each sequential amino acid for a portion (or all) of the polypeptide. However, in some embodiments, this can involve assessing the identity of a subset of amino acids within the polypeptide (e.g., and determining the relative position of one or more amino acid types without determining the identity of each amino acid in the polypeptide). However, in some embodiments amino acid content information can be obtained from a polypeptide without directly determining the relative position of different types of amino acids in the polypeptide. The amino acid content alone may be used to infer the identity of the polypeptide that is present (e.g., by comparing the amino acid content to a database of polypeptide information and determining which polypeptide(s) have the same amino acid content).

Sequencing in accordance with some embodiments can involve immobilizing a polypeptide on a surface of a substrate or solid support, such as a chip or integrated device. In some embodiments, a polypeptide can be immobilized on a surface of a sample well (e.g., on a bottom surface of a sample well) on a substrate. In some embodiments, a first terminus of a polypeptide is immobilized to a surface, and the other terminus is subjected to a sequencing reaction as described herein. For example, in some embodiments, a polypeptide is immobilized to a surface through a C-terminal end, and terminal amino acid recognition and degradation proceeds from an N-terminal end of the polypeptide toward the C-terminal end. In some embodiments, the N-terminal amino acid of the polypeptide is immobilized (e.g., attached to the surface). In some embodiments, the C-terminal amino acid of the polypeptide is immobilized (e.g., attached to the surface). In some embodiments, one or more non-terminal amino acids are immobilized (e.g., attached to the surface).

Some aspects of the present disclosure provide a method of sequencing a polypeptide by detecting luminescence of a labeled polypeptide which is subjected to repeated cycles of terminal amino acid modification and cleavage. For example, FIG. 8-2 shows a method of sequencing a labeled polypeptide by Edman degradation in accordance with some embodiments. In some embodiments, the method generally proceeds as described herein for other methods of sequencing by Edman degradation. For example, in some embodiments, steps (1) and (2) shown in FIG. 8-2 may be performed as described elsewhere herein for terminal amino acid modification and terminal amino acid cleavage, respectively, in an Edman degradation reaction.

As shown in the example depicted in FIG. 8-2, in some embodiments, the method comprises a step of (1) modifying the terminal amino acid of a labeled polypeptide. As described elsewhere herein, in some embodiments, modifying comprises contacting the terminal amino acid with an isothiocyanate (e.g., PITC) to form an isothiocyanate-modified terminal amino acid. In some embodiments, an isothiocyanate modification 8-210 converts the terminal amino acid to a form that is more susceptible to removal by a cleaving reagent (e.g., a chemical or enzymatic cleaving reagent, as described herein). Accordingly, in some embodiments, the method comprises a step of (2) removing the modified terminal amino acid using chemical or enzymatic means detailed elsewhere herein for Edman degradation.

In some embodiments, the method comprises repeating steps (1) through (2) for a plurality of cycles, during which luminescence of the labeled polypeptide is detected, and cleavage events corresponding to the removal of a labeled amino acid from the terminus may be detected as a decrease in detected signal. In some embodiments, no change in signal following step (2) as shown in FIG. 8-2 identifies an amino acid of unknown type. Accordingly, in some embodiments, partial sequence information may be determined by evaluating a signal detected following step (2) during each sequential round by assigning an amino acid type by a determined identity based on a change in detected signal or identifying an amino acid type as unknown based on no change in a detected signal.

Some aspects of the present disclosure provide methods of polypeptide sequencing in real-time by evaluating binding interactions of terminal amino acids with labeled amino acid recognition molecules and a labeled cleaving reagent (e.g., a labeled exopeptidase). FIG. 8-3 shows an example of a method of sequencing in which discrete binding events give rise to signal pulses of a signal output 8-300. The inset panel of FIG. 8-3 illustrates a general scheme of real-time sequencing by this approach. As shown, a labeled amino acid recognition molecule 8-310 selectively binds to and dissociates from a terminal amino acid (shown here as lysine), which gives rise to a series of pulses in signal output 8-300 which may be used to identify the terminal amino acid. In some embodiments, the series of pulses provide a pulsing pattern which may be diagnostic of the identity of the corresponding terminal amino acid.

Without wishing to be bound by theory, labeled amino acid recognition molecule 8-310 selectively binds according to a binding affinity (KD) defined by an association rate of binding ($k_{on}$) and a dissociation rate of binding ($k_{off}$). The rate constants $k_{off}$ and $k_{on}$ are the critical determinants of pulse duration (e.g., the time corresponding to a detectable binding event) and interpulse duration (e.g., the time between detectable binding events), respectively. In some embodiments, these rates can be engineered to achieve pulse durations and pulse rates that give the best sequencing accuracy.

As shown in the inset panel, a sequencing reaction mixture further comprises a labeled cleaving reagent 8-320 comprising a detectable label that is different than that of labeled amino acid recognition molecule 8-310. In some embodiments, labeled cleaving reagent 8-320 is present in the mixture at a concentration that is less than that of labeled amino acid recognition molecule 8-310. In some embodiments, labeled cleaving reagent 8-320 displays broad specificity such that it cleaves most or all types of terminal amino acids.

As illustrated by the progress of signal output 8-300, in some embodiments, terminal amino acid cleavage by labeled cleaving reagent 8-320 gives rise to a uniquely identifiable signal pulse, and these events occur with lower frequency than the binding pulses of a labeled amino acid recognition molecule 8-310. In this way, amino acids of a polypeptide can be counted and/or identified in a real-time sequencing process. As further illustrated in signal output 8-300, in some embodiments, a labeled amino acid recognition molecule 8-310 is engineered to bind more than one type of amino acid with different binding properties corresponding to each type, which produces uniquely identifiable pulsing patterns. In some embodiments, a plurality of labeled amino acid recognition molecules may be used, each with a diagnostic pulsing pattern which may be used to identify a corresponding terminal amino acid.

VII. Conclusion

Having thus described several aspects and embodiments of the technology of the present disclosure, it is to be appreciated that various alterations, modifications, and improvements will readily occur to those of ordinary skill in the art. Such alterations, modifications, and improvements are intended to be within the spirit and scope of the technology described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or meth- ods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

In the drawings, as well as in the specification above, directional references (e.g., "top" or "bottom") should not be construed as limiting illustrated embodiments to a particular illumination configuration, as such directional references are intended merely as an aid to the reader viewing the drawings and/or understanding how one view of one embodiment relates to and/or differs from another view of the same or a similar embodiment. For instance, "top" should not necessarily be construed as meaning "front" (e.g., as in front side illumination) and "bottom" should not necessarily be construed as meaning "back" or "rear" (e.g., as in backside illumination).

What is claimed is:

1. An integrated circuit, comprising:
   a first pixel;
   a second pixel, wherein the first pixel is proximate to the second pixel along a row direction;
   a conductive line extending along a column direction that intersects with the row direction, wherein the conductive line is in electrical communication with a first component of the first pixel and a second component of the second pixel;
   a plurality of pixels that includes the first and second pixels, wherein the plurality of pixels are positioned in first and second rows along the column direction;
   a plurality of first conductive lines that includes the conductive line, each first conductive line extending in the column direction and in electrical communication with components of a respective first pair of adjacent pixels of the plurality of pixels, wherein the respective first pairs of adjacent pixels are positioned in the first row and each first conductive line is further in electrical communication with components of a respective third pair of adjacent pixels of the plurality of pixels positioned in the second row;
   a plurality of second conductive lines electrically separate from the plurality of first conductive lines, each second conductive line extending in the column direction and in electrical communication with components of a respective second pair of adjacent pixels of the plurality of pixels, wherein the respective second pairs of adjacent pixels are positioned in the first row and each second conductive line is further in electrical communication with components of a respective fourth pair of adjacent pixels of the plurality of pixels positioned in the second row;
   a plurality of third conductive lines positioned above or below and in electrical communication with the plurality of first conductive lines, wherein the plurality of first conductive lines are positioned between the plurality of third conductive lines and the plurality of pixels; and
   a plurality of fourth conductive lines positioned above or below and in electrical communication with the plurality of second conductive lines, wherein the plurality of second conductive lines are positioned between the plurality of fourth conductive lines and the plurality of pixels, and wherein the plurality of third conductive lines is spaced from the plurality of fourth conductive lines in the column direction such that the plurality of third conductive lines overlie or underlie at least one pixel in the first row and the plurality of fourth conductive lines overlie or underlie at least one pixel in the second row.

2. The integrated circuit of claim 1, wherein ones of the plurality of first conductive lines are positioned, in the row direction, between adjacent ones of the plurality of second conductive lines.

3. The integrated circuit of claim 1, wherein:
   the plurality of third conductive lines and the plurality of fourth conductive lines extend in the column direction; and
   ones of the plurality of third conductive lines are spaced from ones of the plurality of fourth conductive lines in the row direction.

4. The integrated circuit of claim 3, wherein ones of the plurality of third conductive lines are spaced from adjacent ones of the plurality of fourth conductive lines, in the row direction, by at least one pixel width.

5. The integrated circuit of claim 4, wherein ones of the plurality of third conductive lines are spaced from adjacent ones of the plurality of fourth conductive lines, in the row direction, by at least three pixel widths.

6. The integrated circuit of claim 1, wherein:
   the plurality of third conductive lines extend substantially parallel to one another in the row direction to overlie or underlie the first row; and
   the plurality of fourth conductive lines extend substantially parallel to one another and to the plurality of third conductive lines in the row direction to overlie or underlie the second row.

7. The integrated circuit of claim 1, further comprising an array of bond pads, the array of bond pads comprising:
- a plurality of first signal bond pads in electrical communication with the plurality of third conductive lines;
- a plurality of first auxiliary bond pads, each first auxiliary bond pad positioned, in the row direction, between adjacent first signal bond pads;
- a plurality of second signal bond pads spaced, in the column direction, from the plurality of first signal bond pads and in electrical communication with the plurality of fourth conductive lines; and
- a plurality of second auxiliary bond pads, each second auxiliary bond pad positioned, in the row direction, between adjacent second signal bond pads.

8. The integrated circuit of claim 1, further comprising:
- a plurality of fifth conductive lines positioned above or below and in electrical communication with the plurality of third conductive lines, wherein the plurality of third conductive lines are positioned between the plurality of fifth conductive lines and the plurality of pixels; and
- a plurality of sixth conductive lines positioned above or below and in electrical communication with the plurality of fourth conductive lines, wherein the plurality of fourth conductive lines are positioned between the plurality of sixth conductive lines and the plurality of pixels, wherein:
- the plurality of third conductive lines and the plurality of fourth conductive lines extend in the column direction;
- the plurality of third conductive lines are spaced from the plurality of fourth conductive lines in the row and column directions such that the plurality of third conductive lines overlie or underlie a portion of the first row and the plurality of fourth conductive lines overlie or underlie a second portion of the second row that is offset, in the row direction, from the first portion;
- the plurality of fifth conductive lines extend substantially parallel to one another in the row direction to overlie or underlie the first row; and
- the plurality of sixth conductive lines extend substantially parallel to one another and to the plurality of fifth conductive lines and are spaced from the plurality of fifth conductive lines in the column direction to overlie or underlie the second row.

9. The integrated circuit of claim 8, further comprising:
- a first wafer, comprising:
  - the plurality of pixels;
  - the pluralities of first, second, third, and fourth conductive lines;
  - a plurality of first signal bond pads in electrical communication with the plurality of third conductive lines;
  - a plurality of first auxiliary bond pads, each first auxiliary bond pad positioned, in the row direction, between adjacent first signal bond pads;
  - a plurality of second signal bond pads spaced, in the column direction, from the plurality of first signal bond pads and in electrical communication with the plurality of fourth conductive lines; and
  - a plurality of second auxiliary bond pads, each second auxiliary bond pad positioned, in the row direction, between adjacent second signal bond pads; and
- a second wafer bonded to the first wafer and comprising:
  - the pluralities of fifth and sixth conductive lines;
  - a plurality of third signal bond pads in electrical communication with the plurality of fifth conductive lines and bonded to respective ones of the plurality of first signal bond pads;
  - a plurality of third auxiliary bond pads, each third auxiliary bond pad positioned, in the row direction, between adjacent third signal bond pads and bonded to a respective one of the plurality of first auxiliary bond pads;
  - a plurality of fourth signal bond pads spaced, in the column direction, from the plurality of third signal bond pads, in electrical communication with the plurality of sixth conductive lines, and bonded to respective ones of the plurality of second signal bond pads; and
  - a plurality of fourth auxiliary bond pads, each fourth auxiliary bond pad positioned, in the row direction, between adjacent fourth signal bond pads and bonded to a respective one of the plurality of second auxiliary bond pads.

10. A method, comprising:
- applying an electrical signal to a conductive line of an integrated circuit, the conductive line extending along a column direction that intersects with a row direction;
- applying, via the conductive line, at least a portion of the electrical signal to:
  - a first component of a first pixel of a plurality of pixels of the integrated circuit; and
  - a second component of a second pixel of the plurality of pixels of the integrated circuit, wherein the first pixel is proximate to the second pixel along the row direction;
- electrically communicating at least the portion of the electrical signal, via a plurality of first conductive lines that includes the conductive line, each first conductive line extending in the column direction, to components of respective first pairs of adjacent pixels of the integrated circuit, wherein the electrical signal is a first electrical signal;
- electrically communication at least a portion of a second electrical signal, via a plurality of second conductive lines that are electrically separate from the plurality of first conductive lines, each second conductive line extending in the column direction, to components of respective second pairs of adjacent pixels of the integrated circuit;
- electrically communicating at least the portion of the first electrical signal, via the plurality of first conductive lines, to components of respective third pairs of adjacent pixels of the integrated circuit;
- electrically communicating at least the portion of the second electrical signal, via the plurality of second conductive lines, to components of respective fourth pairs of adjacent pixels of the integrated circuit, wherein the respective first pairs of adjacent pixels and the respective second pairs of adjacent pixels are positioned in a first row of pixels of the integrated circuit and the respective third pairs of adjacent pixels and the respective fourth pairs of adjacent pixels are positioned in a second row of pixels of the integrated circuit;
- electrically communicating at least the portion of the first electrical signal with the plurality of first conductive lines via a plurality of third conductive lines positioned above or below the plurality of first conductive lines, wherein the plurality of first conductive lines are positioned between the plurality of third conductive lines and the plurality of pixels; and electrically communicating at least the portion of the second electrical signal with the plurality of second conductive lines via a plurality of fourth conductive lines positioned above or below the plurality of second conductive lines, wherein the plurality of second conductive lines are positioned between the plurality of fourth conductive lines and the plurality of pixels, wherein the plurality of third conductive lines are spaced from the plurality of fourth conductive lines in the column direction such that the plurality of third conductive lines overlie or underlie at least one pixel in the first row and the plurality of fourth conductive lines overlie or underlie at least one pixel in the second row.

11. The method of claim 10, wherein ones of the plurality of first conductive lines are positioned, in the row direction, between adjacent ones of the plurality of second conductive lines.

12. The method of claim 10, wherein:
the plurality of third conductive lines and the plurality of fourth conductive lines extend in the column direction; and
ones of the plurality of third conductive lines are spaced from ones of the plurality of fourth conductive lines in the row direction.

13. The method of claim 12, wherein ones of the plurality of third conductive lines are spaced from adjacent ones of the plurality of fourth conductive lines, in the row direction, by at least one pixel width.

14. The method of claim 13, wherein ones of the plurality of third conductive lines are spaced from adjacent ones of the plurality of fourth conductive lines, in the row direction, by at least three pixel widths.

15. The method of claim 10, wherein:
the plurality of third conductive lines extend substantially parallel to one another in the row direction to overlie or underlie the first row; and
the plurality of fourth conductive lines extend substantially parallel to one another and to the plurality of third conductive lines in the row direction to overlie or underlie the second row.

16. The method of claim 10, further comprising:
electrically communicating at least the portion of the first signal from a plurality of first signal bond pads of an array of bond pads to the plurality of third conductive lines; and
electrically communicating at least the portion of the second signal from a plurality of second signal bond pads of the array of bond pads to the plurality of fourth conductive lines,
wherein the array of bond pads further comprises:
a plurality of first auxiliary bond pads, each first auxiliary bond pad positioned, in the row direction, between adjacent first signal bond pads; and
a plurality of second auxiliary bond pads, each second auxiliary bond pad positioned, in the row direction, between adjacent second signal bond pads.

17. The method of claim 10, further comprising:
electrically communicating at least the portion of the first electrical signal with the plurality of third conductive lines via a plurality of fifth conductive lines positioned above or below the plurality of third conductive lines, wherein the plurality of third conductive lines are positioned between the plurality of fifth conductive lines and the plurality of pixels; and
electrically communicating at least the portion of the second electrical signal with the plurality of fourth conductive lines via a plurality of sixth conductive lines positioned above or below the plurality of fourth conductive lines, wherein the plurality of fourth conductive lines are positioned between the plurality of sixth conductive lines and the plurality of pixels,
wherein:
the plurality of third conductive lines and the plurality of fourth conductive lines extend in the column direction;
the plurality of third conductive lines are spaced from the plurality of fourth conductive lines in the row and column directions such that the plurality of third conductive lines overlie or underlie a portion of the first row and the plurality of fourth conductive lines overlie or underlie a second portion of the second row that is offset, in the row direction, from the first portion;
the plurality of fifth conductive lines extend substantially parallel to one another in the row direction to overlie or underlie the first row; and
the plurality of sixth conductive lines extend substantially parallel to one another and to the plurality of fifth conductive lines and are spaced from the plurality of fifth conductive lines in the column direction to overlie or underlie the second row.

* * * * *